United States Patent [19]

Taguchi et al.

[11] Patent Number: 5,361,226
[45] Date of Patent: Nov. 1, 1994

[54] MAGNETIC THIN FILM MEMORY DEVICE

[75] Inventors: Motohisa Taguchi; Tatsuya Fukami; Kazuhiko Tsutsumi; Hiroshi Shibata; Shinji Tanabe; Hiroshi Kobayashi; Yuzo Ohdoi, all of Amagasaki, Japan

[73] Assignee: Mitsubishi Denki Kabushiki Kaisha, Tokyo, Japan

[21] Appl. No.: 847,964

[22] Filed: Mar. 5, 1992

[30] Foreign Application Priority Data

| Mar. 6, 1991 | [JP] | Japan | 3-039891 |
| May 22, 1991 | [JP] | Japan | 3-116415 |
| May 24, 1991 | [JP] | Japan | 3-119780 |
| Jul. 23, 1991 | [JP] | Japan | 3-181393 |
| Dec. 9, 1991 | [JP] | Japan | 3-324277 |

[51] Int. Cl.$^5$ .................................. H01L 21/78
[52] U.S. Cl. .................................. 365/171; 365/170; 365/9
[58] Field of Search .................. 365/170, 171, 2, 9, 365/173, 87, 5, 7, 8, 10

[56] References Cited

U.S. PATENT DOCUMENTS

| 3,233,228 | 2/1966 | Kaspar | 365/170 |
| 3,521,255 | 7/1970 | Arndt | 365/170 |
| 3,531,780 | 9/1970 | Huijer et al. | |
| 3,701,126 | 10/1972 | Reichard | 365/9 |
| 3,922,651 | 11/1975 | Imamura et al. | |
| 4,042,341 | 8/1977 | Smeggil | 365/171 |
| 4,114,191 | 9/1978 | Lund | 365/2 |
| 4,198,689 | 4/1980 | Gyorgy et al. | 365/8 |
| 4,280,194 | 7/1981 | Voegeli | 365/7 |
| 4,455,626 | 6/1984 | Lutes | 365/158 |
| 4,550,389 | 10/1985 | Cox et al. | 365/37 |
| 4,791,604 | 12/1988 | Lienau et al. | 365/2 |
| 4,897,288 | 1/1990 | Jenson | 365/173 X |
| 5,025,416 | 6/1991 | Prinz | 365/171 |
| 5,075,247 | 12/1991 | Matthews | 365/171 |

FOREIGN PATENT DOCUMENTS

| 720985 | 11/1965 | Canada | 365/171 |
| 1270541 | 4/1972 | United Kingdom . | |
| 2039431 | 8/1980 | United Kingdom . | |

OTHER PUBLICATIONS

Ranmuthu et al., "Reprogrammable Logic Array Using M-R Elements", IEEE Transactions on Magnetics, vol. 26, No. 5, Sep. 1990.
Coughlin et al., "Non-Destructive Readout for Thin Film Memory", IBM Technical Disclosure Bulletin, vol. 3, Mar. 1961.
Patent Abstract of Japan, vol. 14, No. 577.
"Magnetic Engineering, Lecture 5, Magnetic Thin Film Engineering", p. 254, published by Maruzen Co., Ltd., 1977.
"Reprogrammable Logic Array Using M-R Element", IEEE Transactions on Magnetics, vol. 26, No. 5, (1990).
M. Matsumoto, "Magnetic Hed and Magnetic Recording", pp. 182-190.

Primary Examiner—Eugene R. LaRoche
Assistant Examiner—Vu Le
Attorney, Agent, or Firm—Lowe, Price, LeBlanc & Becker

[57] ABSTRACT

A magnetic thin film memory device having information recorded in a magnetic thin film thereof by the direction of magnetization, and adapted to reproduce the recorded information on the basis of the voltage generated as a result of the change of the magnetization direction due to the extraordinary Hall effect, magneto-resistance effect or the like.

A magnetic thin film memory device in which a magnetic thin film is formed of ferrimagnetic substance having perpendicular magnetic anisotropy, and producing extraordinary Hall effect in the composition of RE rich and having the minimum saturation field which enables recording in a small magnetic field and is hard to be influenced by temperatures.

35 Claims, 65 Drawing Sheets

UPWARD MAGNETIZATION

DOWNWARD MAGNETIZATION

INITIAL MAGNETIZATION DIRECTION
OF ELEMENT 1ac
    SOLID LINE:UPWARD("0")
    DOTTED LINE:DOWNWARD("1")

"0"

"1"

"0"

"1"

MAGNETIC THIN FILM MEMORY DEVICE

BACKGROUND OF THE INVENTION

1. Field of the Invention

This invention relates to a magnetic thin film memory device designed to record or reproduce information in accordance with the direction of magnetization.

2. Description of Related Art

FIG. 1 is a diagram of a conventional magnetic thin film memory device disclosed in "Magnetic Thin Film Engineering" (p. 254, Magnetic Engineering Lecture 5; Maruzen Co., Ltd., 1977).

An example how to manufacture the memory element will be discussed in the first place. A mask with rectangular holes is brought in tight contact with a smooth glass substrate G, onto which a vacuum deposited film of Fe, Ni about 2000 Å thick is formed within a vacuum apparatus. As a consequence, many magnetic thin film memory elements MF are manufactured in matrix at one time. A driving line to drive the magnetic thin film memory elements is obtained by photoetching copper strips on both surfaces of a thin epoxy resin plate or a thin polyester sheet in a manner that the strips on the one surface to be orthogonal to those on the other surface. The lines on the both surfaces are rendered word lines and digit lines, respectively, and the memory device is assembled in a manner that each crossing point of the lines is arranged to overlapped onto each memory element.

The principle of the operating of the memory element will be depicted. The lines parallel to the axis of easy magnetization in the drawing are word lines W1 through W3, while those orthogonal to the axis of easy magnetization are digit lines D1 through D3. The digit line serves also as a sense line to read the storing state of information in the memory element. The magnetization in the film is stabilized along the axis of easy magnetization corresponding to the storing state of information "0" or "1" in the memory element. Specifically, a white upward arrow in the drawing shows that information "0" is stored and a white downward arrow shows that information "1" is stored in the memory element. Supposing that magnetic fields acting to the magnetic thin film by a digit current Id and a word current Iw are respectively Hd and Hw, when the current Iw of a unipolar pulse is allowed to run by selecting the word line W1, the magnetic field Hw acts to the whole of the memory elements MF below the word line W1, and the magnetization is directed to the axis of hard magnetization. At this time, pulse voltages of the opposite polarities are induced to the digit lines D1 through D3 which become reading voltages depending on whether the magnetization is turned from the "1" state or "0" state. In recording, the digit current Id is fed as to overlap the trailing edge of the Iw pulse, and in the condition of the magnetization being directed in the axis of hard magnetization, the magnetic field Hd of the polarity corresponding to an information signal is super-imposed, thereby determining the direction of magnetization in order to record information in the "1" state or "0" state. The value of Iw is set to generate the magnetic field Hw sufficient to turn the magnetization of the magnetic thin film from the axis of easy magnetization to the axis of hard magnetization. The value of Id is set to generate the magnetic field Hd about half the coercive force Hc of the magnetic thin film.

Among the memory elements MF along the word line W1, the upper one reads "1" and writes "0", the middle one reads "0" and writes "0" and writes "1", and the lower one reads "0" and rewrites "0" after reading. As is clear from the foregoing description, since the magnetization immediately after reading is directed to the axis of hard magnetization, and it is infinite to which direction, "1" or "0", the magnetization is turned, the turning direction is determined by applying the magnetic field Hd.

In conventional reading method, since a minute electromagnetic induced voltage resulting from the rotation of the magnetization is used. Therefore, the S/N ratio at reading is so small that read-out was difficult. Moreover, since the electromagnetic induced voltage is proportional to the size of the magnetic moment, it is required to make the magnetic thin film larger to obtain a large electromagnetic induced voltage. In consequence, the magnetic field necessary for recording/reproducing is undesirably enlarged, thereby causing a hindrance to saving of power. The amount of information stored per unit area is impossible to be increased.

Meanwhile, a magnetic thin film memory device which reads information with use of the magnetoresistance effect is already known. FIG. 2 shows the principle of a magneto-resistive element disclosed in "Magnetic head and magnetic recording" (pp. 182–190, M. Matsumoto; Sogo Denshi Shuppan). In FIG. 2, a reference numeral 101 indicates a magneto-resistive element formed of a magnetized film with the axis of easy magnetization denoted by A. The magnetoresistance effect is a phenomenon that when a current I runs in the magnetoresistive element 101 to impress an external magnetic field H, thereby to change the direction of magnetization, resistance of the magnetoresistive element is changed by an angle of the direction of the current I to the direction of magnetization M corresponding to the external magnetic field H.

FIGS. 3 and 4 are a perspective view of a conventional magnetic thin film memory element and a circuit diagram of a magnetic thin film memory device using the conventional element revealed in "Reprogrammable Logic Array Using M-R Elements" (pp. 2828–2830, IEEE Transactions on Magnetics, Vol. 26, No. 5; Sep., 1990). In FIGS. 3 and 4, reference numerals represent respectively: 101a, 101b a magnetic thin film of permalloy or the like having the magnetoresistance effect: 102 a metallic thin film of copper, etc. sandwiched between the magnetic thin films 101a and 101b; 103 a word line for applying an external magnetic field to the magnetic thin films 101a, 101b; 111 a magnetic thin film memory element; 112 a sense line constituted of the magnetic thin films 101a, 101b and metallic thin film 102; 113 a dummy line corresponding to the sense line 112; 114 a switching element for determining the direction of a voltage to be fed to the sense line 112; 115 an autozero circuit for detecting a zero signal automatically; 116 a differential amplifier; 117 a switching element for determining the sense line 112 to be accessed; and 125 a comparative resistance on the dummy line 113. The word line 103 is formed orthogonal to a current running in the magnetic thin films 101a, 101b, and parallel to the axis of easy magnetization A of the magnetic thin films 101a, 101b.

The above magnetic thin film memory device operates in a manner as follows. First of all, the magnetoresistance effect will be explained below. As shown in FIG. 5, an external magnetic field Hex is applied in the direction of the axis of hard magnetization 151 so as to direct the magnetization 152 of the magnetic thin film 101 at an angle $\theta$ to the direction of the axis of easy magnetization 150. At this time, by impressing a voltage E to both ends of the magnetic thin film 101 and measuring a sensor current (i) by an ammeter 162, the relation between the direction of magnetization and current (i) becomes as indicated in a graph of FIG. 6. In other words, when the direction of magnetization 152 is parallel to the running direction of the current (here, direction along the axis of hard magnetization 151) ($\theta = \pm 90°$), resistance of the magnetic thin film 101 becomes maximum. On the other hand, when the direction of magnetization 152 is perpendicular to the direction of current ($\theta = 0°$), resistance becomes minimum (the current flows most).

The operation of the magnetic thin film memory element illustrated in FIG. 3 will be described now. In recording, when a word current is allowed to run in the direction shown by an arrow, the direction of the magnetic field generated by the current is the direction of the axis of that magnetization 151 of the magnetic thin film 101, thereby to turn the direction of magnetization 152 (referring to FIG. 5) to be the direction of the axis of hard magnetization 151, if a sufficient amount of current is allowed to flow. Subsequently, a current is supplied to the sense line 112 to determine the direction of magnetization. Although the magnetic field generated by this current is reverse in direction between the magnetic thin films 101a and 101b, both are along the axis of easy magnetization 150. Therefore, the direction of magnetization can be determined by shutting off the current of the word line 103. As indicated in FIG. 7, the directions 152a, 152b of magnetization of the magnetic thin films 101a, 101b are determined by the direction of a current 163 running in the sense line 112.

Next, in reproducing, it will be discussed in conjunction with only the magnetic thin film 101a for brevity's sake with reference to FIG. 8 which is a bottom view when a smaller current than in recording is allowed to flow in the word line 103. The direction of magnetization 152a is inclined $\theta$, to the direction of the axis of easy magnetization 150 because of the magnetic field Hex generated by the current running in the word line 103. This fact holds true both in FIGS. 8A and 8B except that the angle $\theta$, is plus or minus. Then, when the current 163 is fed to the sense line 112 a magnetic field Hsf is generated by the sense line 112 as shown in FIG. 9. The direction of magnetization 152a is determined by the external magnetic field 60. An angle $\theta_2$ of the direction of magnetization 152a to the direction of the axis of easy magnetization 150 is varied in accordance with the recorded state of magnetization, and the recorded state of magnetization can be detected as an increase or decrease of the electric resistance as shown in FIG. 6.

The operation of the memory device will be discussed with reference to FIG. 4. In recording, only the memory element 111 having both the word line 103 and the sense line 112 simultaneously turned on is driven. Although the recording state is determined by the direction of the current running in the sense line 112 as described before, the direction of the current is decided by the switching element.

In reproducing, firstly, by turning on the switching element 117 of the sense line 112 to be accessed without supplying a current to the word line 103, the potential at a connecting point x is compared with that at a connecting point Z of the dummy line 113 by the auto zero circuit 115 and the potential difference is stored therein. Thereafter, by supplying a current to the word line 103, the recording state of the element is detected according to whether the potential difference becomes larger or smaller than the stored difference.

As described before, since the memory elements 111 in the conventional magnetic thin film memory device are connected in series to the sense line 112, resistances of the memory elements 111 work in series, making the impedance of the sense line 112 larger in proportion to the number of the connecting memory elements 111. As a result, only a limited number (4 in the prior art) of memory elements can be arranged on a single sense line so as to secure the sufficient S/N ratio. Fundamentally, the signal is detected by the static resistance of the sense line 112, thus requiring the comparative resistance 125. The temperature compensation of the resistance of each memory element 111 becomes necessary, therefore the comparative resistance 125 must be formed of a magnetic thin film. As such, the prior art is disadvantageous in its complicated structure with little allowance of design.

Moreover, ferromagnetic alloy made of Ni, Fe, Co or the like used conventionally as a magnetoresistive element for read-out is magnetized thin film having horizontal magnetic anisotropy. A large external magnetic field is needed against a demagnetizing field in order to change the magnetization M in a perpendicular direction to the film surface. Therefore, the conventional magnetoresistive element is poorly low in detecting sensitivity to the magnetic field perpendicular to the film surface.

SUMMARY OF THE INVENTION

This invention has been devised to solve the aforementioned disadvantages, and has for its essential object to provide a magnetic thin film memory device realizing good S/N ratio thereby to record/reproduce information stably even from a small size memory element, and besides lowering the power consumption, enhancing the information transfer rate, and realizing high recording density.

The above and further objects and features of the invention will more fully be apparent from the following detailed description with accompanying drawings.

DESCRIPTION OF THE PREFERRED EMBODIMENTS

Preferred embodiments of this invention will be discussed in detail with reference to the accompanying drawings.

Figure 10:
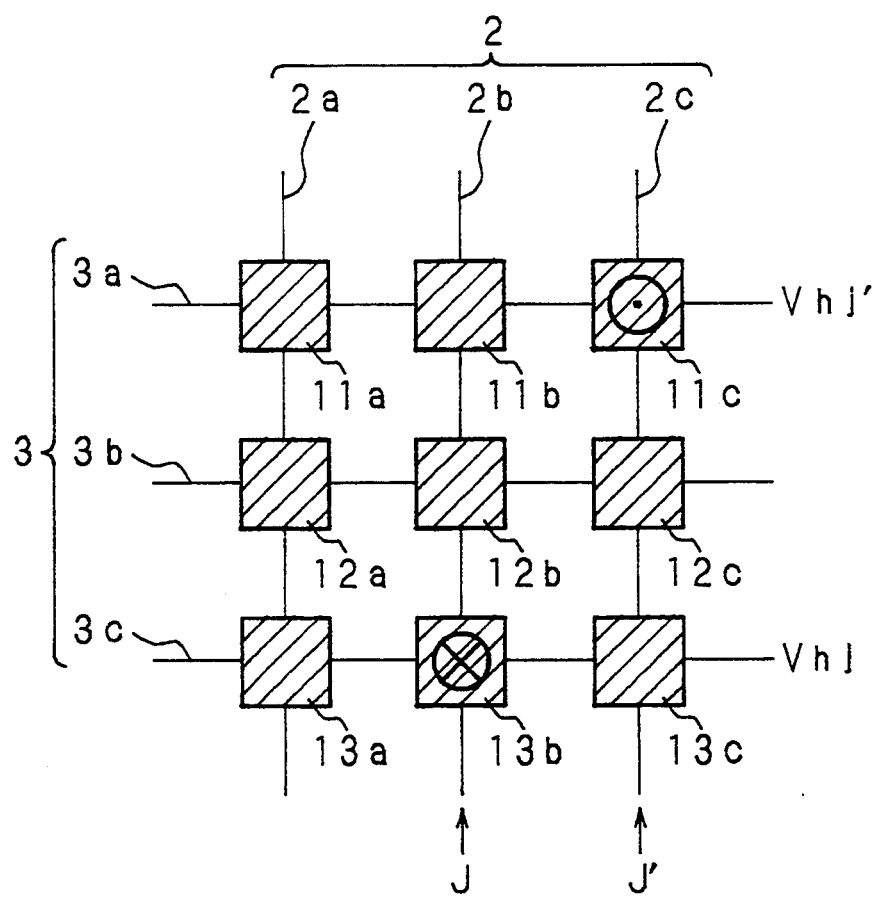
FIG. 10 is a diagram of a magnetic thin film memory device according to a first and a second embodiments of this invention.

Referring to FIG. 10, a magnetic thin film memory element is represented by a reference numeral 1. A current line 2 and a voltage line 3 are mounted to the magnetic thin film memory elements 11a, 11b, 11c, 12a, 12b, 12c, 13a, 13b, 13c and orthogonal to each other approximately at the center on the magnetic thin film memory elements 11a, 11b, 11c, 12a, 12b, 12c, 13a, 13b, 13c. The magnetic thin film memory elements 11a, 11b, 11c, 12a, 12b, 12c, 13a, 13b, 13c have a magnetic thin film with perpendicular magnetic anisotropy. As a concrete example of the magnetic thin film with perpendicular magnetic anisotropy, a rare earth-transition metal alloy, e.g., GdCo, HoCo, GdHoCo, TbHoCo, GdFeCo will be cited.

In order to read information from the magnetic thin film memory element 13b which is magnetized downward, a current J should be fed to a current line 2b to read the voltage change Vhj of a voltage line 3c. Likewise, for reading information from a magnetic thin film memory element 11c magnetized upward, a current J' should be fed to a current line 2c and the voltage change Vhj' of a voltage line 3a should be read. At this time Vhj and Vhj' are reverse in direction.

In the manner as mentioned above, information is read with utilizing the extraordinary Hall effect.

The recording method when a magnetic thin film having perpendicular magnetic anisotropy is used for the magnetic thin film memory element 11 will be discussed below.

Figure 11:
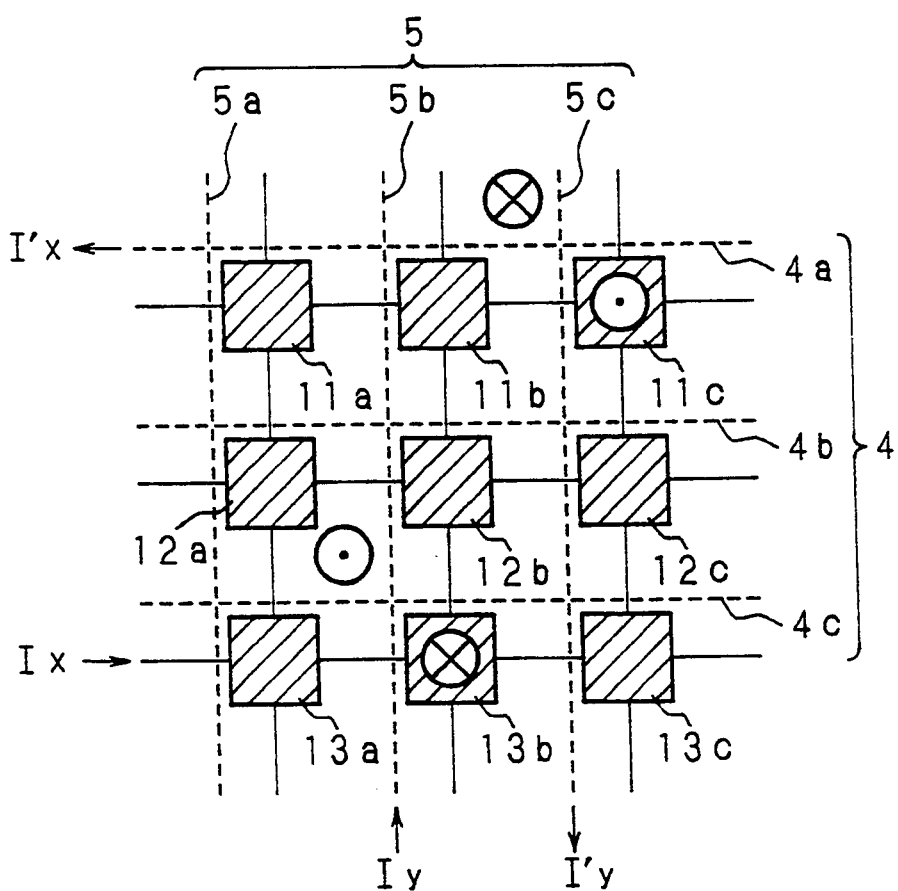
FIG. 11 is a diagram of the magnetic thin film memory device of FIG. 10 with recording lines added.
Figure 12:
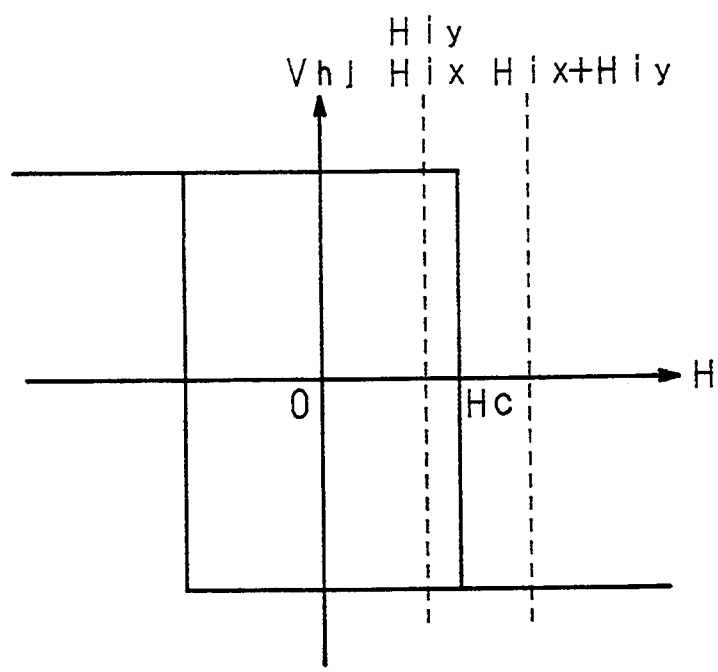
FIG. 12 is a view explanatory of the relation between the recording magnetic force and coercive force in the first and second embodiments.

Referring to FIG. 11, recording lines 4 and 5 are orthogonal to each other, and shifted a little from the magnetic thin film memory element 1 in order to apply a magnetic field onto the magnetic thin film memory element 1 in a perpendicular direction thereto, generated by supplying currents Ix and Iy. For instance, the following description is related to the case of directing the magnetization of the memory element 13b downward. If the current Ix is supplied to a lateral recording line 4c in a direction shown by an arrow →, a magnetic field Hix is generated. On the other hand, when the current Iy is supplied to a vertical recording line 5b in a direction of an arrow ↑ a magnetic field Hiy is generated. The relation between the change of the Hall voltage and the magnetic field of the magnetic thin film memory element 1 is as shown in FIG. 12. Supposing that the coercive force of the magnetic thin film memory element 1 is Hc, the following relation is held:

$$Hiy < Hc$$

$$Hix < Hc$$

$$Hc < Hix + Hiy$$

Figure 13:
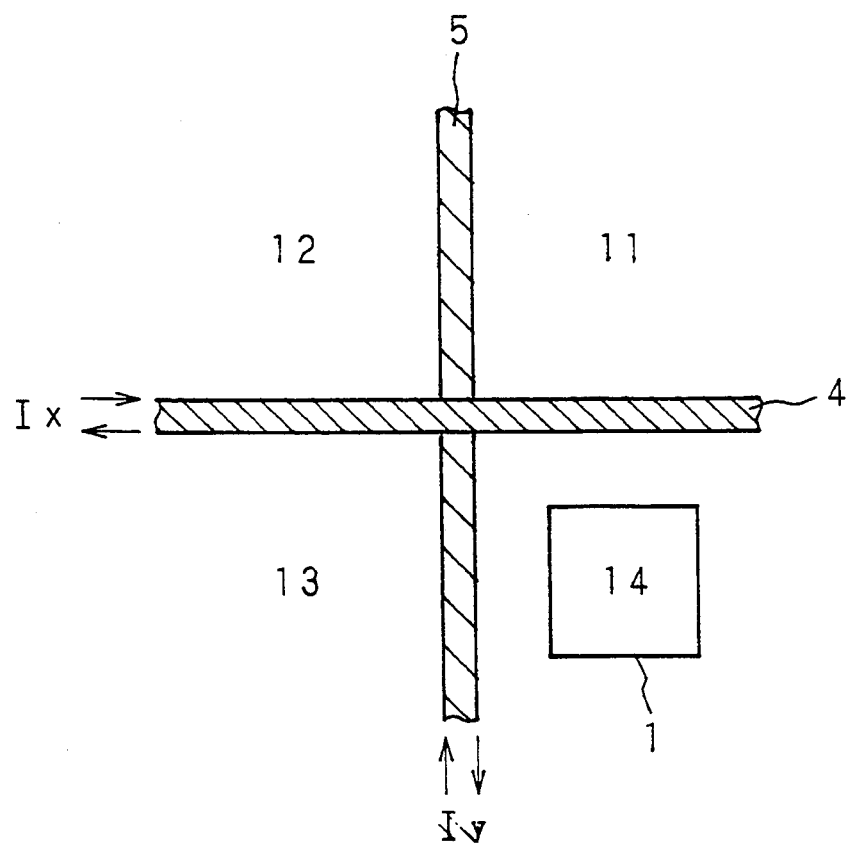
FIG. 13 is a diagram of the principle of recording information in the magnetic thin film memory device of the first and second embodiments.

In other words, the magnetization of the magnetic thin film memory element 1 is not changed by supplying either of the currents Ix or Iy, but is changed only when both the magnetic fields Hix and Hiy are generated by the current Ix and Iy. Areas where both the magnetic fields Hix and Hiy are applied are areas 12 and 14 divided by the recording lines 4, 5 as shown in FIG. 13. When the current Ix is fed in the direction → and the current Iy is fed in the direction ↑, the area 12 is magnetized upward, whereas the area 14 is downward. If the direction of each current Ix, Iy is reversed, the direction of the magnetic field of the area 12 is turned downward, and that of the area 14 is turned upward.

Accordingly, if the magnetic thin film memory element 1 is provided only in the area 14, it is possible to change the magnetization of the magnetic thin film memory element 1 to upward or downward by reversing the direction of the currents Ix and Iy. For data "1", the magnetization of the magnetic thin film memory element 1 is directed downward by supplying the current Ix in the direction → and the current Iy in the direction ↑. For data "0", the magnetization direction of the memory element 1 is directed upward by supplying the current Ix in the direction ← and the current Iy in the direction ↓.

Embodiment 1

Figure 14:
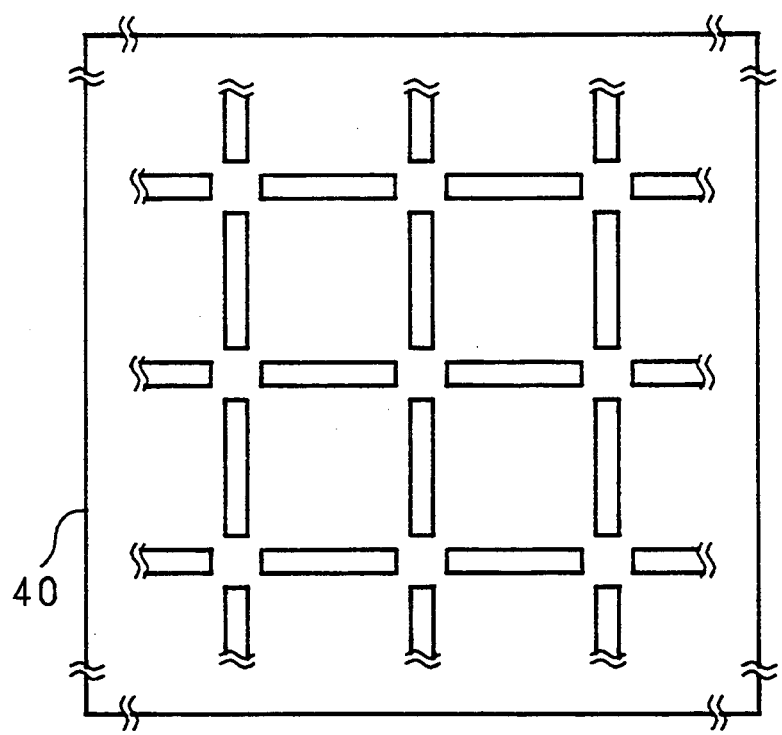
FIGS. 14, 15 and 16 are diagrams of the manufacturing process in the first and second embodiments.
Figure 15:
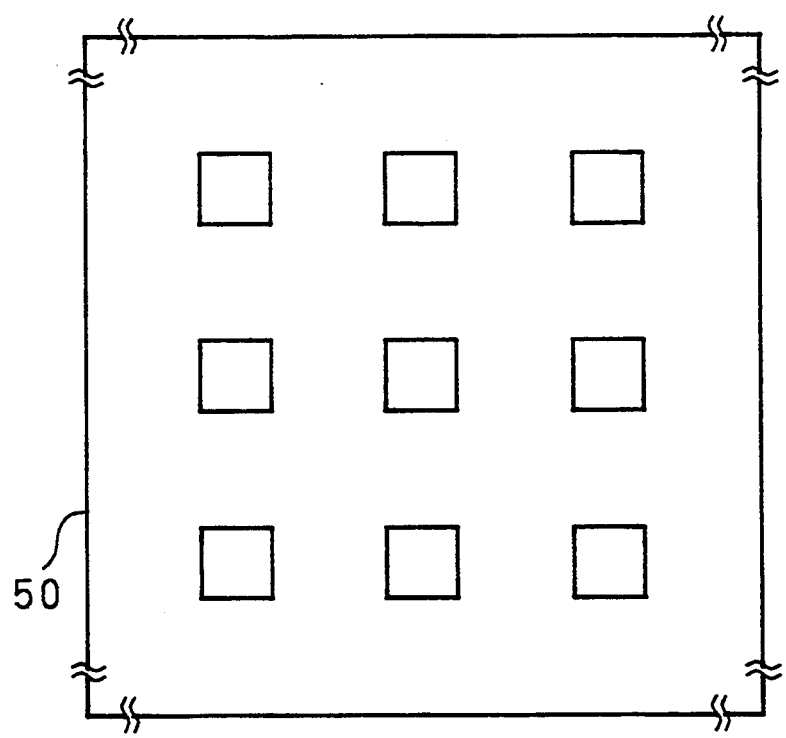
Figure 16:
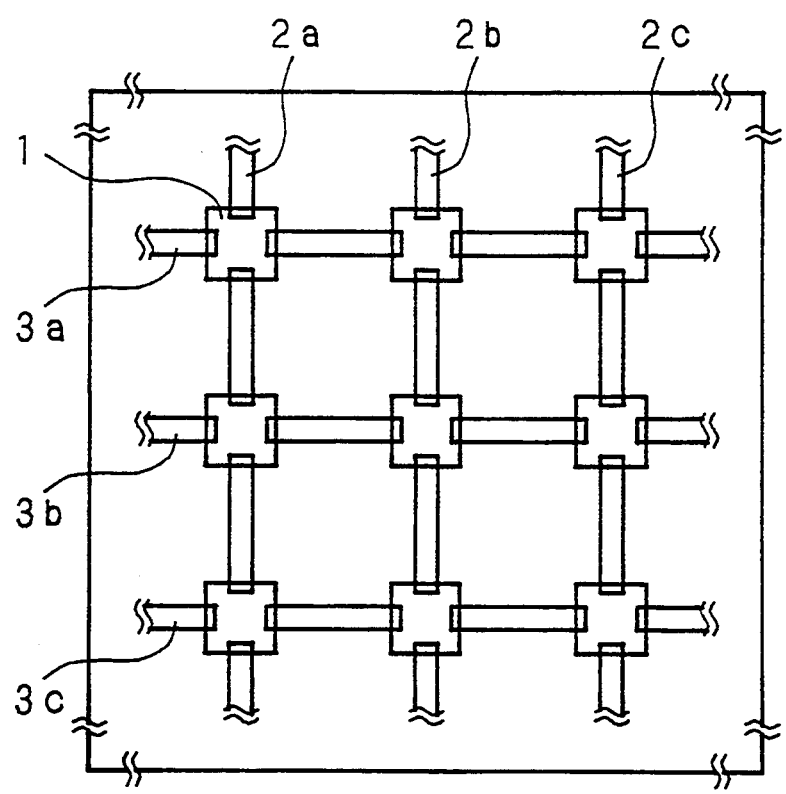
Figure 17:
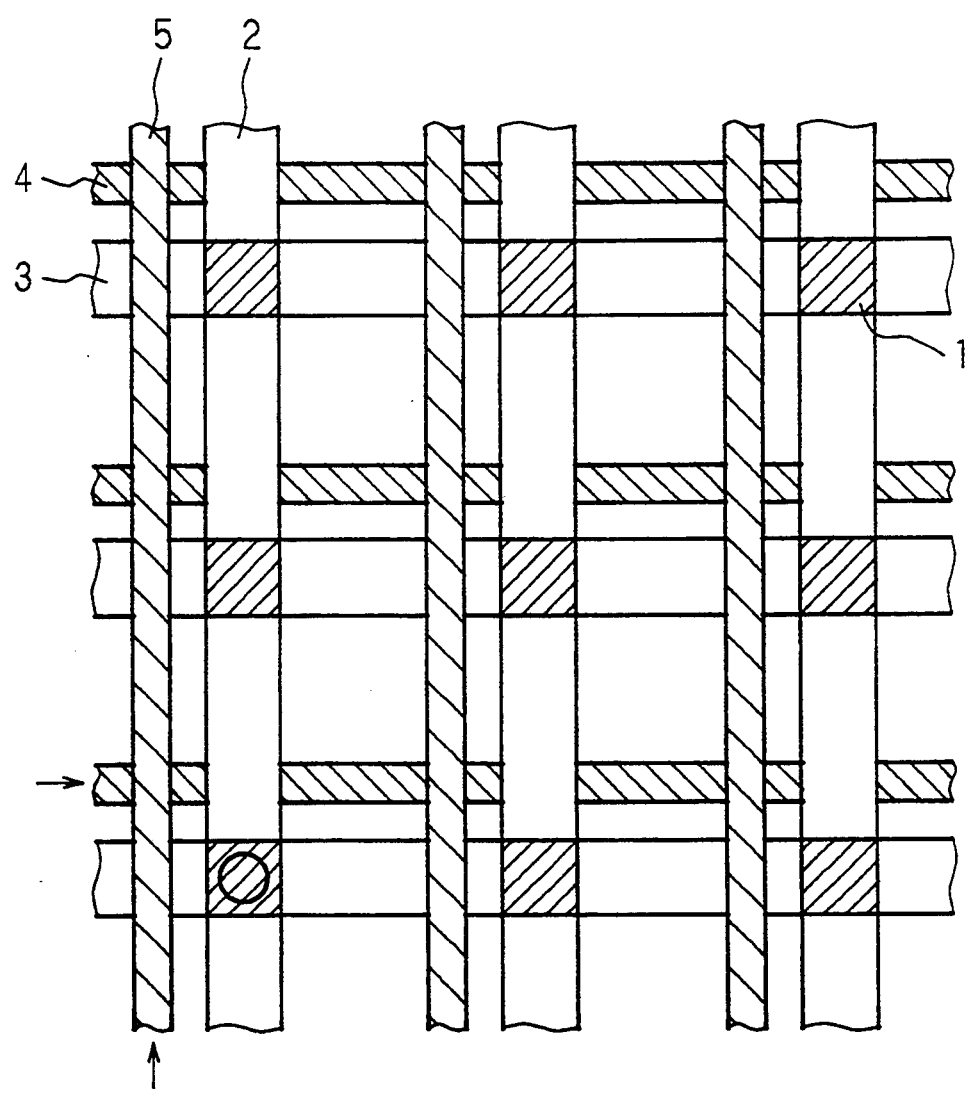
FIG. 17 is a layout pattern of the second embodiment.

A mask 40 with rectangular holes (for example, 0.1 μm × 1.2 μm) is held in tight contact with a glass substrate, as illustrated in FIG. 14. A conductor film of Cu, Au, Al, etc., 0.5 μm thick is formed as a reproducing line through sputtering or the like. Moreover, another mask 50 with rectangular holes (0.5 μm square) as shown in FIG. 15 is brought in tight contact onto the mask 40 in a manner that each side of the rectangular hole overlaps one end of the conductor film of Cu, Au, Al, etc. Then, a GdCo film as the magnetic thin film memory element 1 about 2000 Å is formed through sputtering with a bias voltage (−50 V). As a result, the magnetic thin film memory element 1 is connected to the reproducing lines 2, 3 as indicated in FIG. 16. A dielectric film of SiNx or the like 0.1 μm thick is formed as a protecting film onto the magnetic thin film memory element 1 and reproducing lines 2, 3.

Then, vertical recording lines are formed of Cu onto the SiNx film by sputtering or the like. The recording line is 0.5 μm thick. Further, an SiNx film 0.1 μm thick is formed all over the surface and lateral recording lines of Cu 0.5 μm thick are formed. At this time, the vertical and lateral recording lines are formed to be shifted a little from the rectangular magnetic thin film memory element 1.

Finally, a protective coating of resin is formed.

The coercive force of the GdCo film used as the magnetic thin film memory element 1 in Embodiment 1 is 40 Oe, and the recording currents Ix, Iy are constant 15 mA.

The pattern cycle is 2 μm, the magnetic thin film memory element 1 is 0.5 μm square and the center distance between the recording line and magnetic thin film memory element 1 is about 1 μm.

The magnetic field generated by each recording line and applied to the central part of the magnetic thin film memory element 1 is approximately 30 Oe. The magnetic force exceeds enough the coercive force 40 Oe of the magnetic thin film memory element 1 only when both magnetic fields are superimposed, whereby good recording is achieved.

A voltage of approximately 4.5 mV is impressed to both ends of the magnetic thin film memory element 1 through the current line 2. When the magnetization of the memory element 1 is reversed from "0" to "1", the voltage change on the voltage line 3 is about 40 μV, assuring good reading.

Embodiment 2

By using a mask or the like, similar to Embodiment 1, the following films are formed in the following order on a silicon substrate through sputtering.

| | |
|---|---|
| Recording line 4 | 1 μm thick |
| Insulating film | 0.1 μm thick |
| Current line 2 and voltage line | 0.5 μm thick |
| Magnetic thin film memory element | 0.05 μm thick |
| Insulating film | 0.1 μm thick |
| Recording line 5 | 1 μm thick |

A pattern shown in FIG. 15 is obtained. The magnetic thin film memory element 1 is formed of TbHoco having the axis of easy magnetization in a perpendicular direction and the coercive force of 30 Oe.

The pattern cycle is 2 μm, the magnetic thin film memory element 1 is 0.5 μm square, and the center distance between the recording lines 4, 5 and magnetic thin film memory element 1 is approximately 1 μm. The number of the elements is 1000×1000.

A current 10 mA is supplied through the recording lines 4, 5. At this time, the magnetic field generated by each recording line 4, 5 at the central part of the magnetic thin film memory element 1 is about 20 Oe. Only when both magnetic fields are superimposed, the magnetic force is fully exceeds the coercive force of the memory element 1, thus realizing good recording.

A voltage of 5 V is impressed to both ends of the current line 2, whereby a current of about 3.5 mV is applied to both ends of each magnetic thin film memory element 1. When the magnetization of the magnetic thin film memory element 1 is reversed from "0" to "1", the voltage change appearing on the voltage line 3 is about 30 μV. Accordingly, good reading is achieved by sufficiently larger read-out signal than the thermal noise.

Embodiment 3

Figure 18:
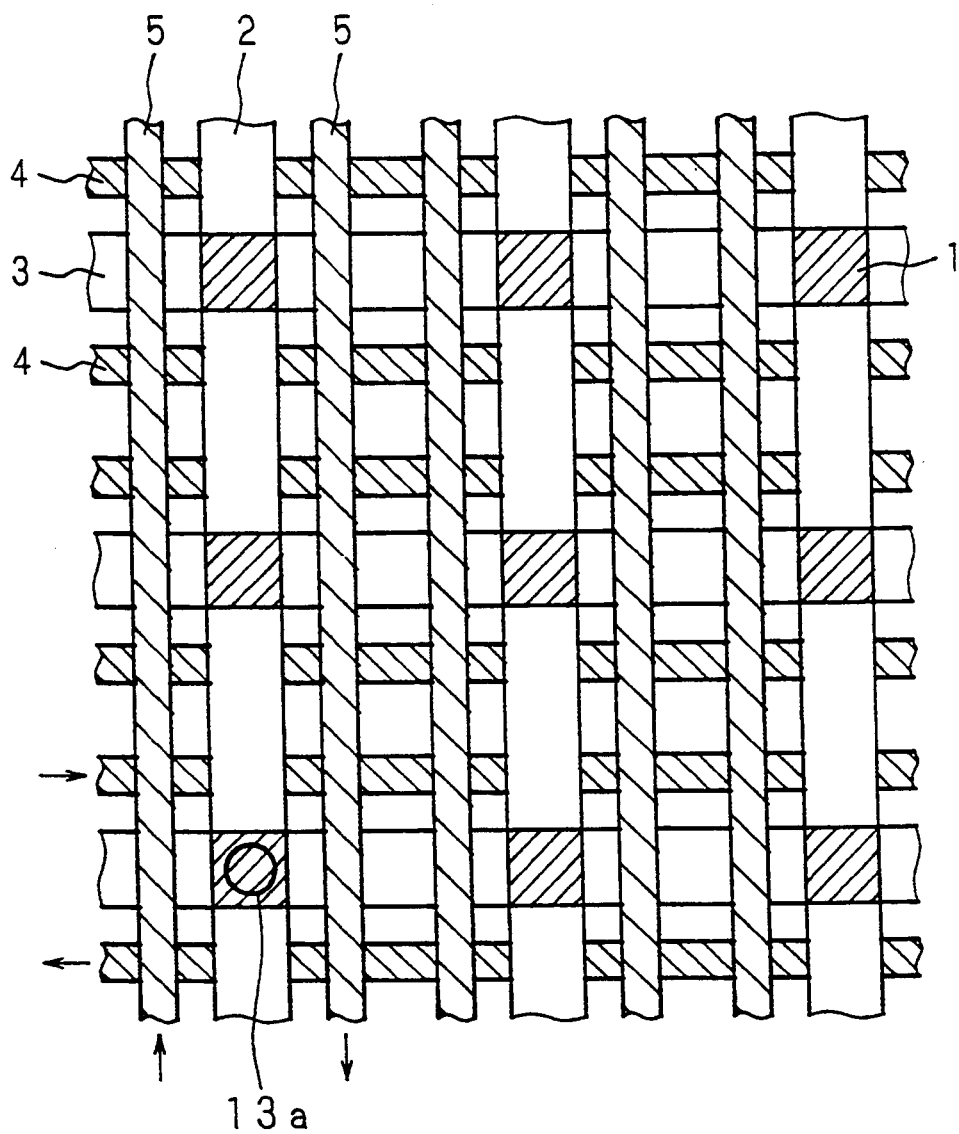
FIG. 18 is a layout pattern of a third embodiment of this invention.

As shown in FIGS. 13 and 18, in Embodiment 3, recording lines 4, 4, 5, 5 are provided on both sides of the magnetic thin film memory element 1. When currents are supplied in reverse directions to the recording lines 4, 4 or 5, 5, favorable recording is accomplished. More specifically, when directing the magnetization of the memory element 13a marked by a circle in FIG. 18 to be downward for recording, the currents are fed to the four recording lines in the vicinity of the memory element 13a in respective directions shown by arrows. Meanwhile, in order to direct the magnetization of the memory element 13a upward for recording, the currents should be fed in the opposite directions to those shown by the arrows. In this case, half the amount of current is enough to one recording line in comparison with when the recording lines are provided on one side of the magnetic thin film memory element 1.

Embodiment 4

Figure 19:
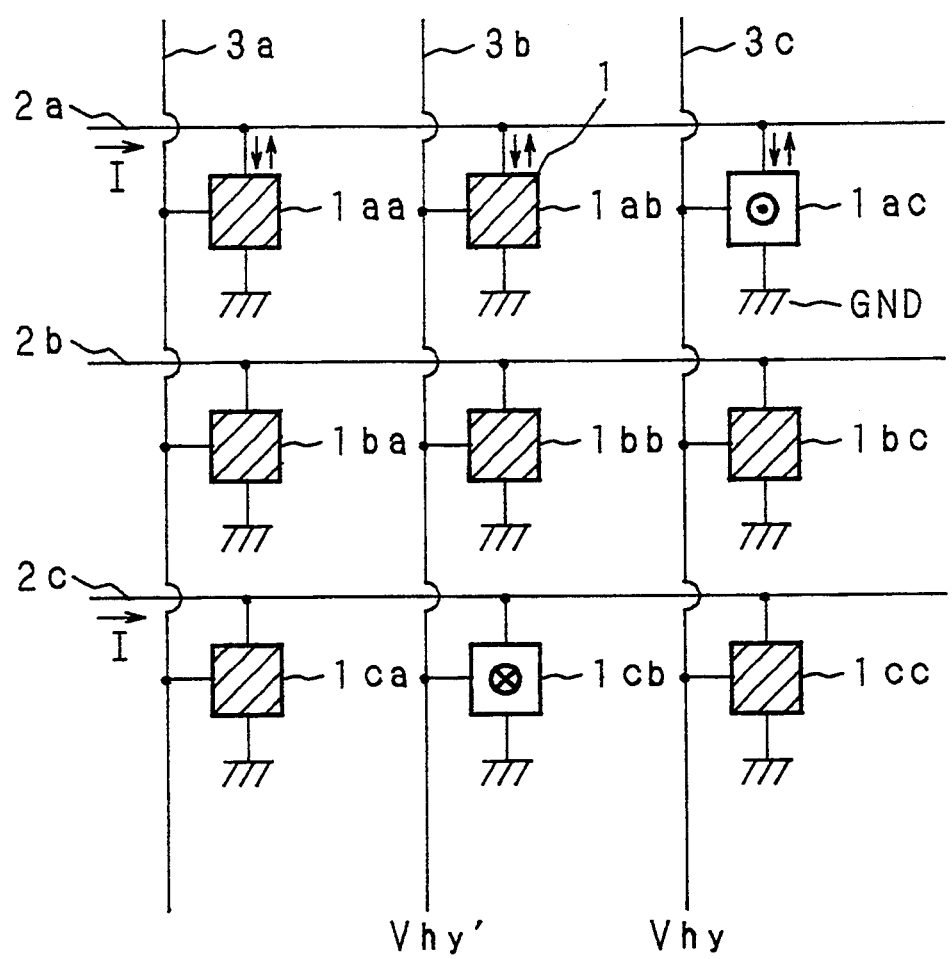
FIG. 19 is a diagram of a fourth embodiment of this invention.

FIG. 19 is a conceptual diagram of the structure of Embodiment 4 of this invention, wherein reference numerals 1aa, 1ab, ..., 1cc are magnetic thin film memory elements, and 2 and 3 are a current line and a voltage line mounted to the magnetic thin film memory elements 1, respectively. A magnetic thin film having perpendicular magnetic anisotropy is employed as the magnetic thin film memory element 1. GND is the ground.

For reading out information from the magnetic thin film memory element 1cb magnetized downward, a current I should be fed to a current line 2c and the voltage change Vhj' of a voltage line 3b at that time should be detected. Similarly, for reading out information from the magnetic thin film memory element 1ac magnetized upward, the current I should be supplied to a current line 2a and the voltage change Vhj of a voltage line 3c at that time should be read. The voltage generated at the time is the anomalous Hall voltage between the voltage line 3 and the grounded point of the current line 2, which is plus or minus depending on whether the memory element is magnetized downward or upward. Accordingly, the information can be read out by the difference in the recorded direction of magnetization.

Figure 20:
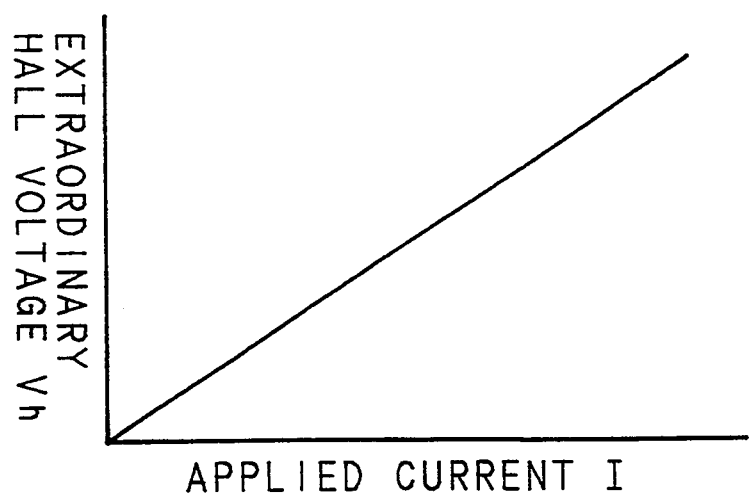
FIG. 20 is a graph showing the relation between the applied current and anomalous Hall voltage.

The relation between the current I applied to the current line 2 and the voltage Vh (extraordinary hall voltage) appeared in the voltage line 3 is indicated in FIG. 20. As the impressed current I is increased, the voltage change becomes larger, thereby improving the S/N ratio of a reproducing signal and enhancing the integration density of the magnetic thin film memory element 1. In some cases, however, the temperature of the wiring may rise in accordance with increase in the amount of the current I fed to the current line 2, resulting in a disconnection in the worst case. Moreover, the temperature of the magnetic thin film memory element 1 itself also rises. The extraordinary hall voltage Vh is reduced according to the temperature rise of the element, and therefore the increase in the impressing amount of the current I has limitation. For solving this problem, it is effective to supply the current to the current line 2 by a pulse current. The pulse width is better to be as short as possible so long as the anomalous Hall voltage Vh changes with readable force. Moreover, the power consumption as a whole of the memory device can be reduced by the pulse current.

Embodiment 5

Figure 21:
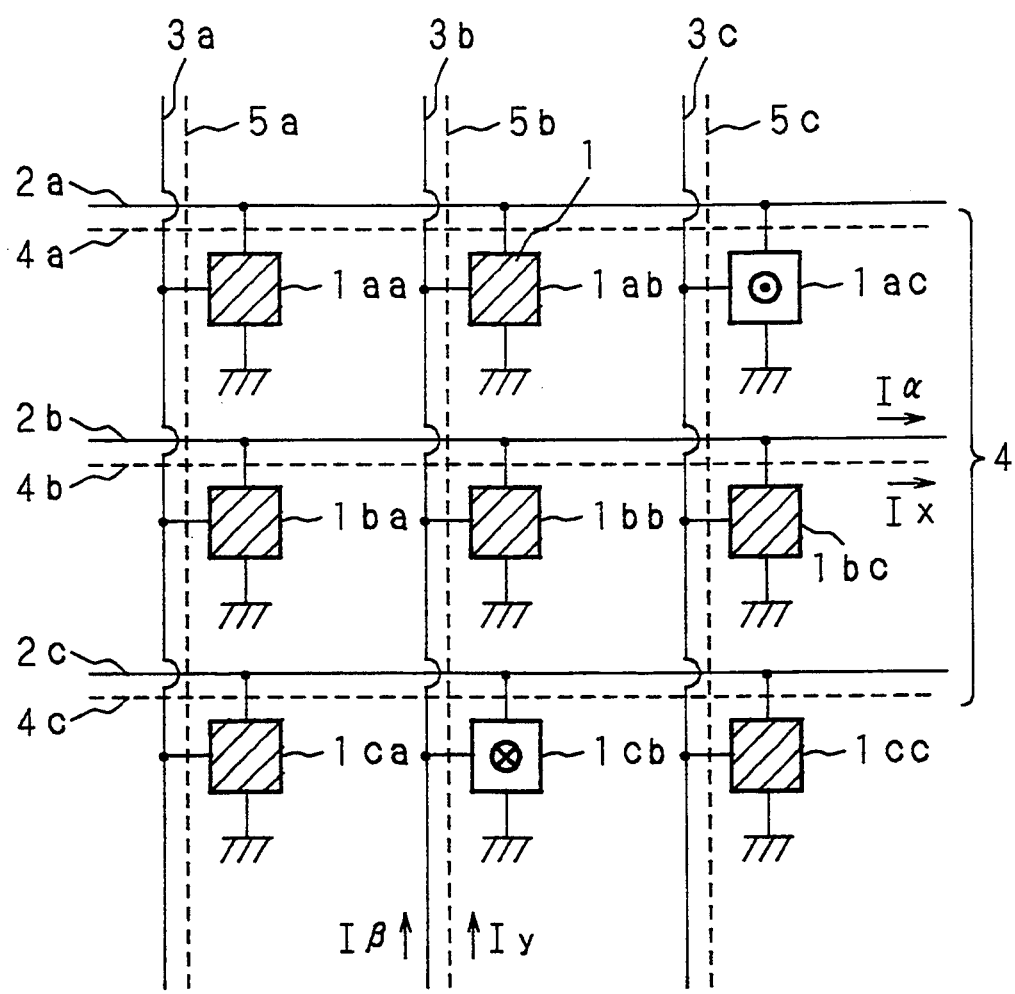
FIG. 21 is a diagram of a fifth embodiment of this invention wherein recording lines are added to the fourth embodiment.

The recording method will be discussed with reference to embodiment 5. FIG. 21 is a conceptual diagram showing the structure of Embodiment 5 of this invention. In FIG. 21, recording lines 4, 5 orthogonal to each other are shifted slightly from the magnetic thin film memory element 1, so that a perpendicular magnetic field is impressed to the magnetic thin film memory element 1 when currents Ix and Iy are supplied to the recording lines. As one example, the case of directing the magnetization of the magnetic thin film memory element 1bb downward for recording will be described. When the current Ix is fed to the recording line 4b in the direction →, a perpendicular magnetic field HiX is applied to the magnetic thin film memory element 1bb. When the current Iy is supplied to the recording line 5b in the direction ↓, a perpendicular magnetic field Hiy is impressed to the memory element 1bb. Furthermore, when a current Iα is fed to the reproducing current line 2b in the direction →, a perpendicular magnetic field Hiα is impressed to the memory element 1bb. When a current Iβ is fed to the reproducing voltage line 3b in the direction ↓, a perpendicular magnetic field Hiβ is generated in the memory element 1bb. Assuming that the coercive force of the magnetic thin film memory element 1bb is Hc, a inequality (1) below is held in the recording case:

$$Hc < Hix + Hiy + Hi\alpha + Hi\beta \tag{1}$$

When the inequality (1) is satisfied, the magnetization in the magnetic thin film memory element 1bb is reversed, thus completing recording. If the inequality (1) is held even when Hix=0, the recording line 4b may be abbreviated. The recording line 5b may be abbreviated as well if the inequality (1) is held even when Hiy=0. Further, if the inequality (1) is true even when Hix=-Hiy=0, both the recording lines 4b, 5b are unnecessary. That is, the reproducing current line 2 and voltage line 3 also work as the recording lines. In Embodiment 4 of FIG. 19, the recording lines 4, 5 are omitted and the reproducing current line 2 and voltage line 3 are also used as the recording lines, and at the same time, the GND side of the current line 2 is in common with the voltage line 3, whereby the whole structure is remarkably simplified.

Embodiment 6

Figure 22:
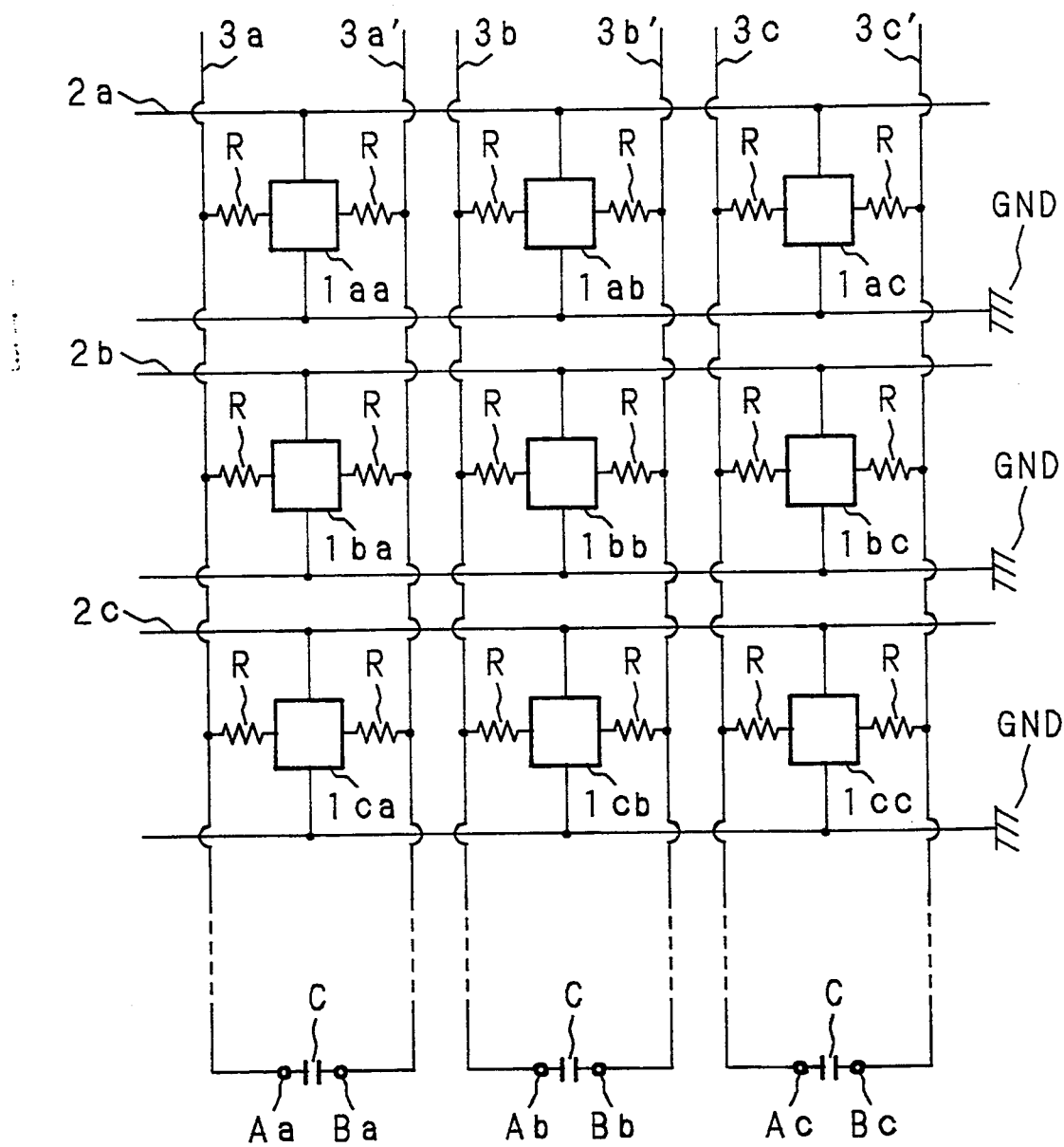
FIG. 22 is a diagram of a sixth embodiment of this invention.

Such an arrangement as follows will be made for recording/reproducing of information. FIG. 22 illustrates a magnetic thin film memory element employing a different reproducing method from Embodiment 4 of FIG. 19. More specifically, the different three points are:

(1) The anomalous Hall voltage Vh is detected as a potential difference between terminals A and B at both ends of the voltage line 3 of the magnetic thin film memory element 1. Since the running direction of the reproducing current I is orthogonal to the direction of the connection between the terminals A and B, no potential difference is brought about between the terminals A and B due to the current I without the extraordinary Hall effect. Therefore, the potential difference between the terminals A and B results only from the extraordinary Hall effect, and such signals that have different polarities depending on the direction of magnetization of the memory element 1 and have the same absolute value are obtained.

(2) Resistors R provided at both sides of the magnetic thin film memory element 1 can reduce the current flow to the magnetic thin film memory elements 1 from which information is not read out, thereby making it possible to eliminate noises.

(3) When a capacitor C is connected between the terminals A and B and the reproducing current is fed, for example, to the current line 2a, information is read out from all the magnetic thin film memory elements 1aa, 1ab, 1ac along the line with the anomalous Hall voltage Vh generated between the corresponding terminals Ai and Bi (i=a, b, c). The anomalous Hall voltage Vh is stored in the corresponding capacitor c after a preset charging time. After the capacitor c is charged, the reproducing current is shut off. Therefore, if the potential difference between the terminals A1-B1, A2-B2, A3-B3 is read one by one without using the capacitor C, it is necessary to continuously supply the reproducing current during the reading time, inviting loss of electricity. The charged capacitor is opened for reading after the reproducing current is shut off.

Embodiment 7

Figure 23:
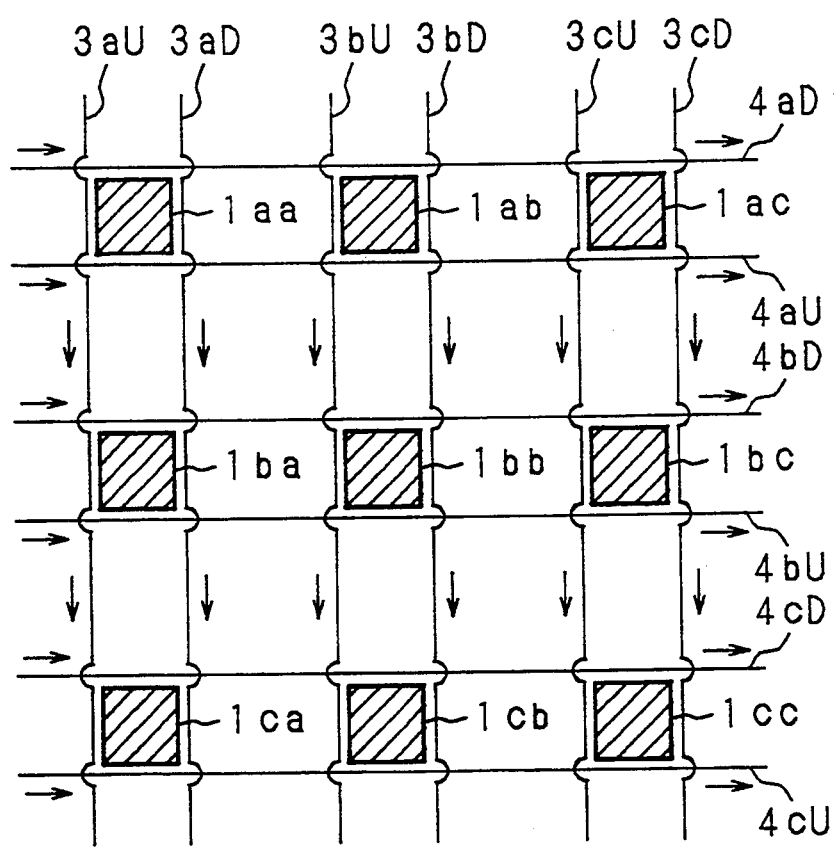
FIG. 23 is a diagram of a seventh embodiment of this invention.

FIG. 23 shows a magnetic thin film memory element employing a different recording method from Embodiment 5 in FIG. 21. The current line 2 and the voltage line 3 are also used as the recording lines according to Embodiment 5. Although it is possible in this Embodiment 7 as well, for simplification of the explanation, recording and reproducing will be considered separately here and only the lines necessary for recording are indicated in FIG. 23. When the magnetization of the magnetic thin film memory element 1ac is intended to be directed upward for recording, the currents should be fed to the recording lines 4aU and 3cU in the direction shown by respective arrows. When the magnetization of the magnetic thin film memory element 1ac is intended to be directed downward for recording, the current should be supplied to the recording lines 4aD and 3cD in the direction shown by respective arrows. In other words, the different recording lines are used between the upward recording and downward recording. Accordingly, it is not necessary to reverse the direction of the currents to the recording lines, which eliminates the reversing time of the current direction. That is, the data transfer rate in recording can be accelerated.

Now, the manufacturing method of the magnetic thin film memory devices in Embodiments 4 through 7 will be depicted hereinafter.

Figure 24:
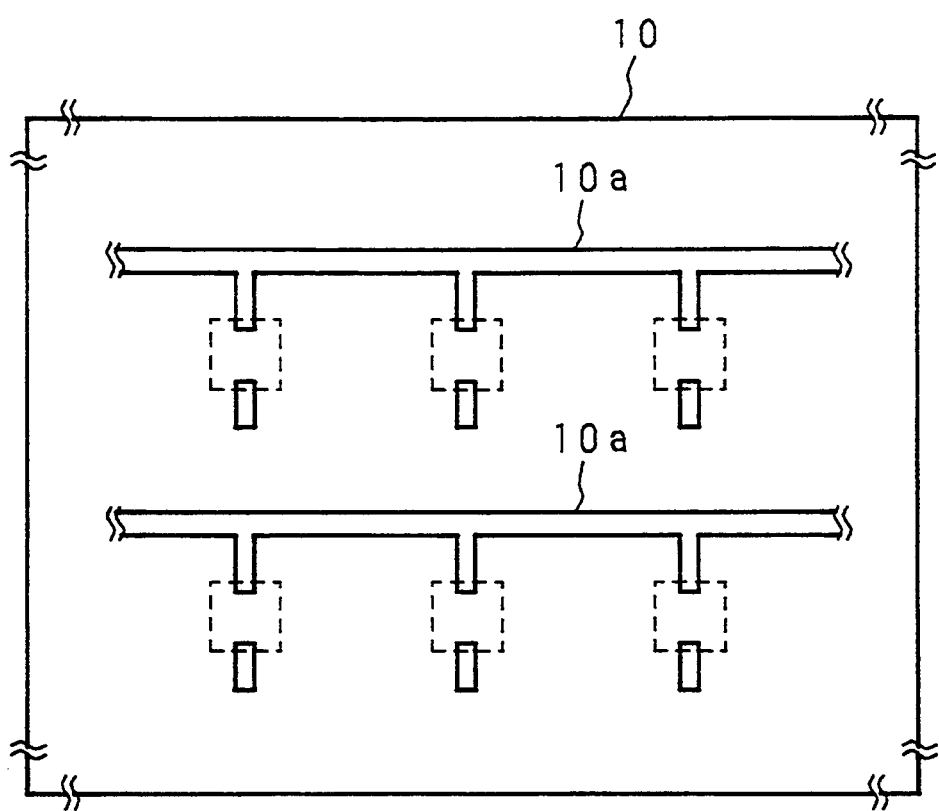
FIGS. 24, 25, 26 are diagrams explanatory of the manufacturing process in the sixth and seventh embodiments.
Figure 25:
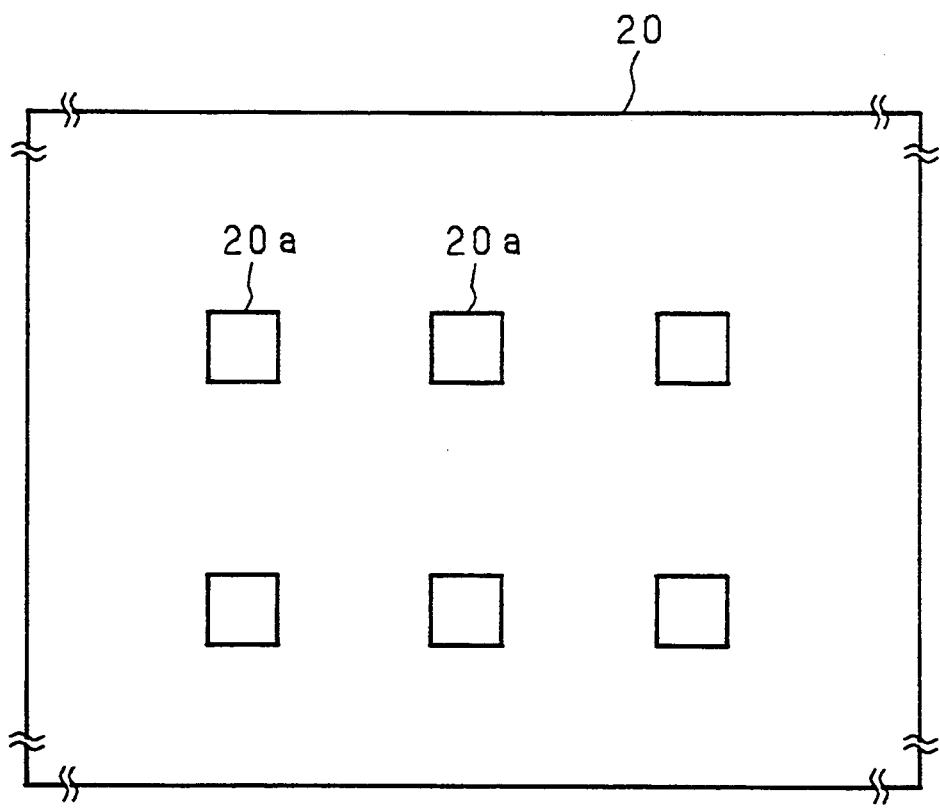

A mask 10 as shown in FIG. 24 is held in tight contact with a substrate and then, a conductor of Cu, Au, Al or the like is formed as the reproducing current line 2 through a hole 10a by sputtering, etc. (parts indicated by dotted lines will be described later). Thereafter, a mask 20 shown in FIG. 25 is brought into tight contact with the substrate in a manner that the upper and lower sides of a rectangular hole 20a of the mask 20 overlap the corresponding ends of the conductor formed earlier (as indicated by the dotted lines in FIG. 24.). An HoCo film is formed to be a magnetic thin film memory element by sputtering, etc. An insulating film is formed by liftoff method, etc. except where the magnetic thin film memory element 1 is formed.

Figure 26:
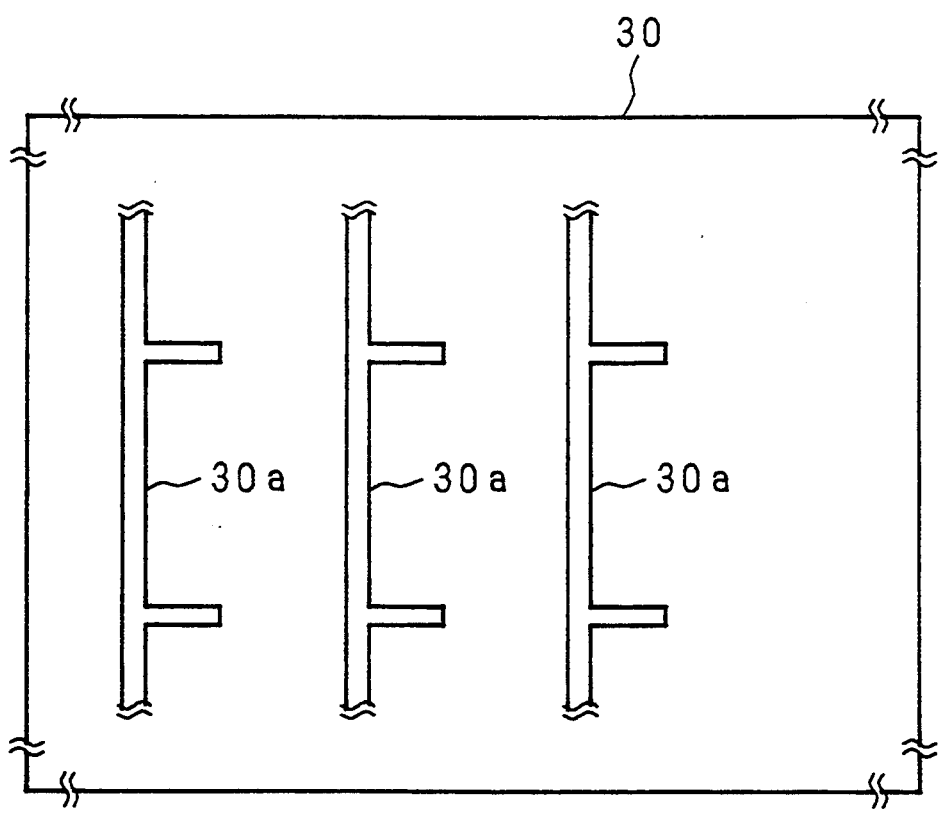

Moreover, a mask 30 of FIG. 26 is tightly attached to the substrate and a conductor is formed of Cu, Au, Al, etc. as the reproducing voltage line 3 through a hole 30a by sputtering or the like to be in touch with the magnetic thin film memory element 1. A dielectric film of SiNx, etc. is formed as a protecting film on the voltage line 3 and the magnetic thin film memory element 2. As recording lines, strips of Cu wire are provided orthogonal to each other and the both shifted slightly from the rectangular magnetic thin film memory elements 2 (with reference to FIG. 21.) A protection coating of resin is applied in the last place. The coercive force Hc of the HoCo film in Embodiments 4 through 7 is 30 Oe and the pattern cycle is 2 μm. The magnetic thin film memory element 1 is 0.5 μm square. The center distance between the recording line and the magnetic thin film memory element 1 is 1 μm. The recording currents Ix, Iy, Iα, Iβ are constant as shown in Table 1 below.

TABLE 1

| Experiment | Ix (mA) | Iy (mA) | Iα (mA) | Iβ (mA) |
| --- | --- | --- | --- | --- |
| 1 | 5 | 5 | 5 | 5 |
| 2 | 5 | 5 | 10 | — |
| 3 | 5 | 5 | — | 10 |
| 4 | — | 5 | 5 | 5 |
| 5 | 5 | — | 5 | 5 |
| 6 | — | — | 10 | 10 |

In any of the experiments 1 through 6, the coercive force 30 Oe of the magnetic thin film memory element 1 is sufficiently exceeded, and therefore good recording is carried out. When a pulse current of the pulse width 50 nsec is fed to the current line 2 so as to impress about 20 mV to both ends of the magnetic thin film memory element 1, the voltage change of about 20 μV appears at the voltage line 3, that is, good reading is gained.

Embodiment 8

Figure 27A:
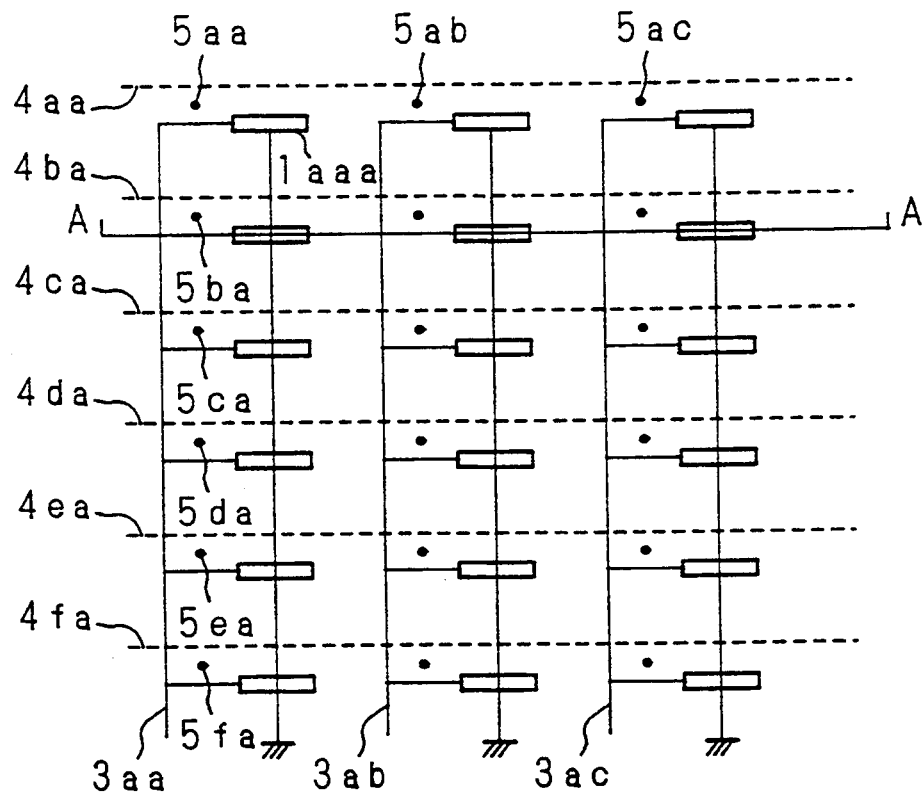
FIGS. 27A and 27B comprise a diagram of an eighth embodiment of this invention.
Figure 27B:
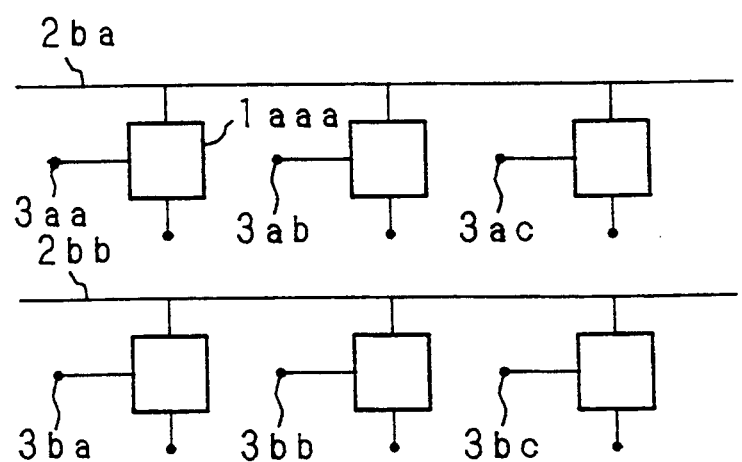

In FIG. 27, there is shown the structure of a magnetic thin film memory device according to Embodiment 8 of this invention. FIG. 27A being a side view and FIG. 27B being a cross sectional view taken along the line A—A of FIG. 27A. After forming leading parts (not shown) of the reproducing current line 2 and reproducing voltage line 3 from the magnetic thin film memory element 1 on a substrate, an HoCo film is formed as the magnetic thin film memory element 1 in the similar manner to Embodiments 4 through 7. Then, the recording lines 4, 5 are formed while an insulating film of alumina or the like is held therebetween so as to insulate the both lines. Thereafter, the same procedures as above Embodiments 4 through 7 are repeated to sequentially form the layers of the magnetic thin film memory device. The reproducing voltage line 3 which connects the layers with each other is formed by forming through-holes and connecting conductors. The coercive force Hc of the Hoco film of Embodiment 8 is 30 Oe.

Referring to FIG. 27, in order to record information in the magnetic thin film memory element 1aaa, a constant current 10 mA is supplied to each of the recording lines 4aa and 5aa. At this time, the magnetic field generated by each of the recording lines 4aa and 5aa at the central part of the magnetic thin film memory element 1aaa has the magnetic force of 20 Oe. Only when both magnetic fields are super-imposed, the coercive force 30 Oe of the memory element 1 is fully exceeded to achieve favorable recording. Similar to Embodiment 5 in FIG. 21, the additional magnetic field may be applied by supplying a constant current through the reproducing current line 2. In reading, a pulse current of the pulse width 50 nsec is applied to the current line 2 so as to impress about 20 mV to both ends of the magnetic thin film memory element 1. The voltage change of about 5 μV is detected at the voltage line 3aa, and good reading is done. The voltage change decreases more as the number of the layers of the magnetic thin film memory elements 1 increases, and therefore it is necessary to determine the number of layers to ensure the detection of the voltage change.

Embodiment 9

Figure 28:
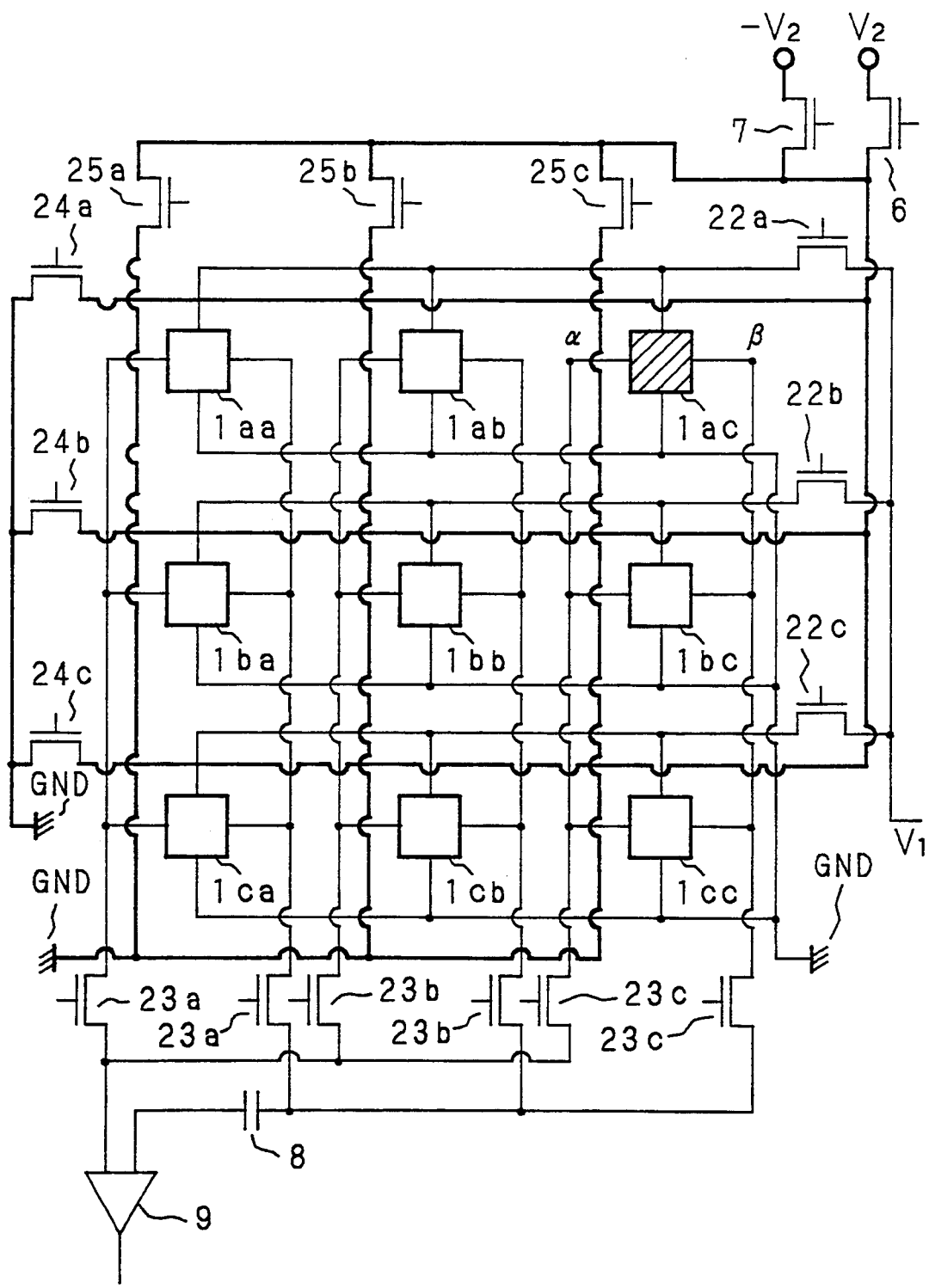
FIG. 28 is a circuit diagram of a ninth embodiment of this invention.

FIG. 28 shows the structure of a magnetic thin film memory device of Embodiment 9 of this invention, in which nine magnetic thin film memory elements 1aa–1cc are formed in matrix. Referring numerals 22a through 22c, 23a through 23c, 24a through 24c, 25a through 25c, 6, 7 represent switches comprised of a transistor, and 8 is a capacitor, 9 is an amplifier such as an operational amplifier, etc. V1, V2 are positive voltage sources and GND indicates the ground.

The recording method of the magnetic thin film memory device in the aforementioned structure will be described below. For recording, the direction of magnetization of each magnetic thin film memory element (referred to as a memory element hereinafter) 1aa–1cc is turned upward or downward. In this Embodiment 9, the upward magnetization corresponds to "0" of a binary digital data, while the downward magnetization corresponds to "1" of a binary digital data.

Figure 29:
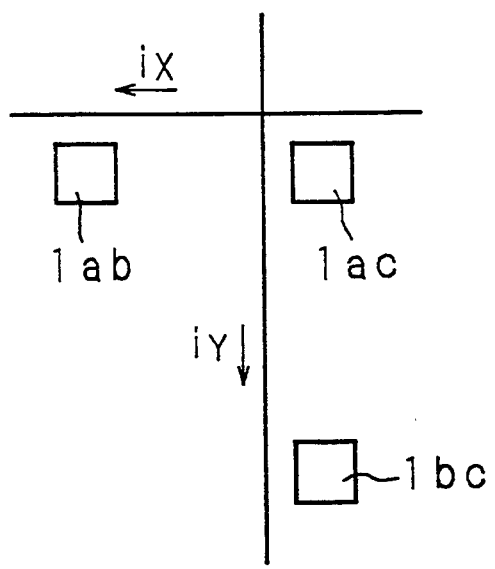
FIG. 29 is a partly-enlarged view of the ninth embodiment.

When the magnetization of the memory element 1ac is directed upward, data "0" is recorded in FIG. 28. the lines related to recording are drawn thick. When recording is not executed, the switches 24a through 24c, 25a through 25c are all turned off, so that no current flows in the thick drawn parts. When the switches 24a, 25c are turned on and switch 6 is turned on, currents iX, iY are introduced to the thick drawn parts near the memory element 1ac as indicated in FIG. 29.

The resistances of the recording lines are so set that the currents iX and iY are approximately equal to each other. Therefore, a magnetic field is generated around the direct current iX, iY based on the Ampere's law. The magnetic field applied by the direct current iX to the memory elements 1ac, 1ab is upward, having the magnetic force of Hx. The magnetic field applied by the direct current iY to the memory elements 1ac, 1bc is also upward, with the magnetic force of Hy. Although the direction currents iX are iY generate magnetic fields to the memory elements 1bc and 1ab, respectively, since the distance of the magnetic fields is farther, the influence of the magnetic fields is negligible. Accordingly, the force of the magnetic fields acting to the memory elements 1ab, 1ac, 1bc is Hx, Hx+Hy, Hy, respectively.

The currents iX and iY are approximately equal to each other and therefore, Hx=Hy. In other words, the magnetic fields acting to the memory elements 1ab, 1ac, 1bc are approximately Hx, 2Hx, Hx, respectively. Supposing that the coercive force Hc of the magnetic thin film is Hc, the source voltage V2 may be adjusted to satisfy $$Hx < Hc \text{ and } 2Hx > Hc \qquad (2)$$

it becomes possible to selectively magnetize the memory element 1ac alone upward. Moreover, if the memory element 1ac is desired to be magnetized downward to record "1", the switches 24a, 25c and 7 should be turned on. Information is recorded to the other memory elements in the same manner as above.

Figure 30A:
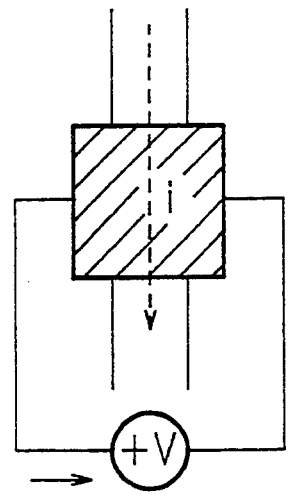
FIGS. 30A and 30B are diagrams explanatory of the extraordinary Hall effect.
Figure 30B:
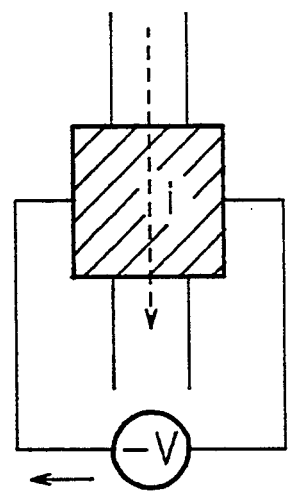

A brief account of the extraordinary Hall effect will be given below. The extraordinary Hall effect is a phenomenon caused when a current is fed to a ferromagnetic substance or ferromagnetic substance. In this case, a voltage is generated in a perpendicular direction to the both direction of current and magnetization. As shown in FIGS. 30A and 30B, when the direction of magnetization is reversed, the generated voltage is also reversed.

Figure 31:
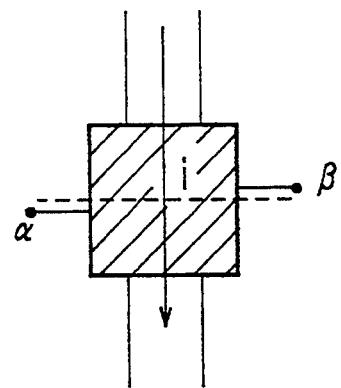
FIG. 31 is a diagram explanatory of the displacement between the electrodes.

The reproduction process of the magnetic thin film memory device utilizing the above-described extraordinary Hall effect will be depicted now. For instance, in order to read out information from the memory element 1ac, the switch 22a is turned on, resulting in a flow of a current running downward in the memory elements 1aa, 1ab, 1ac in FIG. 28. By measuring the potential difference between the electrodes α, β at both lateral ends of the memory elements 1ac at this time, the direction of magnetization is reproduced as the principle. However, in the case where the shape of the elements or the position of the electrodes are varied at the manufacturing time, the potential difference is superimposed on a signal as a bias voltage, thus causing an error. Since the anomalous Hall voltage is 1% or so of the applied voltage, the shape of the elements should be highly accurate. Particularly, as the size of the elements is required to be about 1 μm for realizing higher recording density, an advanced processing technique becomes necessary. For example, if the positions of the reading electrodes α, β are oppositely shifted from the center as indicated in FIG. 31, such bias voltage is brought about as to render the electrode β higher than the electrode α in potential.

Figure 32:
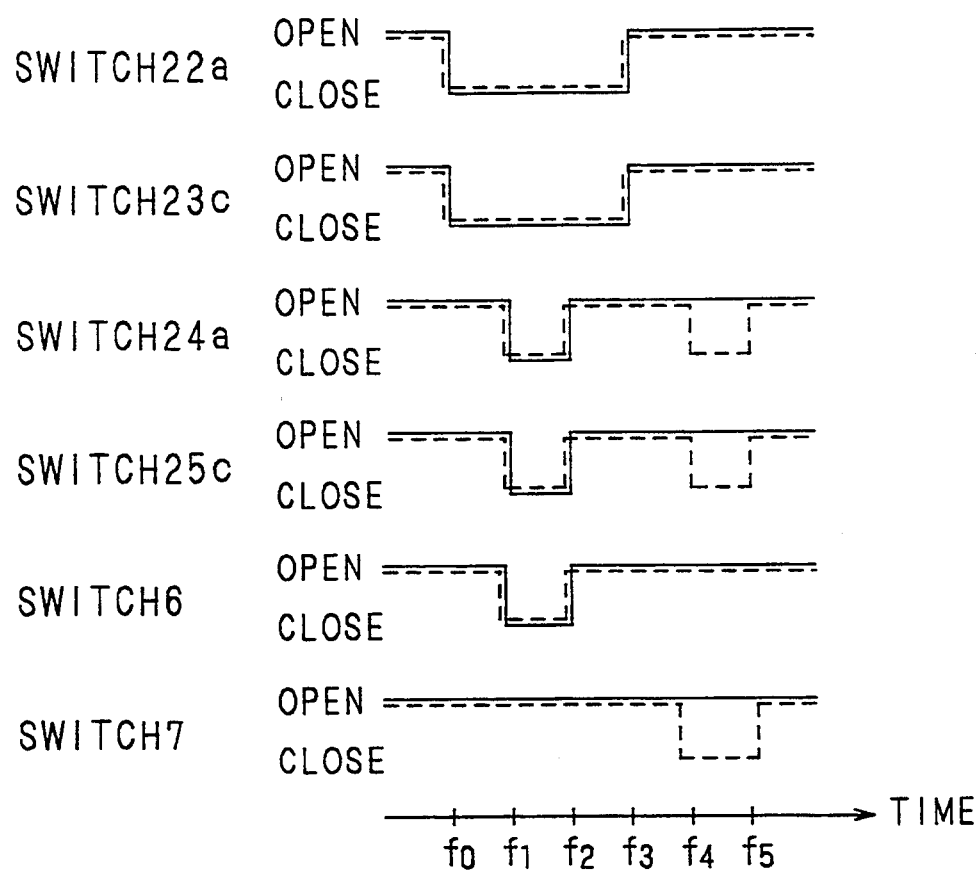
FIG. 32 is a timing chart of switching for reproducing information in the ninth embodiment.

As a countermeasure against the aforementioned bias voltage, information may be read out with use of the change of magnetization, which will be depicted hereinafter. FIG. 32 is a timing chart of each switch in reproducing the recording state in the memory element 1ac. The switches not indicated in the chart are all open. During a period from t0 to t3, the switches 22a, 23c are closed, holding the memory element 1ac in the reproducing state. Especially during a period from t1 to t2, the switches 24a, 25c, 6 are also closed, so that an upward magnetic field 2 Hx (>Hc) is applied to the memory element 1ac. Therefore, when the initial direction of magnetization of the memory element 1ac is upward, the direction of magnetization is not changed by the magnetic field, and "0" is reproduced. On the other hand, when the initial direction is downward, the magnetic field 2 Hx not smaller than the coercive force Hc of the memory element acts upward, thereby reversing the magnetization upward during the period from t1 to t2. This reversal is detected as the change of the reproducing signal, i.e., "1" is reproduced.

When "1" is reproduced, however, the initial downward direction of magnetization before reproducing is lost. Therefore, it is necessary to return the direction of magnetization to that of before reproducing by applying a magnetic field downward. As such, when the change of the reproducing signal is observed during a period from t1 to t3, the switches 24a, 25c, 7 should be closed during a period from t4 to t5 to apply the downward magnetic field. In this manner, by reproducing the recorded information with use of the change of the signal caused by the change of magnetization, good reproducing is achieved without errors even if the bias voltage occurs. The signal change is amplified by the capacitor 8 and amplifier 9.

In Embodiment 9, the magnetic thin film used for the memory elements 1aa–1cc has perpendicular magnetic anisotropy. Ferromagnetic substance such as CoCr, Ba ferrite and the like may be used as the magnetic thin film with perpendicular magnetic anisotropy, but a large saturation magnetization Ms and the resultant demagnetizing field of the substance increase the perpendicular magnetic saturation field Hs. Therefore, the ferromagnetic substance is not suitable for the memory elements. Although it is described in the inequality (2) that the recording magnetic field 2 Hx to satisfy 2 Hx>Hc is necessary, in actual use, $$2 Hx > Hs \quad (3)$$

should be satisfied. This will be explained with reference to FIG. 33.

Figure 33A:
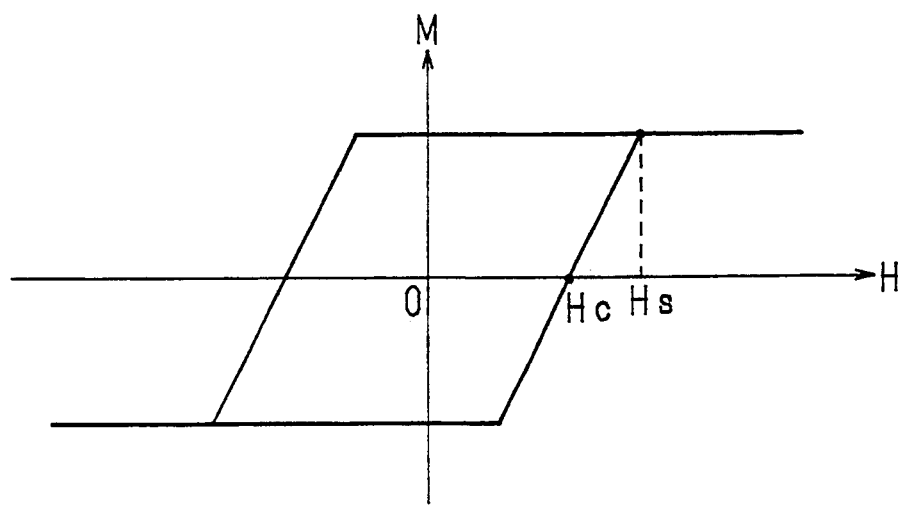
FIGS. 33A and 33B show a hysteresis loop of the magnetic thin film memory device and a diagram explanatory of the demagnetizing field.

FIG. 33A is a hysteresis loop of a general magnetic thin film with perpendicular magnetic anisotropy. The ordinate describes the magnetization M, while the abscissa represents the applied perpendicular magnetic field H. As is apparent from FIG. 33, the coercive force Hc is defined by the magnetic field when it crosses 0 point of the magnetization. Meanwhile, the saturation field Hs is defined by the magnetic field where the magnetization is saturated. Therefore, the recording magnetic field necessary to saturate the magnetization, i.e., 2 Hx satisfying the inequality (3) is required to obtain sufficiently large reproducing Hall signal.

Figure 33B:
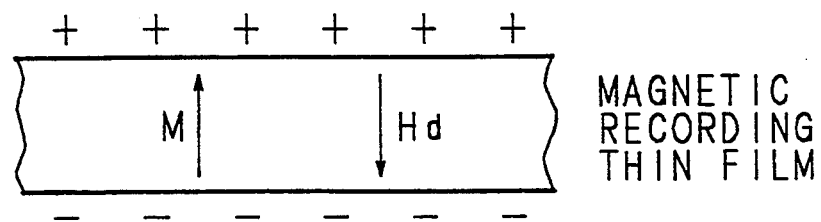

In the meantime, the inclination of the hysteresis loop of FIG. 33A resulted from the demagnetizing field Hd against the magnetization M. The demagnetizing field is, as shown in FIG. 33B, produced by the magnetization M, which is directed to obstruct the magnetization. For example, when M = 0, the demagnetizing field Hd is zero. When M=Ms (Ms is the saturation magnetization), the demagnetizing field Hd is 4 $\pi$Ms at maximum. Accordingly, it is ideal that the following formula (4):

$$Hs - Hc = 4\pi Ms \quad (4)$$

is held. Although the formula (4) is not necessarily satisfied, Hs-Hc becomes larger, in general, as the saturation magnetization Ms is increased.

From the foregoing reason, such a film with perpendicular magnetic anisotropy having smaller saturation magnetization Ms is suitable for the memory elements 1aa through 1cc. In Embodiment 9, the film made of RE-TM (rare earth-transition metal) ferromagnetic substance which is easy to control the value of the saturation magnetization Ms during the manufacture is employed. Since RE and TM are bound in antiparallel in the ferromagnetic substance, the saturation magnetization Ms can be controlled by changing the ratio of the composition.

Figure 34:
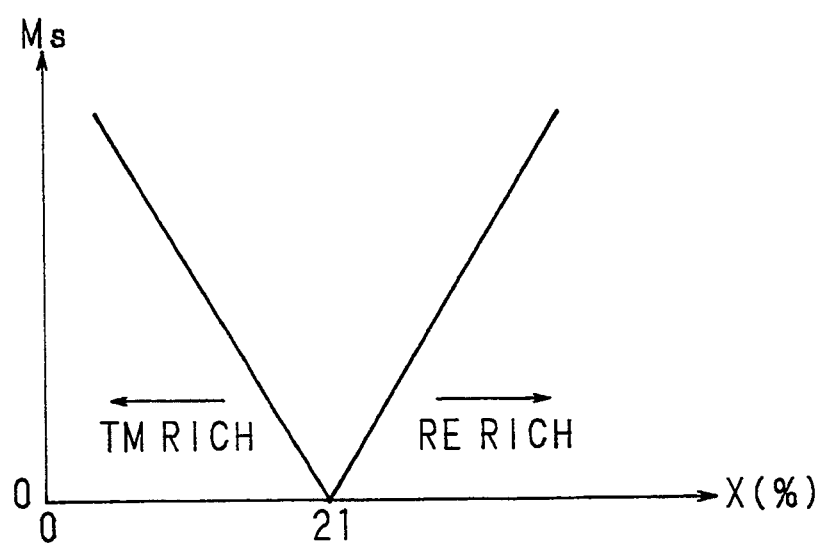
FIG. 34 is a diagram showing the relation between the composition of RE-TM ferromagnetic substance and saturation magnetization.

By way of example, the saturation magnetization Ms of a representative RE-TM ferromagnetic substance $Gd_X Fe_{1-X}$ to the composition ratio x at room temperatures is shown in FIG. 34. When x=21%, Ms is zero, which composition is specifically called as the compensation composition. When x>21%, RE becomes excessive, which composition is called as RE rich. In contrast, when x<21%, it is called as TM rich.

Figure 35:
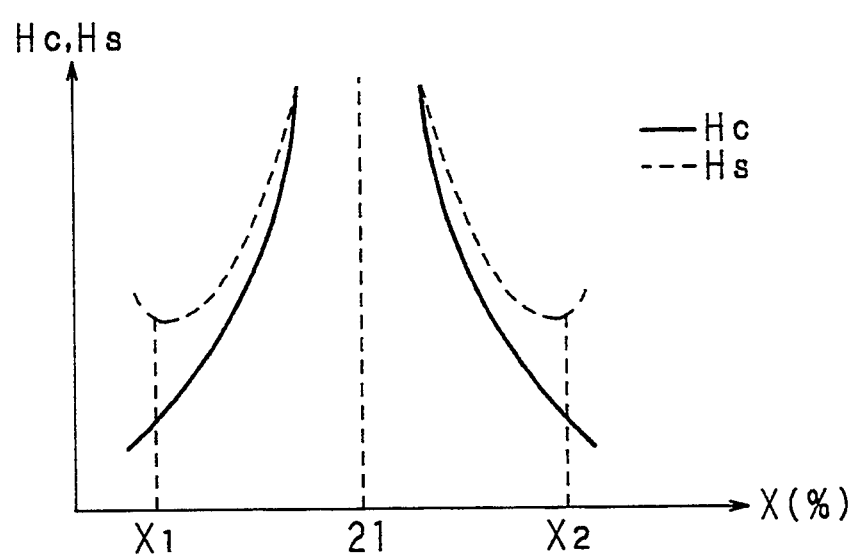
FIG. 35 is a diagram showing the relation between the composition of RE-TM ferromagnetic substance, coercive force and saturation field.

FIG. 35 indicates the dependence of the coercive force Hc and saturation magnetic field Hs of the same material on the composition ratio x at room temperatures. The coercive force Hc is infinity at the compensation composition x=21% and decreased as the composition ratio is smaller or larger than the compensation composition. This is because the interaction of the magnetic field Hext applied from outside with the magnetic thin film is proportional to a product of the Hext and Ms.

In other words, at the compensation composition, Ms is equal to zero, and therefore, the magnetic thin film does not interact with the external magnetic field Hext, resulting in the coercive force to be infinity. As the composition ratio becomes larger or smaller than the compensation composition, the saturation magnetization Ms is increased, thereby enlarging the interaction of Hext with magnetic thin film. Therefore, as a result of the reversal of magnetization with a small Hext, Hc becomes smaller. On the other hand, the saturation magnetic field Hs approximately agrees with the coercive force Hc in the vicinity of the compensation composition. However, if the composition ratio becomes larger or smaller than the compensation composition, Hs becomes larger that Hc and becomes minimum when the composition ratio is X1 or X2. Accordingly, if the composition ratio in the vicinity of X1, X2 is selected, the recording magnetic field is possible to be smaller, contributing to saving of electricity.

Figure 36:
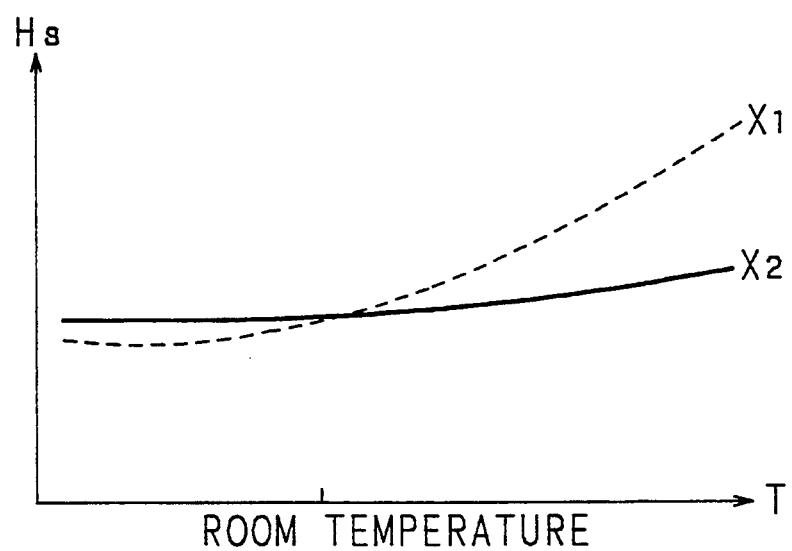
FIG. 36 is a diagram of the temperature influence to the saturation field of the RE-TM ferromagnetic substance having a specific composition.

The minimum values appears in both RE rich and TM rich. The composition ratio X2 in RE rich is more advantageous. The reason is that the influence of the temperature change on the saturation magnetic field Hs of TM rich film is generally larger than that of RE rich film as exemplified for the magnetic thin film of $Gd_X Fe_{1-X}$ in FIG. 36. If the influence of the temperature change on Hs is smaller, it is unnecessary to change the recording magnetic field force even if the surrounding temperature changes, thus making it possible to record stably.

Embodiment 10

Figure 37:
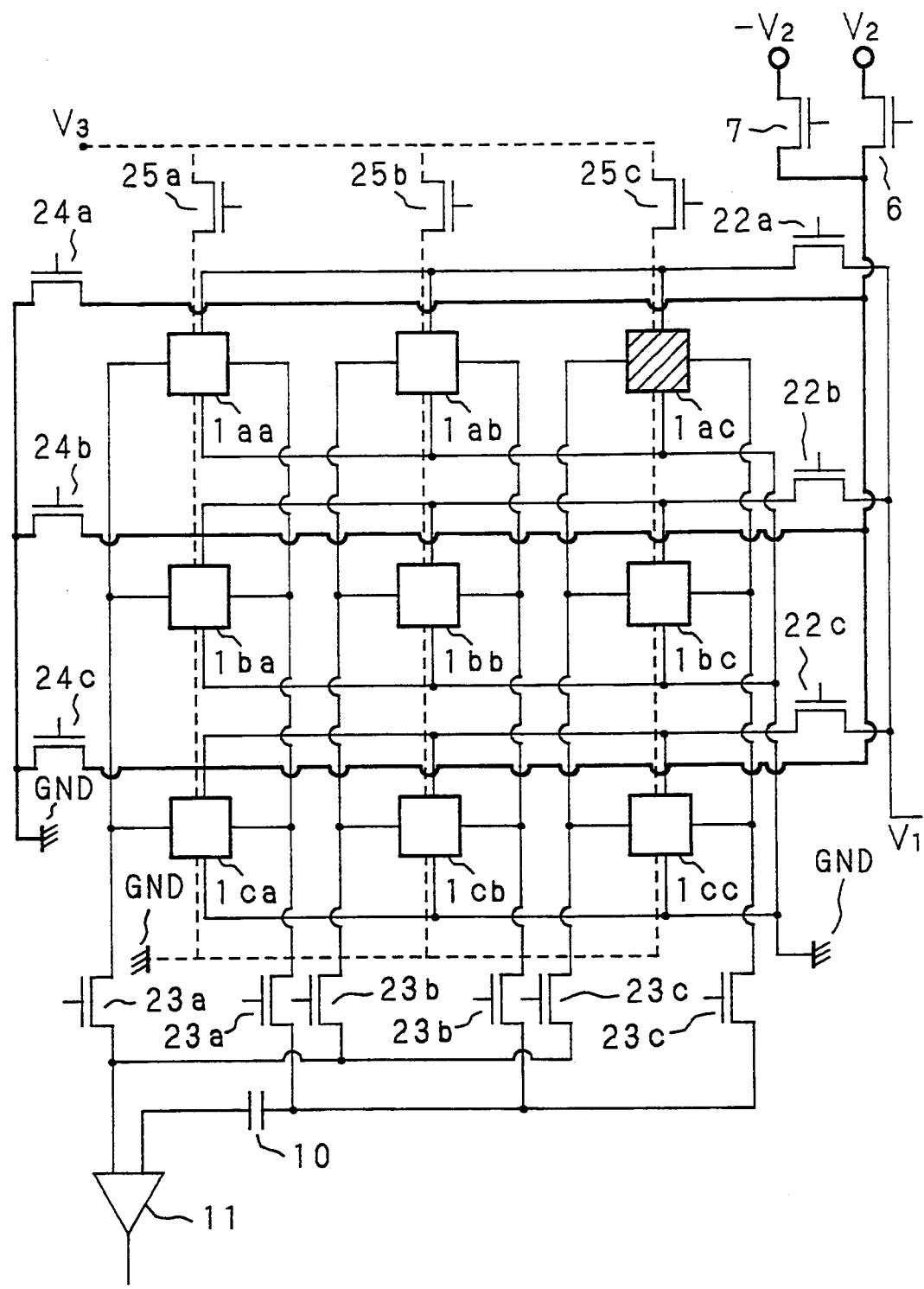
FIG. 37 is a circuit diagram of a tenth embodiment of this invention.
Figure 38:
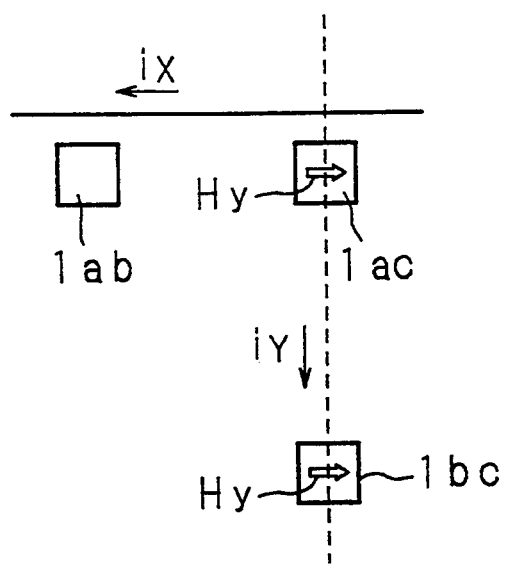
FIG. 38 is a partly-enlarged view of the tenth embodiment.

Although the magnetic field perpendicular to the film surface is employed for reproducing and recording of information in Embodiment 9, both the perpendicular and parallel magnetic fields are impressed to the film surface according to the instant Embodiment 10. FIG. 37 shows the structure of a magnetic thin film memory device according to Embodiment 10, in which the lines related to recording are indicated by thick lines and the dotted lines. For example, for recording information in the memory element 1ac, the switches 24a, 25c are closed, with the switch 6 closed in the case of recording "0". FIG. 38 shows the state of the current running at this time in the thick and dotted lines in the vicinity of the memory element 1ac.

Figure 39A:
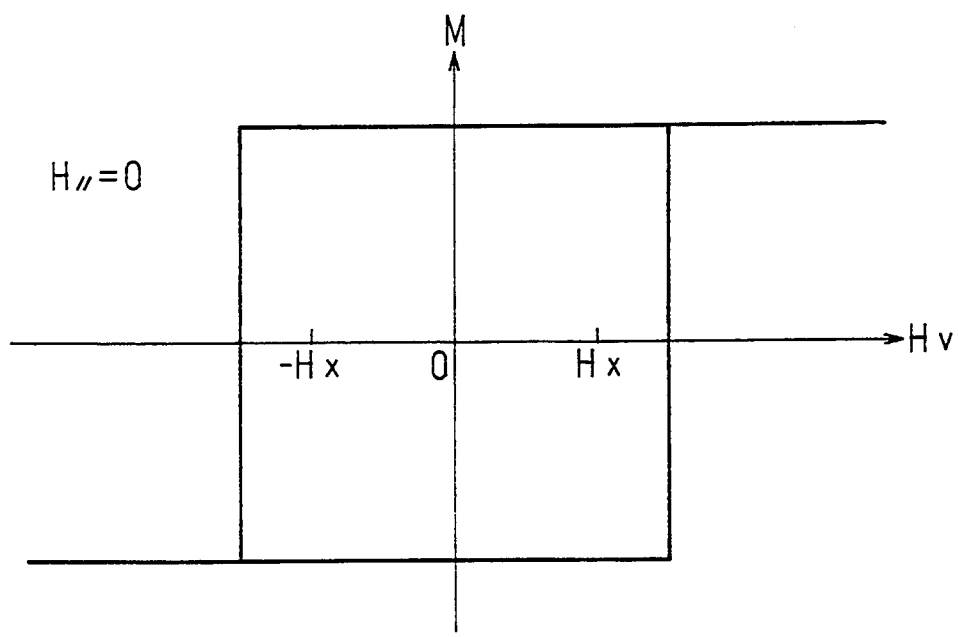
FIGS. 39A and 39B show a hysteresis loop of a perpendicular magnetic field with a parallel magnetic field to the film surface and without the parallel magnetic field in the tenth embodiment.
Figure 39B:
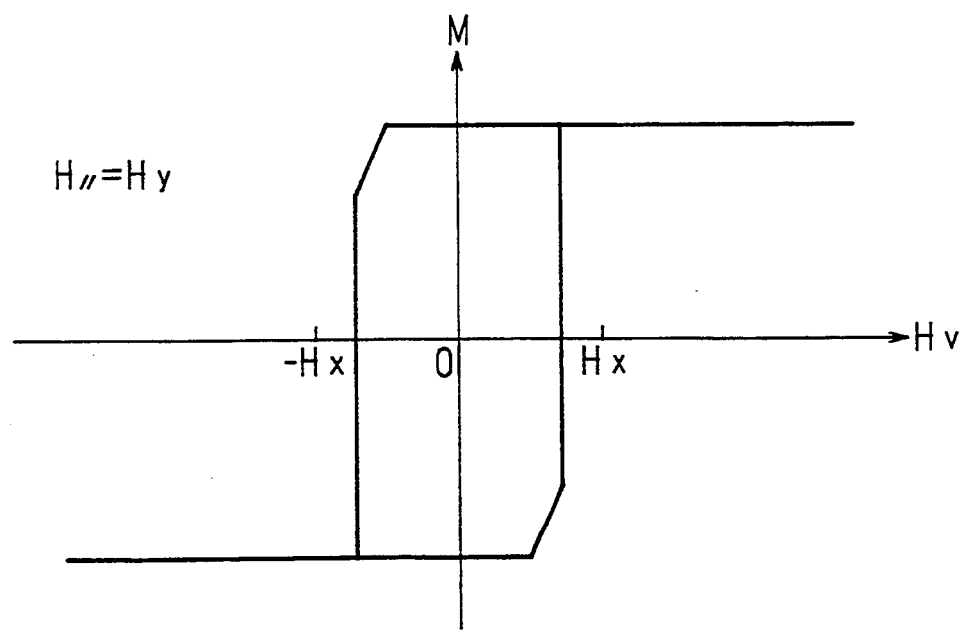

Referring to FIG. 38, the difference from FIG. 29 is that the current iY runs across the memory element 1ac, which causes the magnetic field Hy produced near the memory elements 1ac, 1bc to be parallel to the film surface. That is, both the magnetic field Hx produced by the current iX which is applied perpendicularly to the film surface and the magnetic field Hy produced by the current iY which is applied in parallel to the film surface act on the memory element 1ac. FIGS. 39A, 39B indicate the hysteresis loops of the perpendicular magnetic field Hx with the magnetic field Hy applied in parallel to the film surface or without Hy, respectively. As is clear from the drawings, the magnetization of the memory element is directed in the Hx direction only when both the magnetic fields Hx and Hy work. As a result, although the states of magnetization in the memory elements $1ab$, $1bc$ are not changed, in the memory element $1ac$ is recorded information by upward magnetization. It is to be noted that the switch 7, in place of the switch 6, should be closed to record "1" through the downward magnetization.

Figure 40:
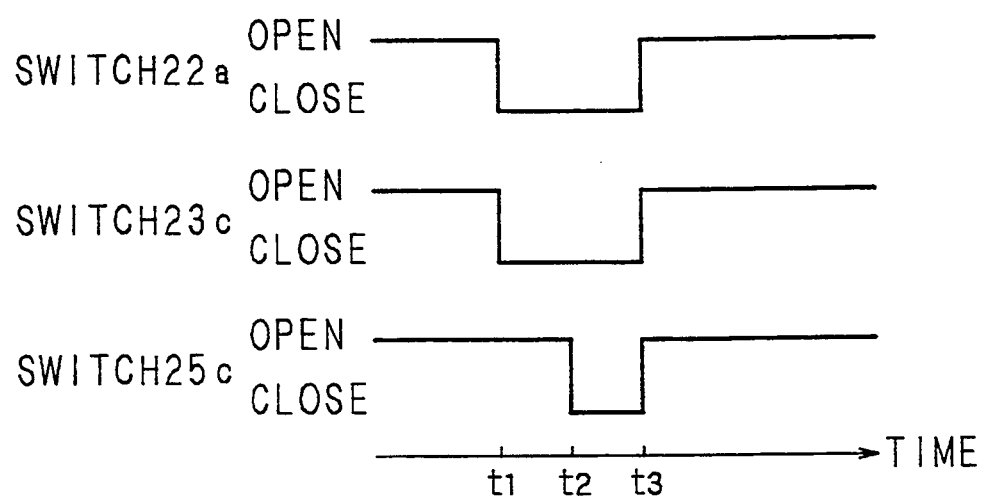
FIG. 40 is a timing chart of switching for reproducing information in the tenth embodiment.

With reference to a timing chart of each switch in recording shown in FIG. 40 reproduction of information will be explained. All the switches not indicated in FIG. 40 are all open. During a period from t1 to t3, the switches $2a$, $3c$ are closed, so that the memory element $1ac$ is held in the state to be reproduced. Moreover, during a period from t2 to t3, the switch $25c$ is closed, and the magnetic field Hy parallel to the film surface is applied to the memory element $1ac$. Accordingly, the magnetization in the perpendicular direction is slightly inclined to the horizontal direction. If the direction of magnetization recorded in the memory element $1ac$ is upward, the output signal according to the Hall voltage is detected to be decreased. If the magnetization is directed downward, the output signal of the Hall voltage is detected to be increased. As described hereinbefore, information can be reproduced without influences of offsets by increasing/decreasing based on the Hall voltage output signal.

Embodiment 11

In Embodiment 11, an RE rich GdFe film, i.e., $Gd_{25}Fe_{75}$ is used as the memory elements $1aa$–$1cc$ of FIG. 28. The coercive force of this film Hc is 25 Oe, and the saturation field Hs is 30 Oe. In order to record information only to the memory element $1ac$, the switches $24a$, $25c$, 6 are closed, thereby generating various magnetic fields Hx from the recording lines. When $15\ Oe \leq Hx < 25$ Oe, it is possible to solely record information to the memory element $1ac$. Although it is possible to record information even when $Hx < 15$ Oe, the reproducing output immediately decreases eventually to be 0 when $Hx \leq 12$ Oe. If $Hx > 25$ Oe, not only to the memory element $1ac$, but also to the elements $1aa$, $1ab$, $1bc$, $1cc$ information is recorded. Therefore, sufficient reproduced output is achieved in a small recording magnetic field where $15\ Oe \leq Hx < 25$ Oe without destroying recorded information except in the memory element $1ac$.

Comparative Example 1

An RE rich GdFe film, that is $Gd_{27}Fe_{73}$ is used as the memory elements $1aa$–$1cc$ of FIG. 28. the coercive force Hc is 10 Oe, with the saturation field Hs of 50 Oe. In order to record information only to the memory element $1ac$, switches 6, $24a$, $25c$ are closed and various magnetic fields Hx are generated from the recording lines. When $Hx \geq 10$ Oe, memory elements $1aa$, $1ab$, $1bc$, $1cc$ are also recorded in addition to the memory element $1ac$. If $Hx \geq 5$ Oe, even the memory element $1ac$ cannot be recorded. In the case where $Hx = 9$ Oe, only the memory element $1ac$ is recorded, but the reproducing output is 1/10 the output obtained by Embodiment 9 where $15\ Oe \leq Hx < 25$ Oe. The reproducing output further decreases if $Hx < 9$ Oe and becomes 0 when $Hx \leq 5$ Oe. Therefore, Comparative example 1 is unable to obtain sufficient reproducing output.

Comparative Example 2

An Re rich GdFe film, specifically, $Gd_{22}Fe_{78}$ is used as the memory elements $1aa$–$1cc$ of FIG. 28. The film has the coercive force Hc is 200 Oe, and the saturation field Hs is 200 Oe. In order to record information only to the memory element $1ac$, the switches $24a$, $25c$, 6 are closed so that various magnetic fields Hx are generated from the recording lines. Only the memory element $1ac$ can be recorded in such a wide area as $100\ Oe \leq Hx < 200$ Oe. As compared with Embodiment 11, however, five times V2 is required, thereby increasing the power consumption.

Embodiment 12

A TM rich GdFe film, i.e., $Gd_{17}Fe_{83}$ is utilized for the memory elements $1aa$–$1cc$ in FIG. 28, which has the coercive force Hc of 28 Oe and saturation field Hs of 34 Oe. In order to record information only to the memory element $1ac$, the switches $24a$, $25c$, 6 are closed to generate various magnetic fields Hx from the recording lines. When $17\ Oe \leq Hx < 28$ Oe, only the memory element $1ac$ is recorded. The memory element $1ac$ can be recorded even when $Hx < 17$ Oe, but, the reproduced output suddenly decreases and eventually to 0 when $Hx \leq 14$ Oe. When $Hx > 28$ Oe, besides the memory element $1ac$, the memory elements $1aa$, $1ab$, $1bc$, $1cc$ are also recorded. Therefore, it is possible to record with sufficient reproduced output without destroying information in the memory elements other than in the memory element $1ac$ when $17\ Oe \leq Hx < 28$ Oe.

Embodiment 13

Figure 41:
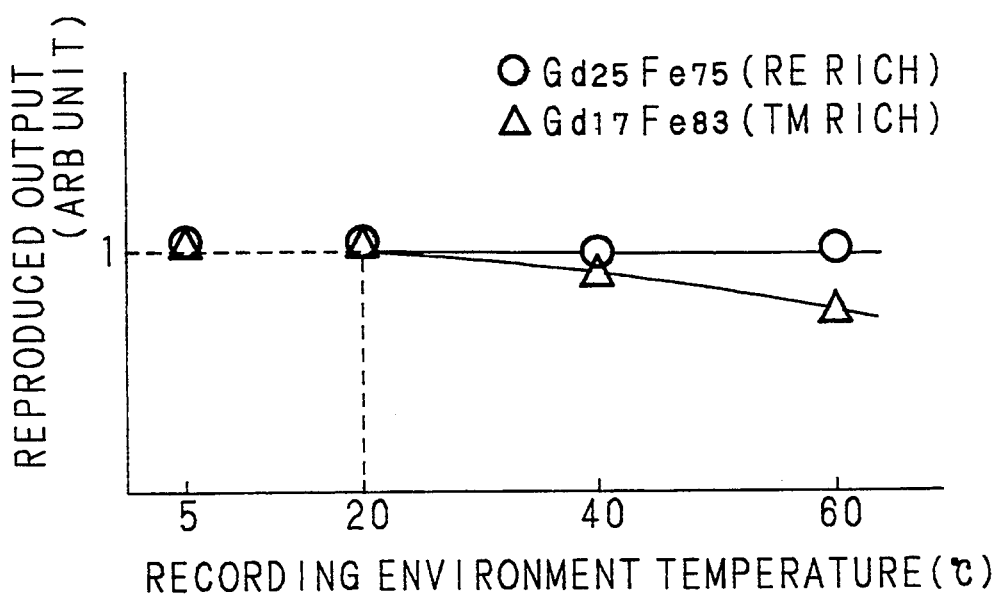
FIG. 41 is a diagram showing the relation between the environment temperature and reproduced output in the tenth embodiment.

A magnetic thin film used in Embodiments 11, 12 is employed as the memory elements $1aa$–$1cc$ of FIG. 28 according to this Embodiment 13. The recording field Hx is set to be 23 Oe, and the temperature of recording and reproducing is changed. The relation between the reproduced output and temperatures in this case is indicated in FIG. 41. The reproduced output is not changed at 5°–60° C. when the RE rich $Gd_{25}Fe_{75}$ film of Embodiment 11 is used. This means that recording is carried out while the magnetization is saturated in the above temperature range. On the other hand, the reproduced output proportionally decreases as the temperature rises to 40° C. and to 60° C. when the TM rich $Gd_{17}Fe_{83}$ film of Embodiment 12 is used. In other words, the relation $Hs < 2Hx$ cannot be satisfied above around 40° C., whereby recording is made while the magnetization is not saturated. Therefore, the RE rich film represents a smaller change of the saturation field Hs with respect to the temperature change than the TM rich film, thus ensuring stable recording.

Embodiment 14

For the memory elements $1aa$–$1cc$ of FIG. 28, an RE rich TbHoCo film, more specifically, $(Tb_Y Ho_{1-Y})_X Co_{1-X}$ wherein $X = 26\%$ and $Y = 30\%$ is used in Embodiment 14. This film has the coercive force Hc of 30 Oe and saturation field Hs of 38 Oe. In order to record only to the memory element $1ac$, the switches $24a$, $25c$, 6 are closed and various magnetic fields Hx are generated from the recording lines. When $19\ Oe \leq Hx < 30$ Oe, information is recorded only to the memory element $1ac$. Even when $Hx < 19$ Oe, it is possible to record information to the memory element $1ac$. However, the reproduced output immediately decreases and eventually to 0 when $Hx \leq 15$ Oe. When $Hx \geq 30$ Oe, not only the memory element 1ac, but the memory elements 1aa, 1ab, 1cc are recorded. Therefore, if 19 Oe≦Hx,28 Oe is satisfied, it is possible to record information and obtain sufficient reproduced output without destroying information in the other elements than the memory element 1ac.

Now, a magnetic thin film memory device of this invention which makes use of the magnetoresistance effect will be described in conjunction with preferred embodiments thereof.

Embodiment 15

Figure 42:
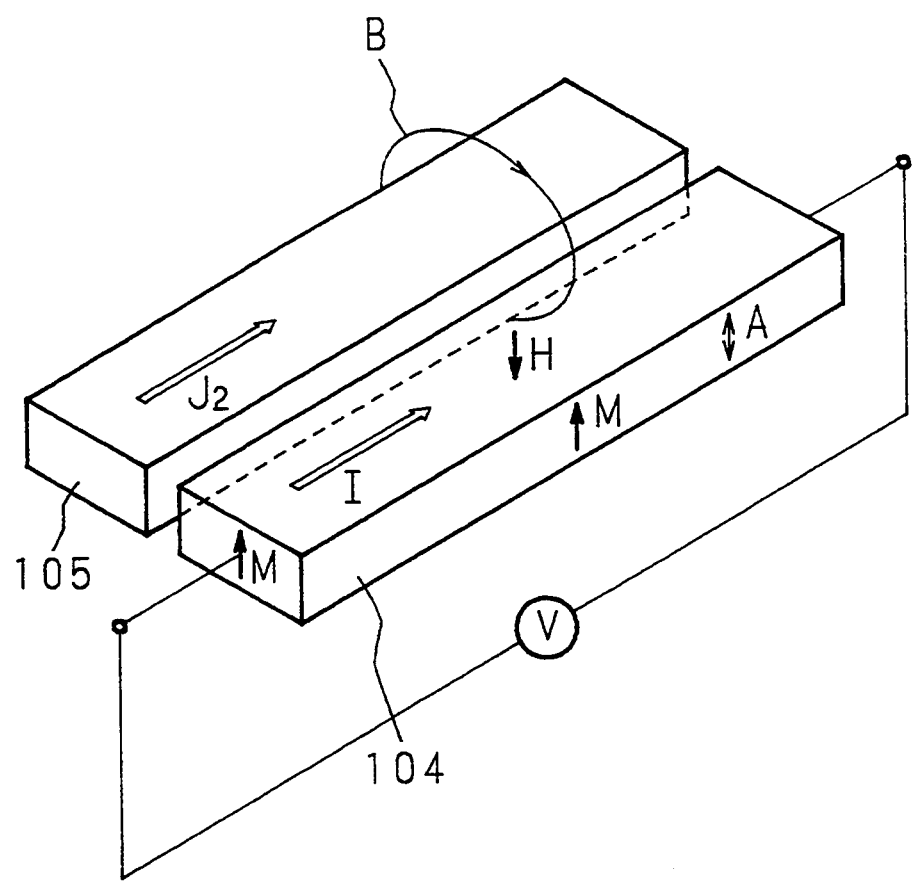
FIGS. 42 and 43A–43D are conceptual diagrams of the magnetizing and reproducing state in a 15th embodiment of this invention.
Figure 43A:
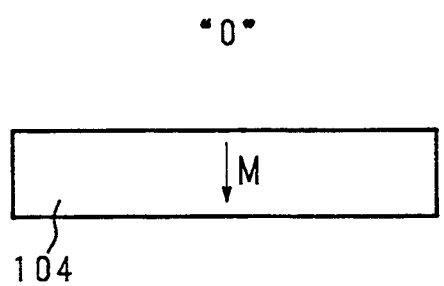
Figure 43B:
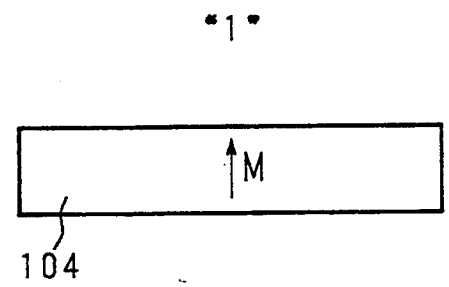
Figure 43C:
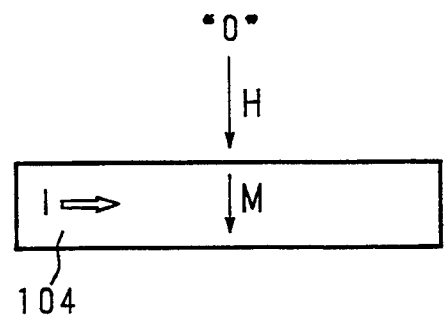
Figure 43D:
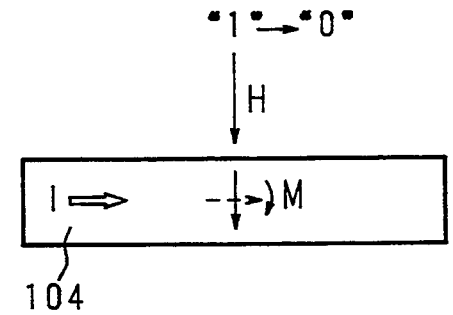

Referring to FIG. 42, from a signal line 105 is impressed an external magnetic field H in a perpendicular direction to the film surface of a magnetic film 104 having perpendicular magnetic anisotropy. The direction of a magnetic field generated by supplying a current J2 is represented by B. Because of the magnetic field in the direction B, a magnetic field H in the magnetic film 104 is directed to a direction perpendicular to the film surface. A constant current I is fed to the magnetic film 104 from outside. The angle of the magnetization M of the magnetic film 104 to the direction of the current I is 90°.

It is more advantageous to use ferromagnetic substance as the magnetic film 104 with perpendicular magnetic anisotropy than ferromagnetic substance in terms of the detection sensitivity of the magnetic field since the demagnetizing field generated in the film of the ferromagnetic substance is smaller. In addition, the ferromagnetic substance provides the film of smaller coercive force. A rare earth-transition metal alloy is useful as the ferromagnetic substance, specifically, such rare earth metal as Gd, Ho, etc. and such transition metal as Ni, Fe, Co, etc. may be employed.

FIG. 43 is a cross sectional view explanatory of the state of Embodiment 15 where the magnetoresistance effect appears because of the relation between the direction of magnetization M of the magnetic film 104 and the external magnetic field H by the signal line 105. FIGS. 43A, 43B, represent the state without the current J2 and the external magnetic field H, where the upward magnetization M represents information "1", meanwhile the downward magnetization M represents information "0". As shown in FIGS. 43C, 43D, when the external magnetic field H is applied perpendicular to the surface of the magnetic film 104 by supplying the current J2 to the signal line 105, the resistance of the magnetic film 104 does not change, if the magnetization M is in the same direction as the external magnetic field H as in FIG. 43C,. Meanwhile, if the direction of the magnetization M is opposite to that of the external magnetic field H as shown in FIG. 43D, the magnetization M is reversed when the external magnetic field H becomes stronger than the coercive force Hc of the magnetic film 104. The angle of the magnetization M to the direction of the current I is other than 90° during the reversal of magnetization M, so that resistance of the magnetic film 104 is increased like pulses. Since the direction of magnetization M is detected from whether the voltage V at both ends of the magnetic film 104 changes or not, it is possible to read out information "0" or "1".

In the above-described case, since the direction of magnetization M of the magnetic film 104 after reading is turned to be that of the external magnetic field H, rewriting is required in the case where the magnetization M is reversed.

Embodiment 16

Figure 44:
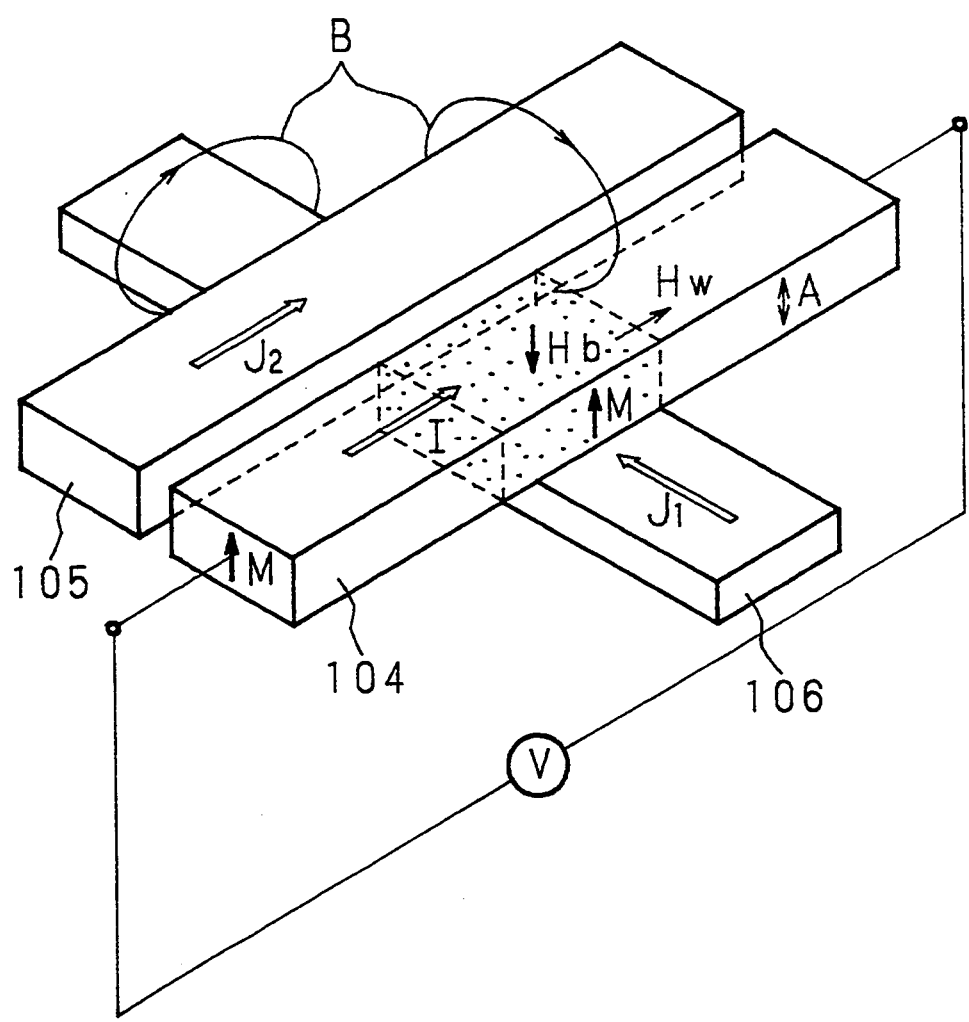
FIGS. 44 and 45A–45D are conceptual diagrams of the magnetizing and reproducing state in a 16th embodiment of this invention.
Figure 45A:
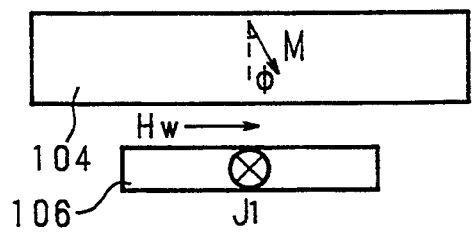
Figure 45B:
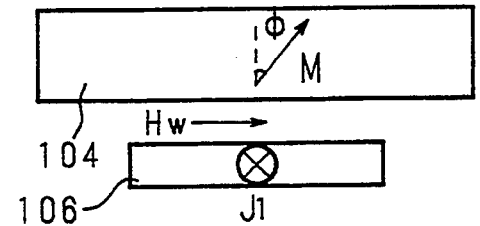
Figure 45C:
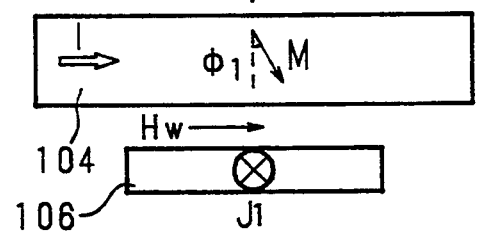
Figure 45D:
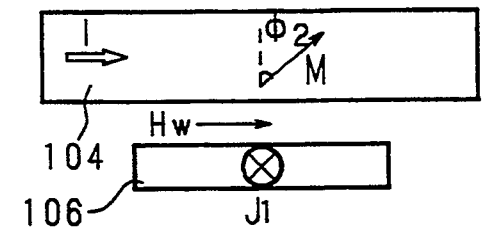

In FIG. 44, a word line 106 is provided below the magnetic film 104 so as to impress a bias magnetic field Hw in a direction parallel to the film surface. The word line 106 is provided orthogonal to the current I running in the magnetic film 104. The magnetization M of the magnetic film 104 is inclined towards the bias magnetic field Hw generated by the current J1 in the word line 106, at an angle Φ to a direction A along the axis of easy magnetization.

FIG. 45 is a cross sectional view of the change of the direction of magnetization M when the bias magnetic field Hw is applied to the magnetic film 104 by the word line 106. FIGS. 45A, 45B show the change when the current J1 is fed to the word line 106, while FIGS. 45C, 45D indicate the direction of magnetization M then a bias magnetic field Hb is additionally applied by the signal line 105. As shown in FIGS. 45A, 45B, the magnetization M is inclined Φ regardless of the magnetization direction M thereof. Furthermore, by supplying the current J2 to the signal line 105 thereby to generate the bias magnetic field Hb perpendicular to the surface of the magnetic film 104, the angle $\theta$ to the direction of the current I becomes larger ($\theta=90°-\Phi1$: $\Phi1$ is smaller), and therefore resistance of the magnetic film 104 is reduced when the magnetization M is downward. On the contrary, when the magnetization M is upward, the angle $\theta$ ($\theta=90°-\Phi2$: $\Phi2$ is larger) becomes smaller, with increasing resistance of the magnetic film 104. Accordingly, by detecting the increase/decrease of resistance as the voltage V at both ends of the magnetic film 104, the direction of magnetization M can be detected, and "0" or "1" data can be read out. In the drawings, the downward magnetization M represents "0", and upward magnetization M "1".

Embodiment 17

Figure 46:
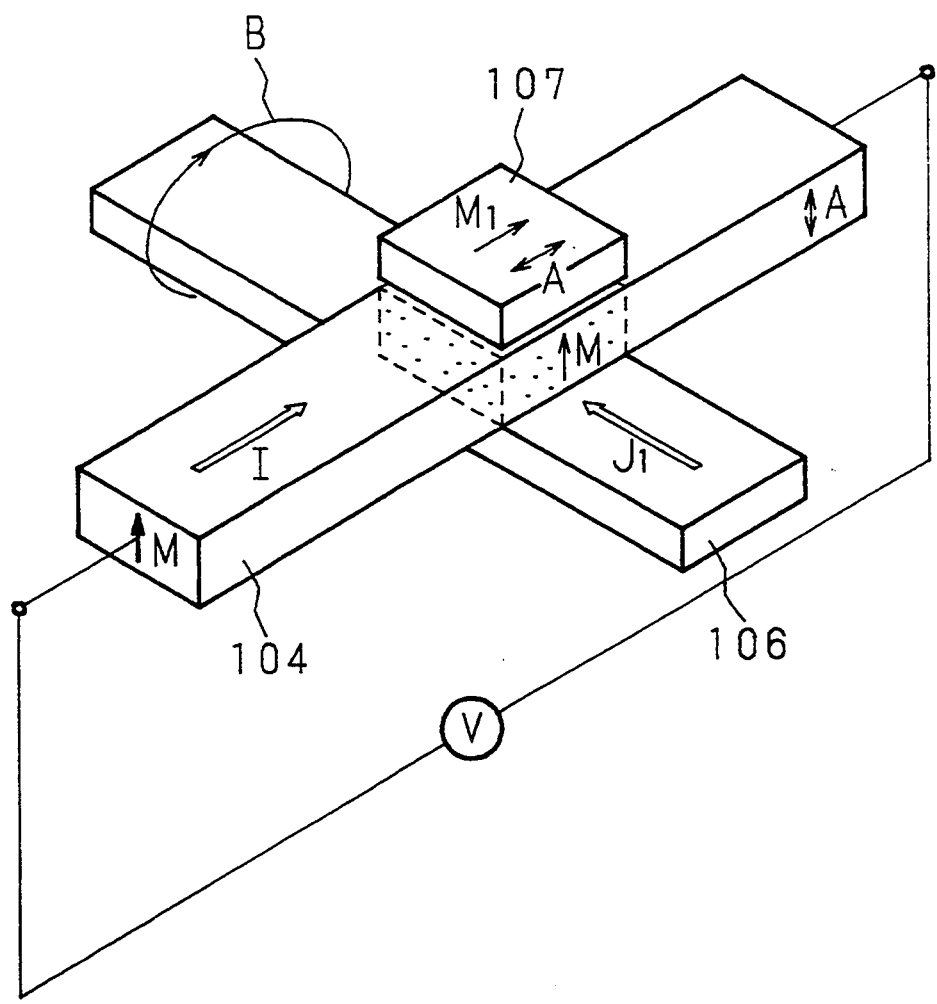
FIGS. 46 and 47A–47D are conceptual diagrams of the magnetizing and reproducing state in a 17th embodiment of this invention.
Figure 47A:
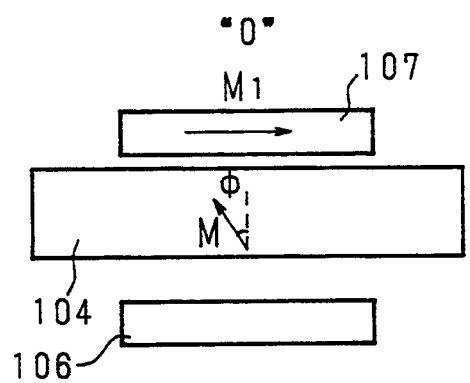
Figure 47B:
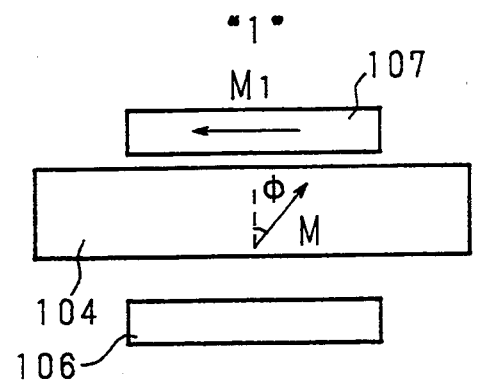

FIG. 46 is a structural diagram when the magnetic film 104 with perpendicular magnetic anisotropy is provided below and adjacent to a recording magnetic film 107. The recording magnetic film 107 for recording information has horizontal magnetic anisotropy, the axis of easy magnetization A of which is parallel to the current I running in the magnetic film 104. The word line 106 is provided orthogonal to the current I. The magnetization M of the magnetic film 104 is directed upward and turned clockwise or counterclockwise by Φ because of the magnetization M₁ of the recording magnetic film 107. The relation between M₁ and M is seen from each cross sectional view of FIGS. 47A, 47B. M₁ directed rightward represents "0", whereas M₁ directed leftward "1".

Figure 47C:
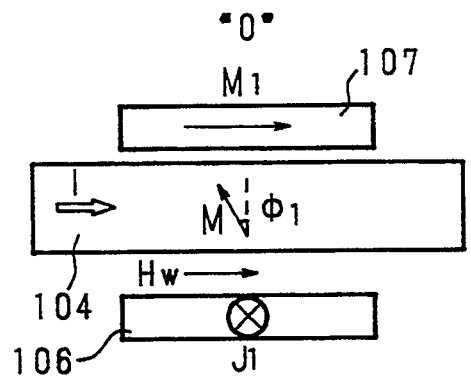
Figure 47D:
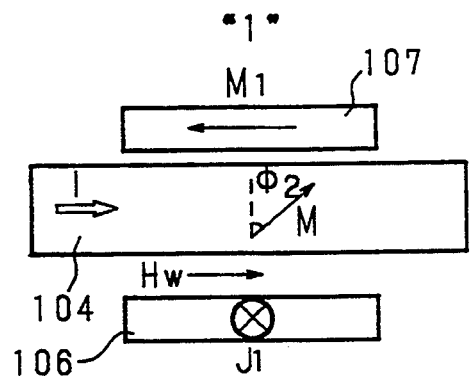

The change of the direction of magnetization M of the magnetic film 104 when a minute current J1 is supplied to the word line 106 is shown in cross sectional views of FIGS. 47C, 47D. When the magnetization M₁ of the recording magnetic film 107b is rightward, the angle $\theta$ of the magnetization M of the film 104 to the direction of the current I is larger ($\theta=90°-\Phi1$: Φ is smaller) because of the rightward bias magnetic field Hw by the current J1, thereby reducing resistance of the magnetic film 104. Meanwhile, when the magnetization M₁ is leftward, the above angle $\theta$ becomes smaller ($\theta=90°-\Phi2$: $\Phi2$ is larger), so that resistance of the magnetic film 104 is increased. Therefore, by detecting the increase/decrease of resistance as the change of the voltage V, it is possible to judge the direction of magnetization $M_1$ of the film 107, whereby "0" or "1" data is read out.

The word line 106 may be used as a recording line to record information to the recording magnetic film 107.

Moreover, in Embodiment 17 above, the magnetization M of the magnetic film 104 is upward, but may be downward. At the same time, although the word line 106 is provided below the magnetic film 107, it may be arranged above the magnetic film 107.

Embodiment 18

Figure 48:
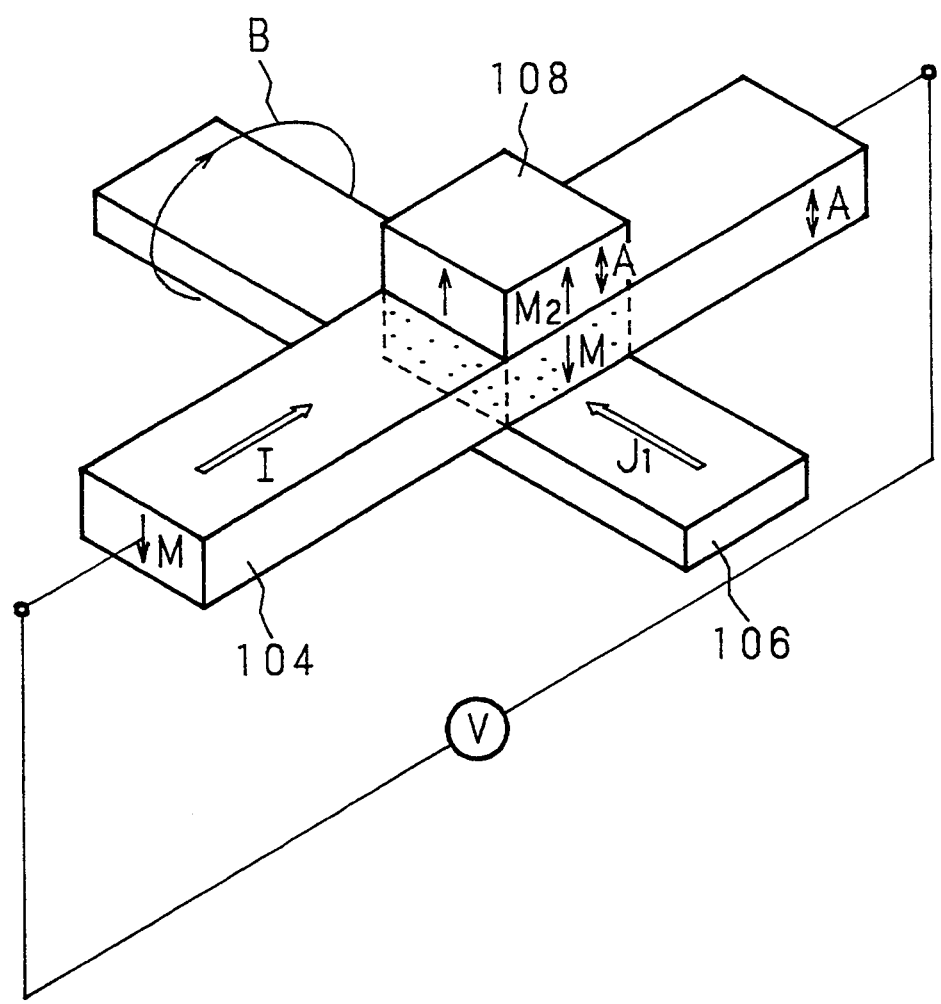
FIGS. 48 and 49A–49D are conceptual diagrams of the magnetizing and reproducing state in an 18th embodiment of this invention.

FIG. 48 is a structural diagram of the other example of the magnetic thin film memory device having the magnetic film 104 with perpendicular magnetic anisotropy provided below a recording magnetic film 108. The magnetic film 108 for recording information has perpendicular magnetic anisotropy. The word line 106 is provided orthogonal to the current I running in the magnetic film 104. The magnetization M of the magnetic film 104 is directed downward.

Figure 49A:
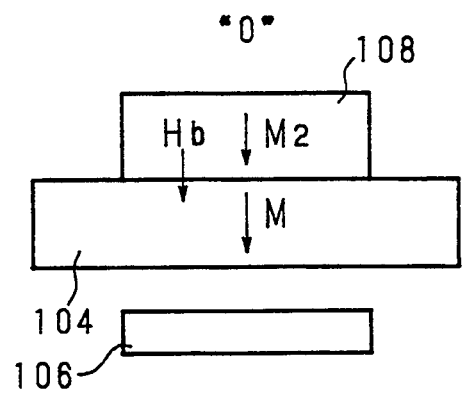
Figure 49B:
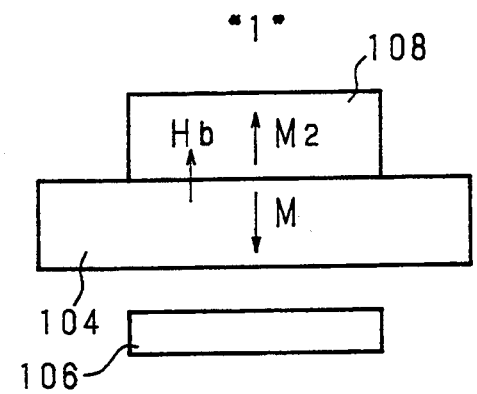

The magnetic field Hb generated from the recording magnetic film 108 is smaller than the coercive force Hc of the magnetic film 104 (Hb<Hc), thereby causing no reversal of the magnetization of the film 104. The relation between the magnetization M of the magnetic film 104 and magnetization $M_2$ of the recording film 108 at this time is indicated in cross sectional views of FIGS. 49A, 49B. In the figure, the downward magnetization $M_2$ represents "0", and the upward magnetization $M_2$ "1".

Figure 49C:
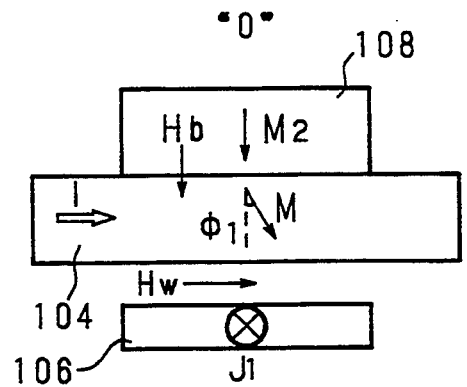
Figure 49D:
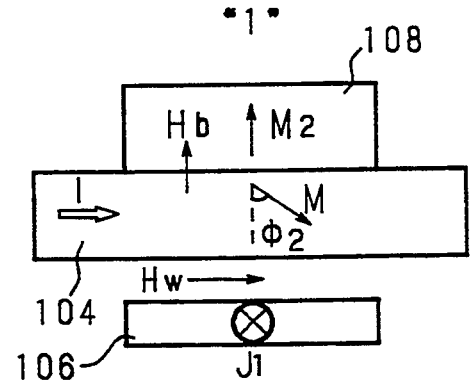

The change of the direction of magnetization M of the magnetic film 104 at the supply of the current J1 to the word line 106 is shown in cross sectional views of FIGS. 49C, 49D. The angle $\theta$ between the magnetization M and current I due to the bias magnetic field Hw generated by the current J1 in the word line 106, is different in accordance with the direction of the magnetization $M_2$ of the recording film 108. In other words, when the magnetization $M_2$ of the magnetic film 108 is downward, the angle $\theta$ of the magnetization M of the film 104 to the current I ($=90° -\Phi1$: $\Phi1$ is smaller) becomes larger, and resistance of the magnetic film 104 is reduced. Meanwhile, when the magnetization $M_2$ of the film 108 is upward, the above angle $\theta$ ($\theta=90° -\Phi2$: $\Phi2$ is larger) becomes smaller, and resistance of the magnetic film is increased. Therefore, the direction of the magnetization $M_2$ of the recording film 108 is judged by comparing the voltage V at both ends of the film 104, whereby "0" or "1" data is read out.

It is to be noted here that the direction of magnetization M of the magnetic film 104 or the position of the word line 106 and recording magnetic film 108 may be reversed as above embodiment.

Embodiment 19

Figure 50:
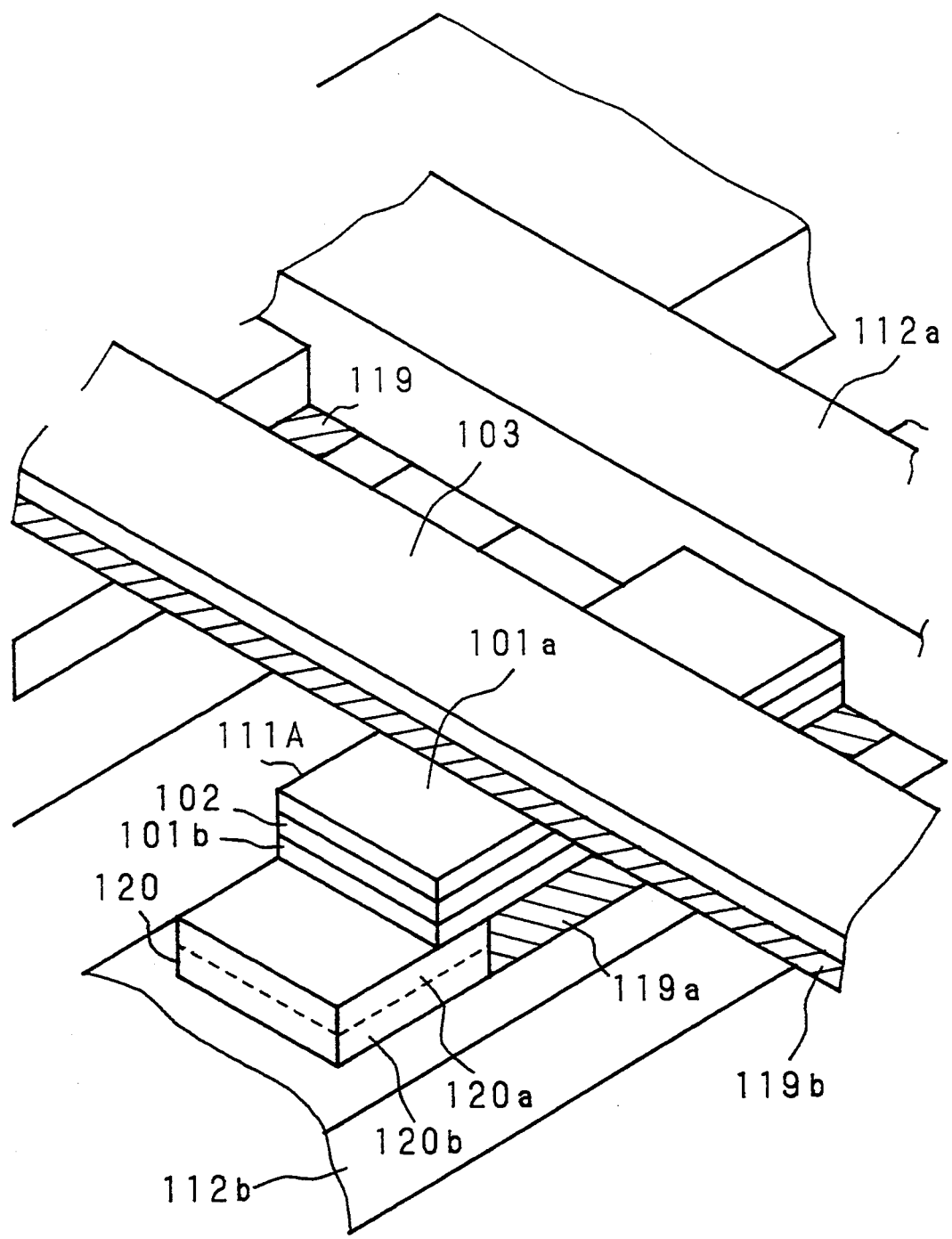
FIGS. 50 and 51 are a perspective view and a circuit diagram of a 19th embodiment of this invention, respectively.

FIG. 50 is a perspective view of a recording unit of the magnetic thin film memory device. In FIG. 50, a semiconductor device, e.g., diode 120 is formed on a part of the sense line 112b (120a is a p-type PN-junction diode and 120b is an n-type PN-junction diode). Further, one end of a magnetic thin film memory element 111A consisting of a magnetic thin film 101b, a metallic thin film 102 and a magnetic thin film 101a is formed in contact with the PN-junction diode 120a while an insulator 119A is intervened between memory element 111A and sense line 112b. The other end of the memory element 111A is connected to another sense line 112a which is electrically insulated from the sense line 112b by the insulator 119a. Moreover, a word line 103 is arranged across the magnetic thin film 101a via the insulator 119b.

Figure 51:
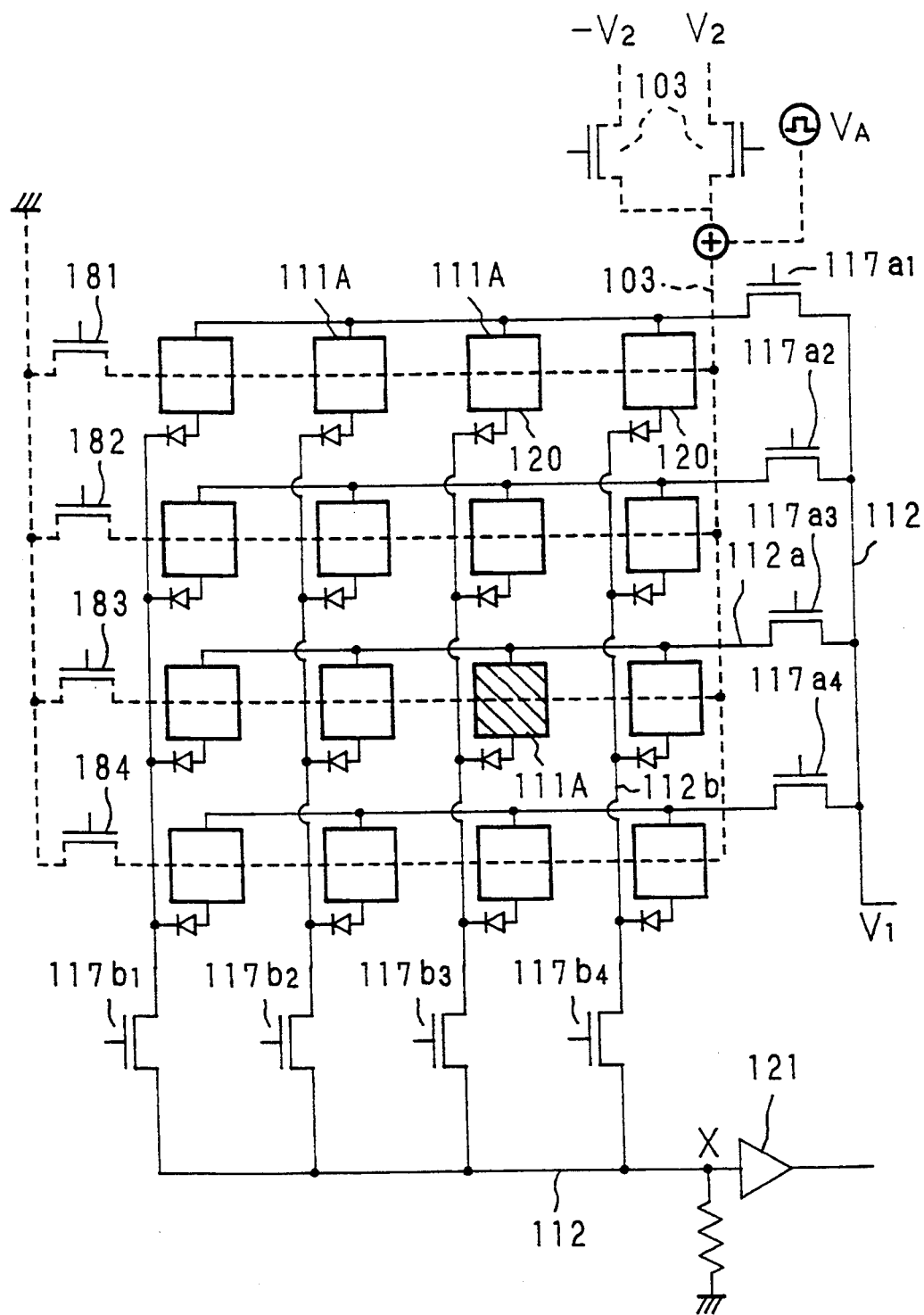

FIG. 51 is a circuit diagram of the magnetic thin film memory device, for example, 4 bits×4 bits, using the magnetic thin film memory element 111A of FIG. 49 for one bit.

Reference numerals in FIG. 51 are respectively: 117a, 117b a switching element to select the sense line 112; 118 a switching element to select the word line 103; and 121 an amplifier of the reproduced output.

Figure 1:
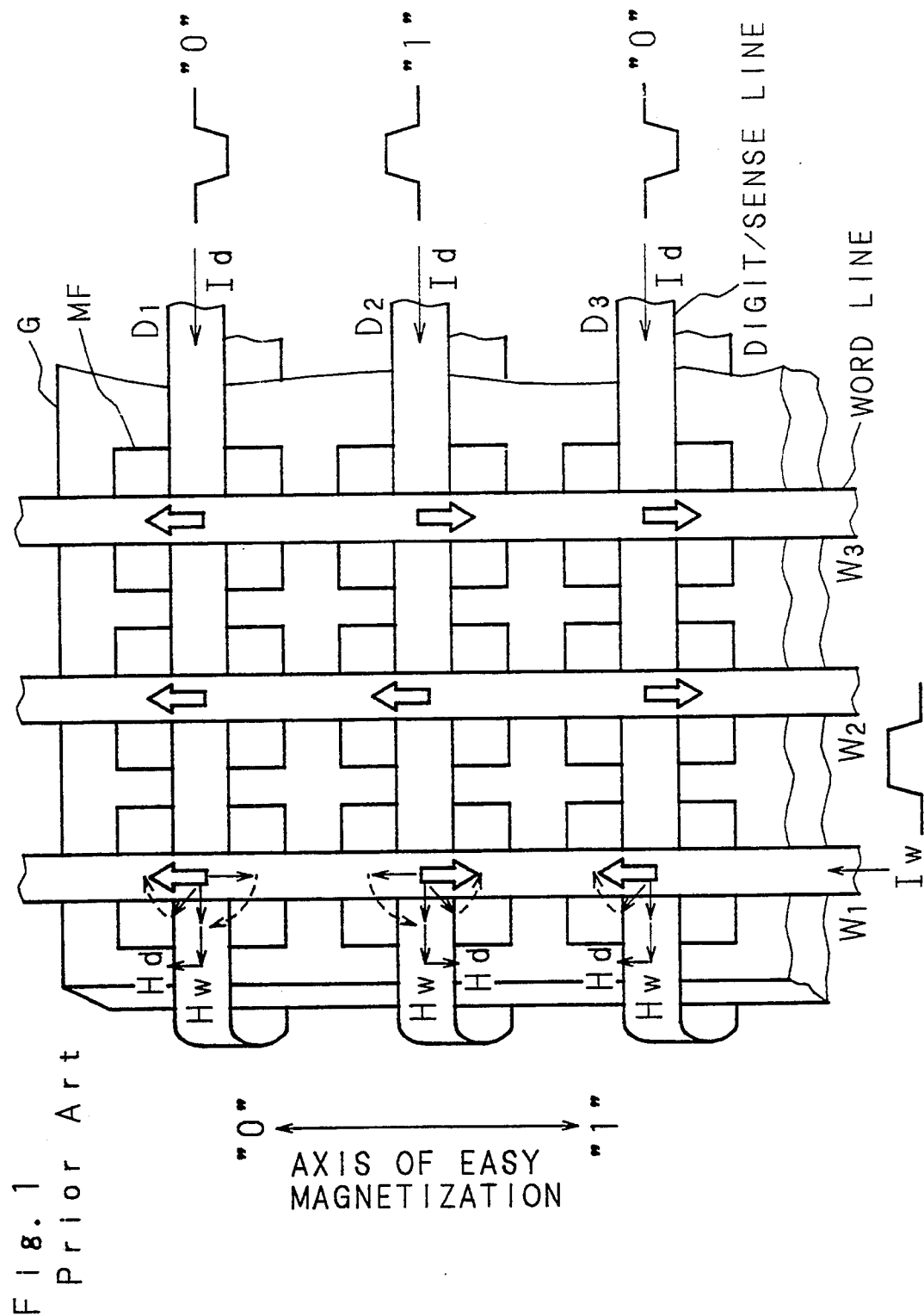
FIG. 1 is a diagrammatic plan view of a conventional magnetic thin film memory device.
Figure 2:
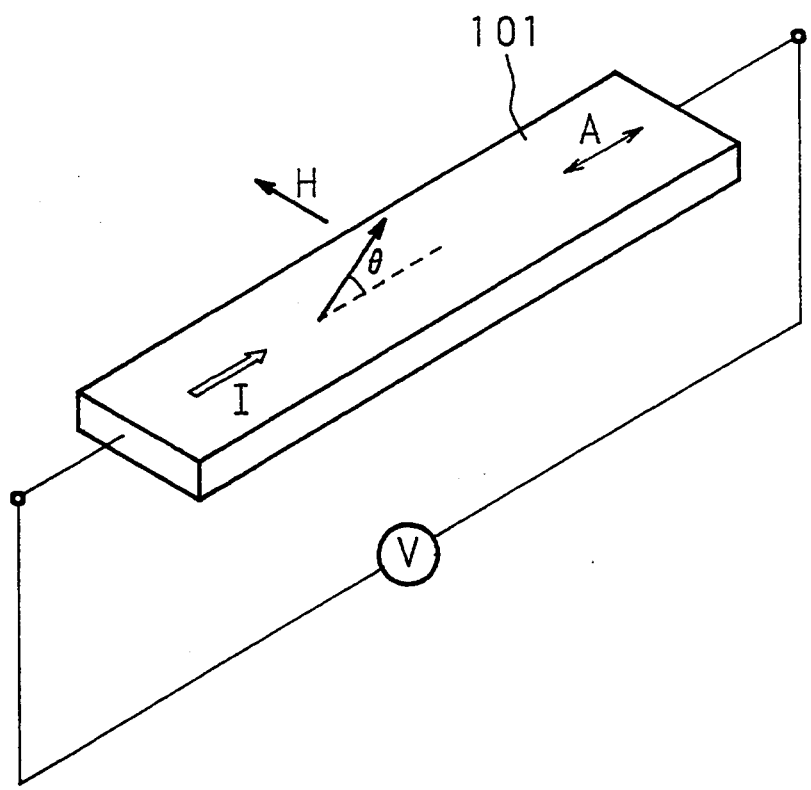
FIG. 2 is a diagram explanatory of the principle of the magnetoresistance effect.
Figure 3:
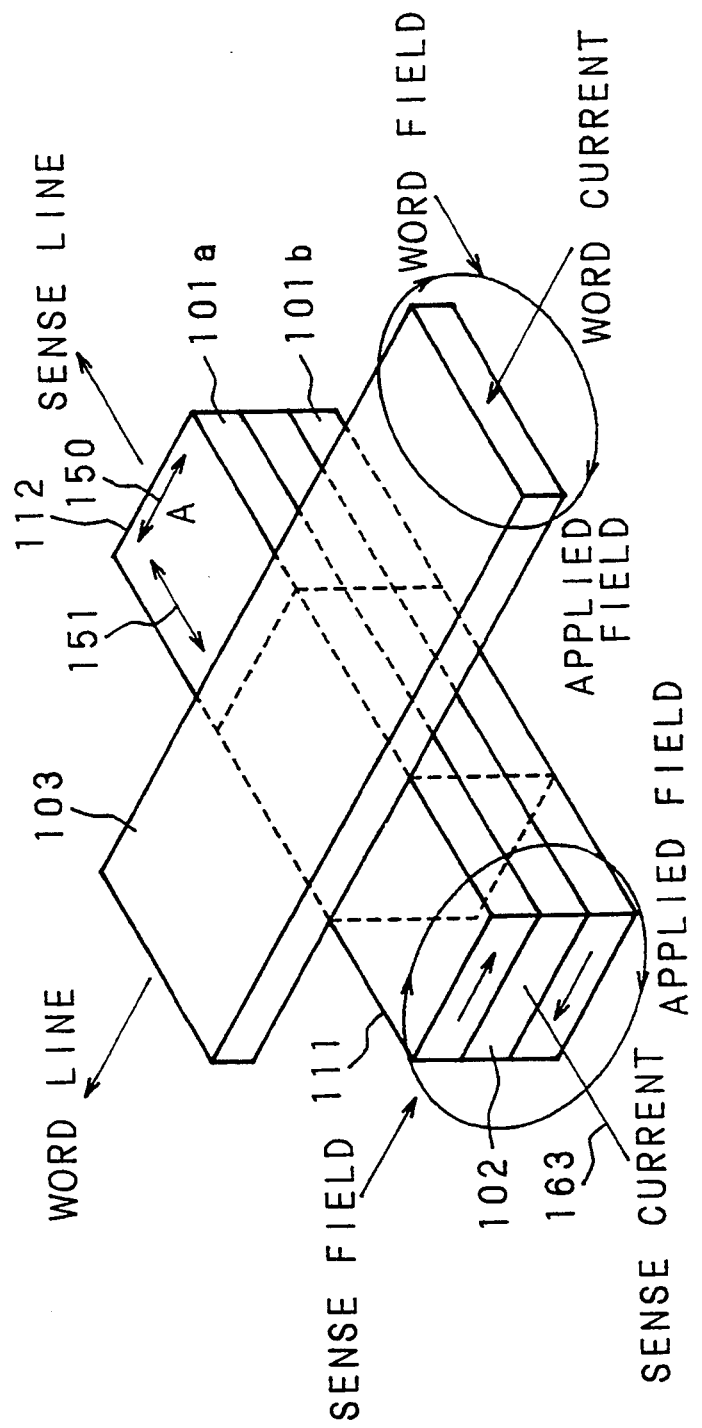
FIG. 3 is a perspective view of a conventional magnetic thin film memory device using a magnetoresistive element.
Figure 4:
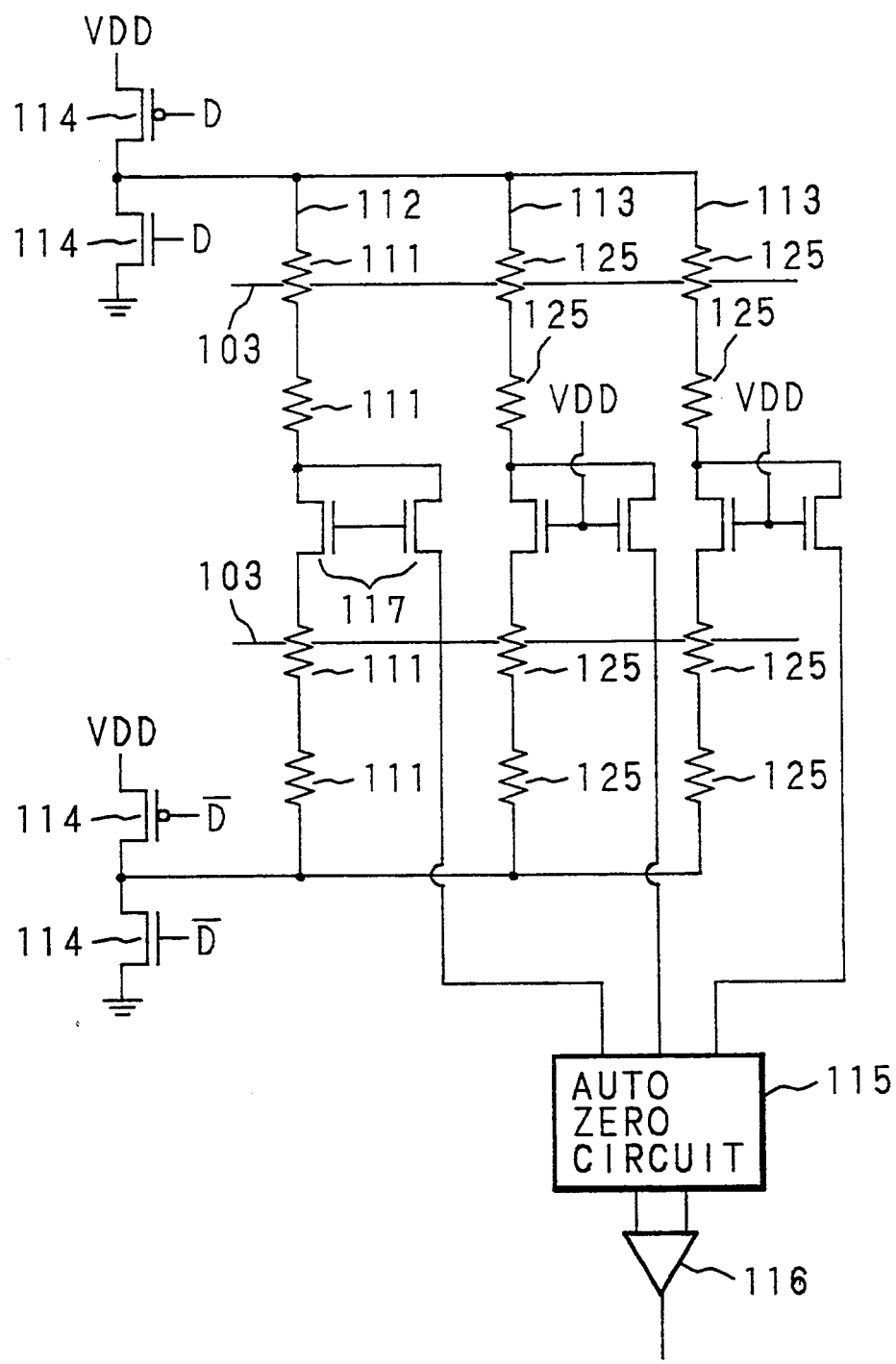
FIG. 4 is a circuit diagram of the conventional magnetic thin film memory device of FIG. 3.
Figure 5:
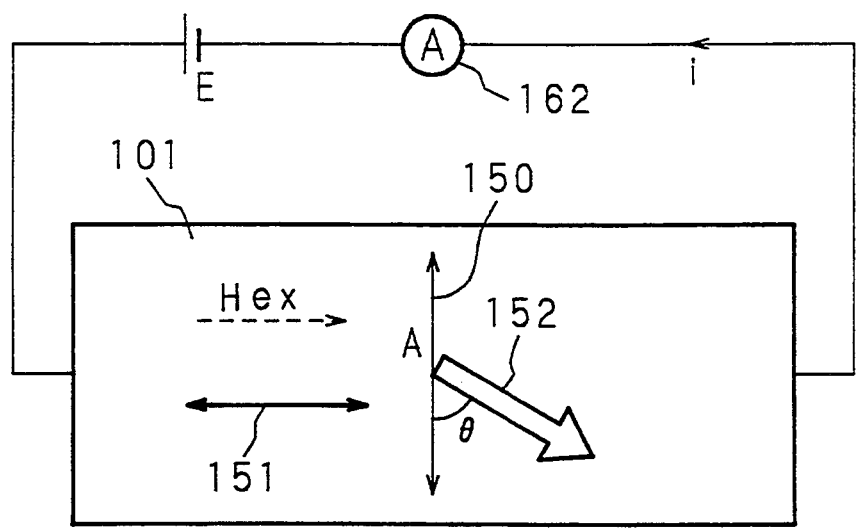
FIGS. 5 and 6 are diagrams of the principle of the magnetoresistance effect.
Figure 6:
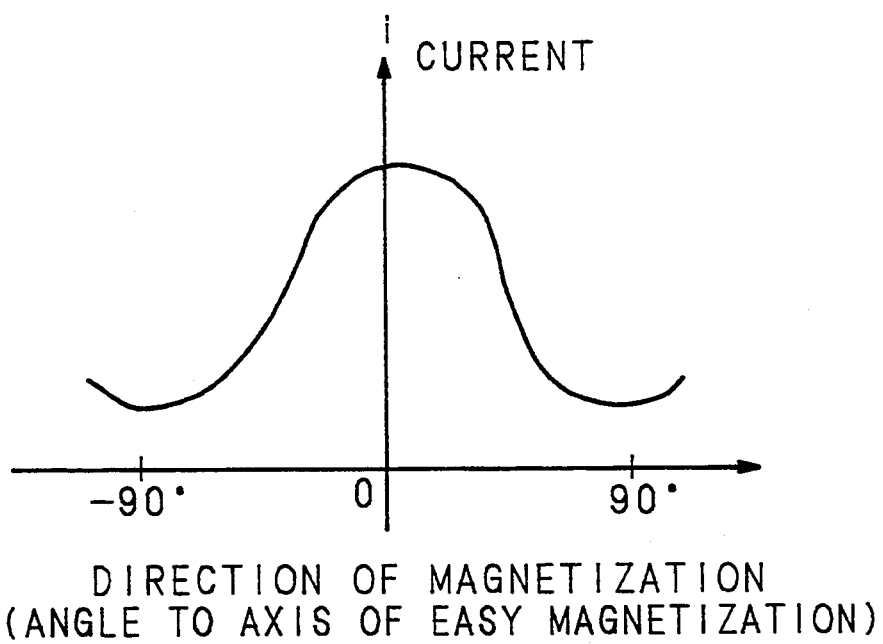
Figure 52:
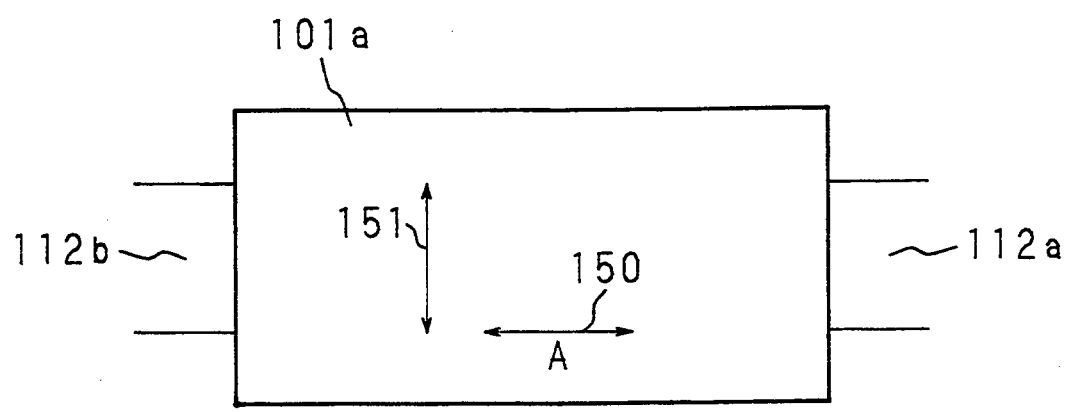
FIGS. 52, 53, 54A and 54B are diagrams explanatory of the principle of reproducing information on the 19th embodiment.

The operation of this magnetic thin film memory device will be explained in the case where information is recorded to the magnetic thin film memory element 111A hatched in FIG. 51. The direction of the axis of easy magnetization 150 of the magnetic thin film 101a is, as shown in FIG. 52, the direction of the axis of hard magnetization in the prior art (referring to FIG. 3).

Figure 53:
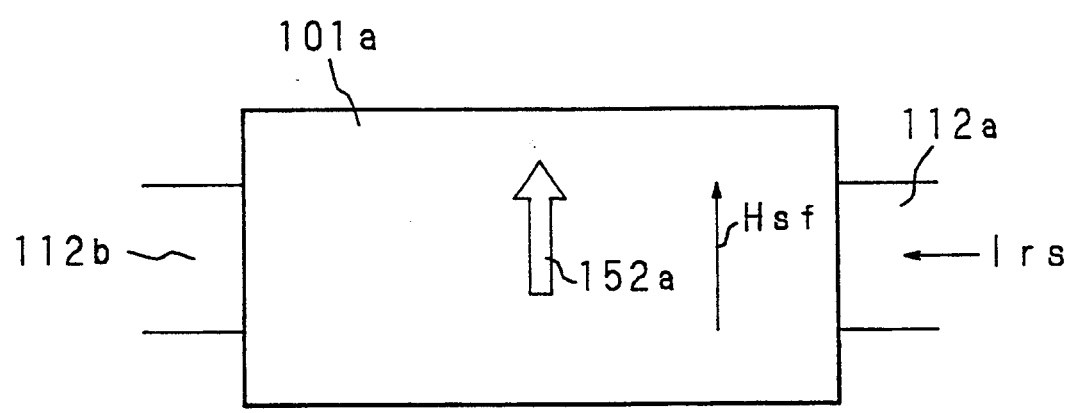
Figure 54A:
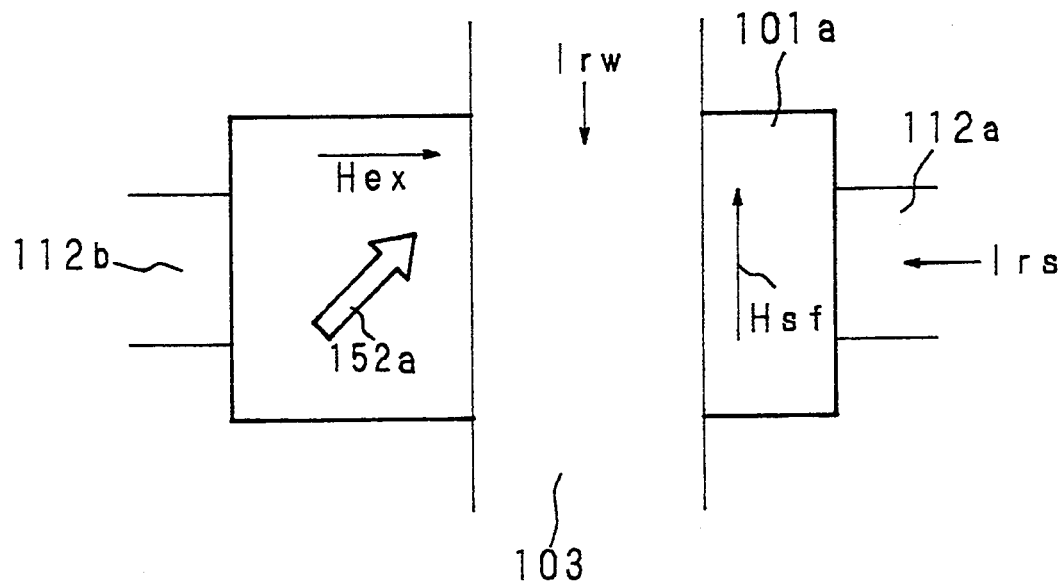
Figure 54B:
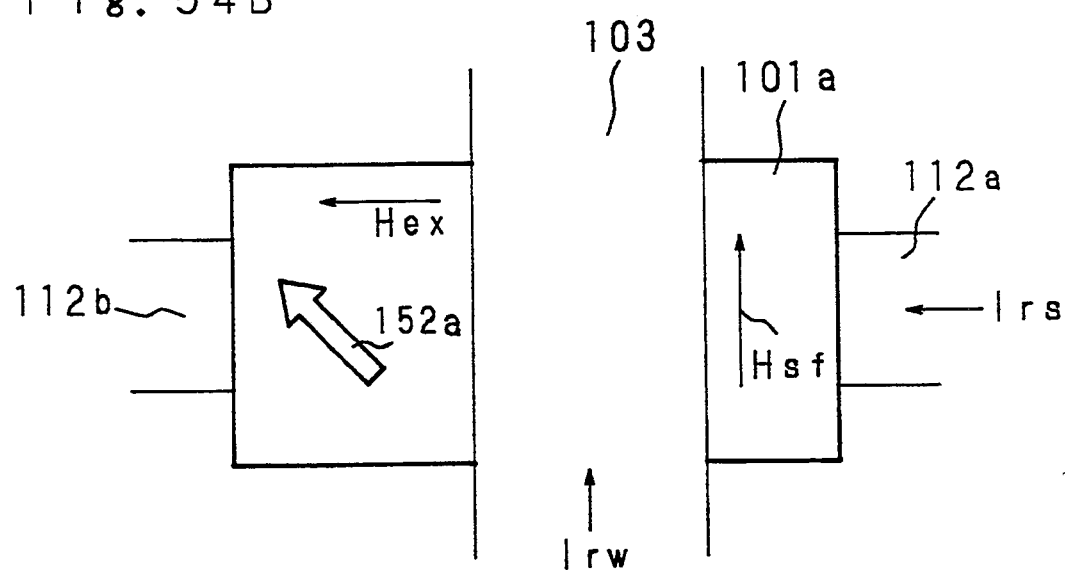
Figure 55A:
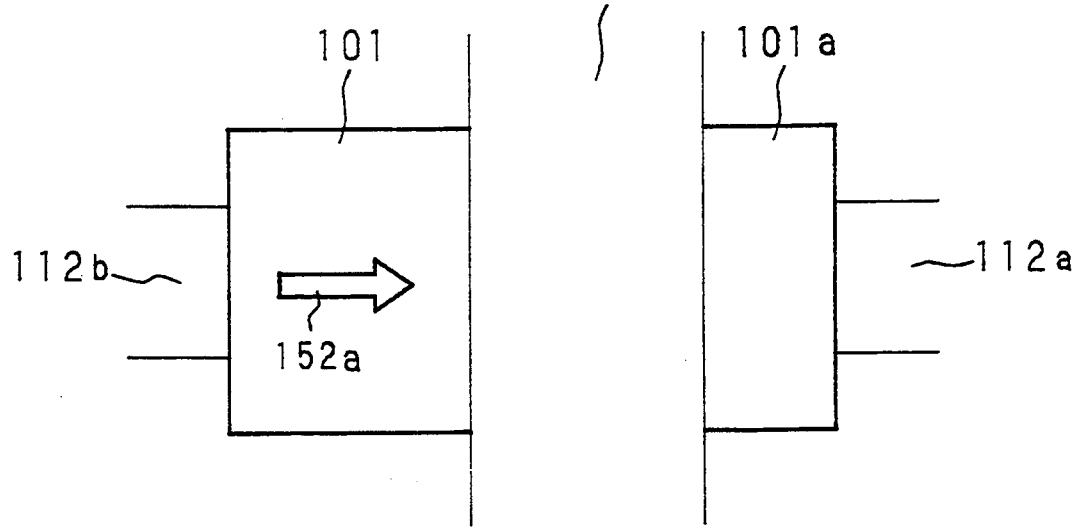
FIGS. 55A, 55B, 56A, 56B, 57A and 57B illustrate states of the thin film memory element.
Figure 55B:
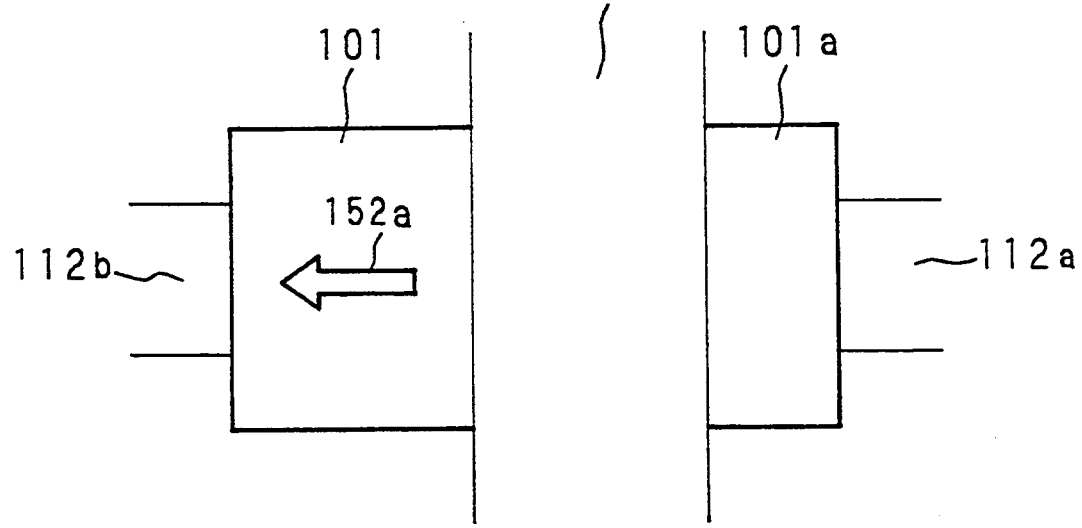

First of all, the switching elements $117a_3$, $117b_3$ are turned on to supply a recording current Irs (FIG. 53) to the sense line 112. The magnetic field Hsf (FIG. 53) generated by the current Irs is approximately parallel to the axis of hard magnetization 151, so that the magnetization 152a is directed to the axis of hard magnetization 151. The state where a sufficient amount of the recording current Irs is fed is illustrated in FIG. 53. Then, a switching element 183 is turned on to determine the direction of the current running in the word line 103 by a switching element 114. Since the magnetic field Hex (FIG. 54) generated by the current flowing in the word line 103 is parallel to the axis of easy magnetization 150, the direction of the magnetization 152a can be determined by the direction of the current Irw in the word line 103, which is shown in FIG. 54. In the last place, the switching elements $117a_3$, $117b_3$, 183 are turned off to remove the applied magnetic field from the magnetic thin film 101a, and the magnetization 152a is turned to either rightward or leftward along the axis of easy magnetization 150 (FIG. 55). FIGS. 55A, 55B are corresponding to FIGS. 54A, 54B, respectively.

Figure 7A:
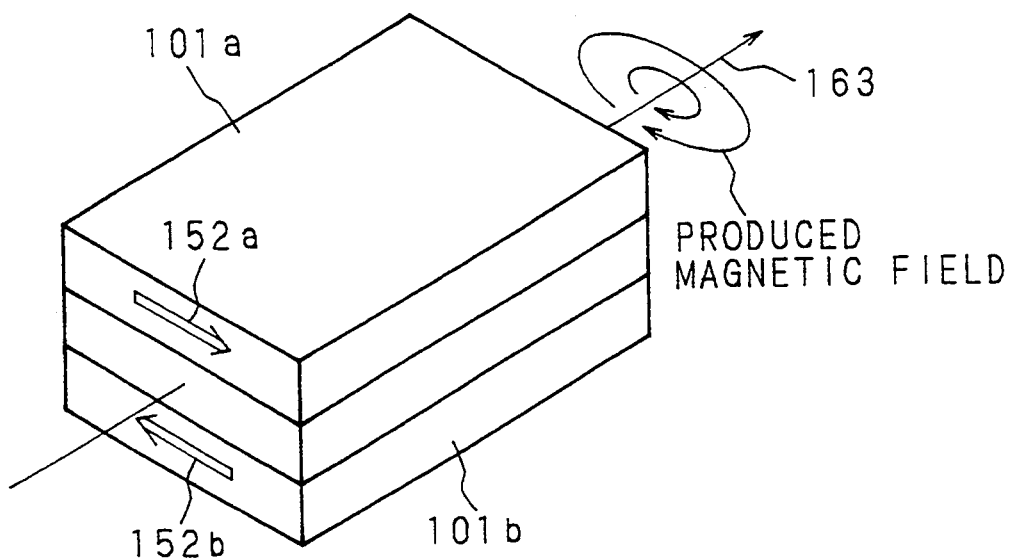
FIGS. 7A and 7B are conceptual diagrams of the recording state of the conventional magnetic thin film memory device.
Figure 7B:
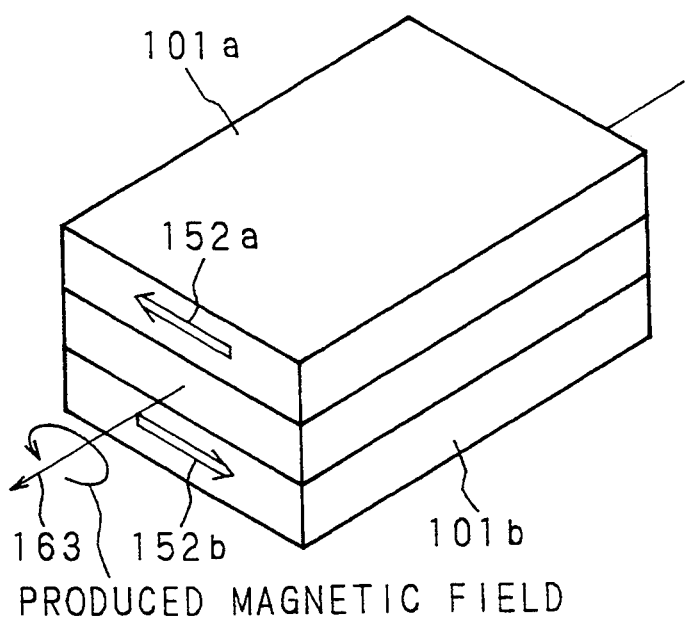
Figure 8A:
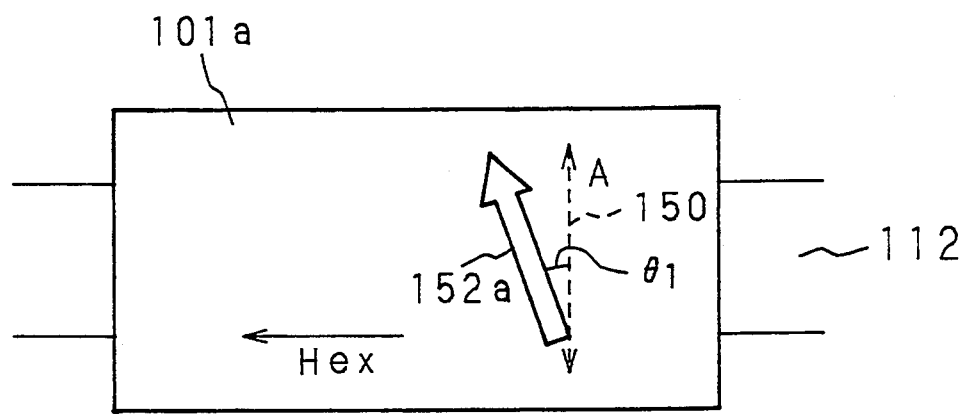
FIGS. 8A, 8B, 9A, and 9B are diagrams of the principle of reproducing information from the conventional magnetic thin film memory device.
Figure 8B:
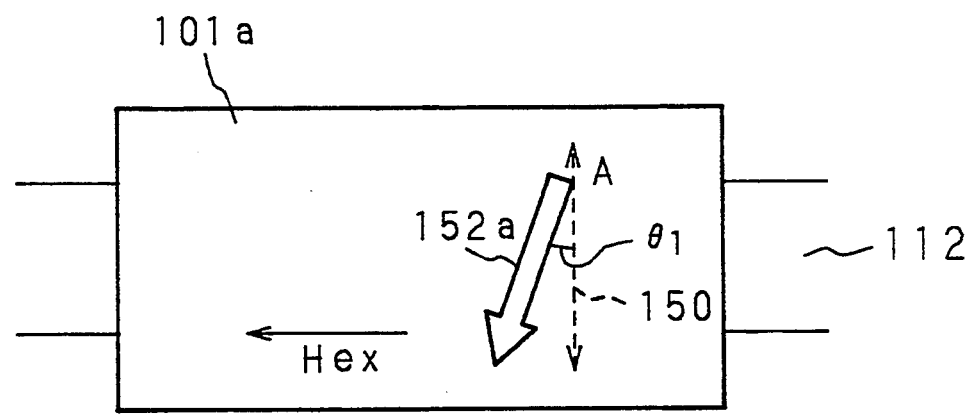
Figure 9A:
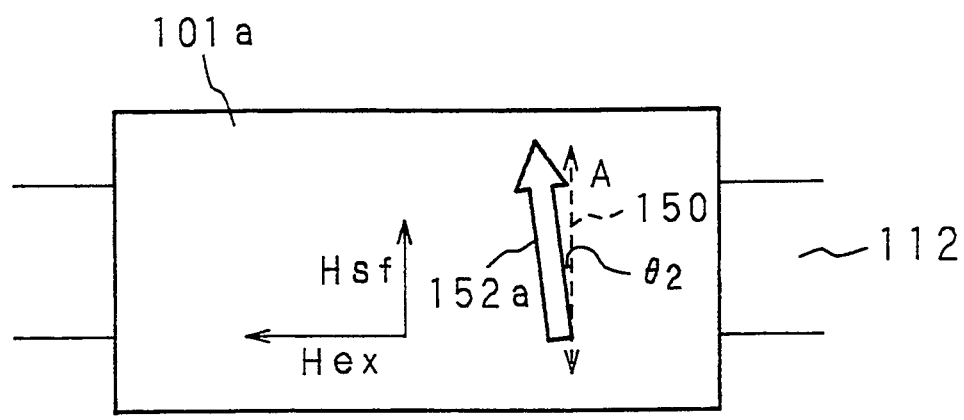
Figure 9B:
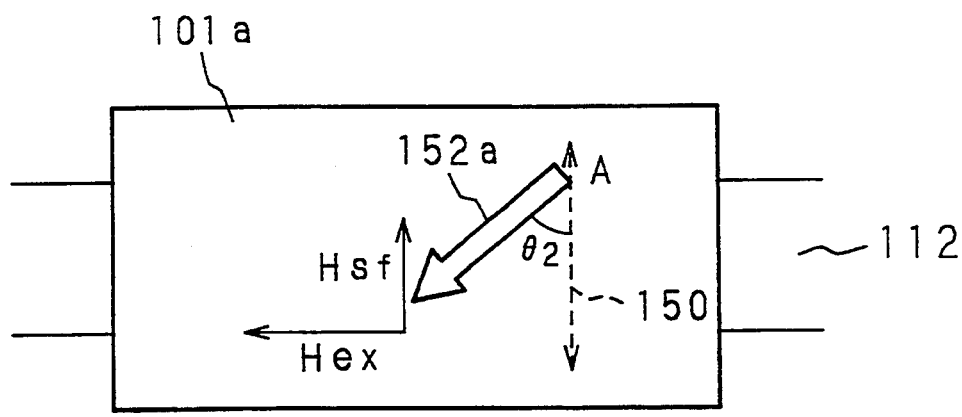
Figure 56A:
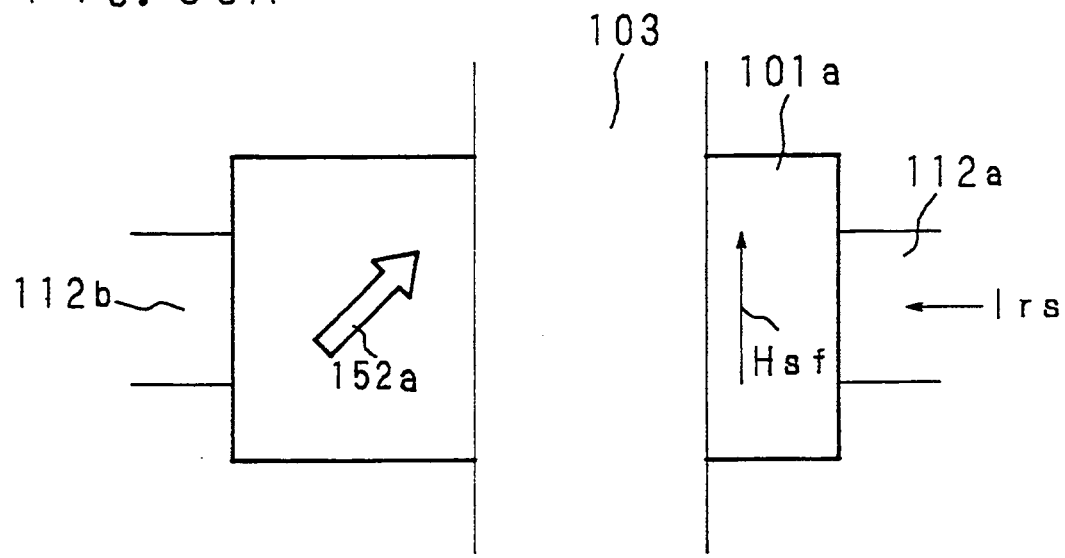
Figure 56B:
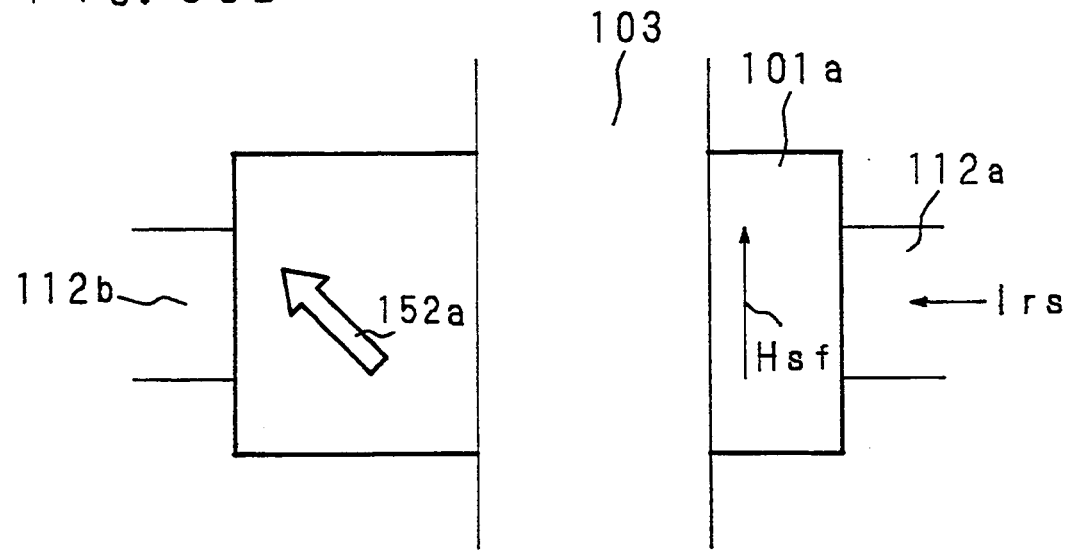
Figure 57A:
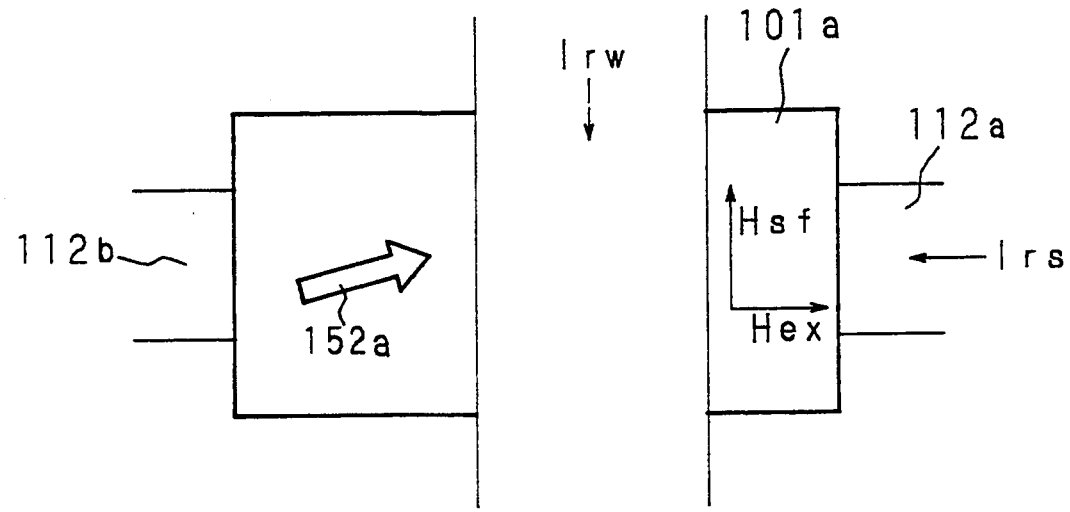
Figure 57B:
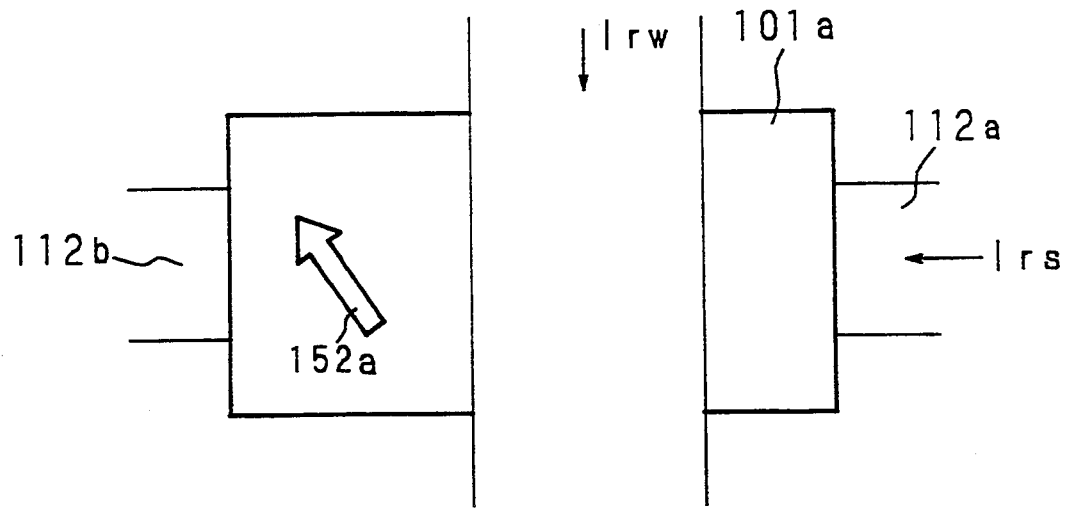

The following description will be related to the case where information is read out from the hatched magnetic thin film memory element 111A of FIG. 51. The state of the magnetic thin film memory element 111A before data is reproduced is shown in FIG. 55A or 55B. For reproducing, the switching elements $117a_3$, $117b_3$ are turned on as in recording, thereby impressing a bias magnetic field to the magnetic thin film 101a. At reproducing, the current Irs supplied to the sense line 112a should be smaller than at recording (FIG. 56). FIGS. 56A, 56B are corresponding to FIGS. 55A, 55B. Subsequently, the switching element 183 is turned on and the current Irw is fed to the word line 103 in one direction, thereby obtaining the magnetization as in FIG. 57. FIGS. 57A, 57B are corresponding to FIGS. 55A, 55B and 56A, 56B. Accordingly, it is apparent that the recorded state can be known from the difference of resistance resulting from the magnetoresistance effect (referring to FIG. 7), because the angle of the magnetization 152a to the direction of the current running in the sense line 112a differs depending on the recorded state.

Figure 58A:
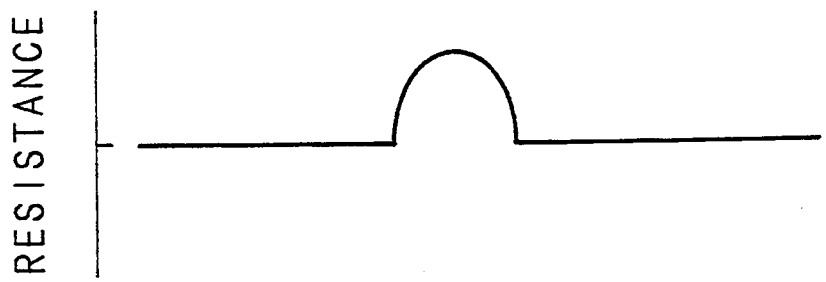
FIGS. 58A–C and 59A–C are waveforms explanatory of the invention.
Figure 58B:
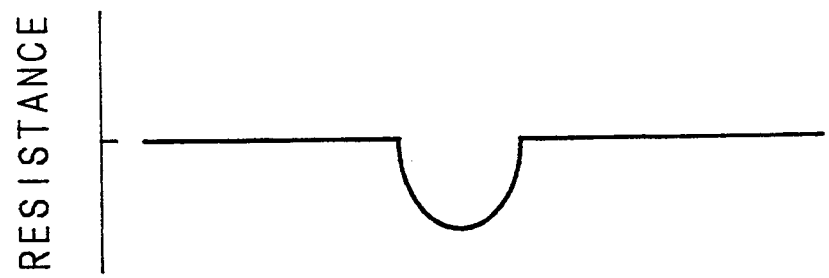
Figure 58C:
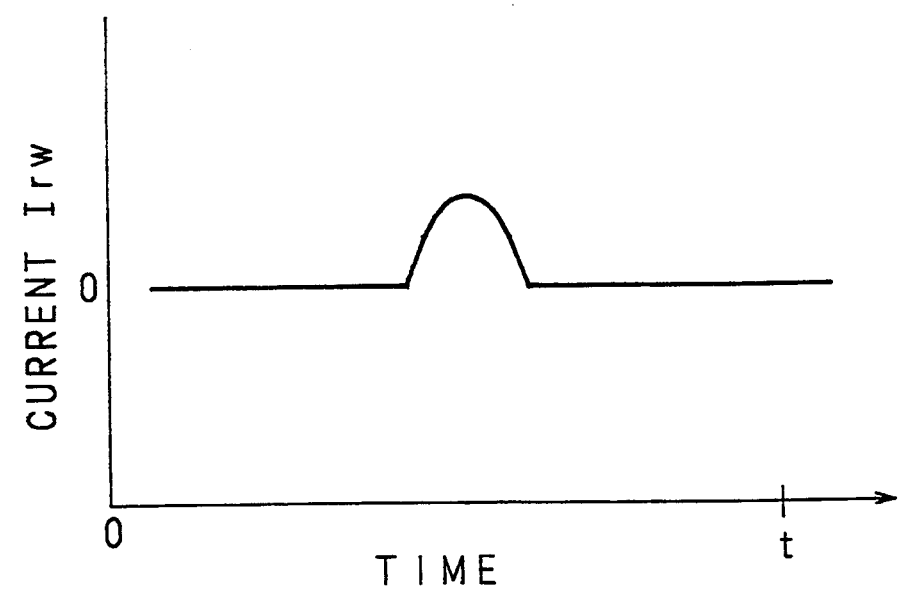

If the current is fed to the word line 103 in a steplike fashion, resistance of the magnetic thin film memory element 111A changes stepwise (with reference to FIG. 58). FIGS. 58A, 58B correspond to FIGS. 57A, 57B, and FIG. 58C indicates the current of the word line 103.

Figure 59A:
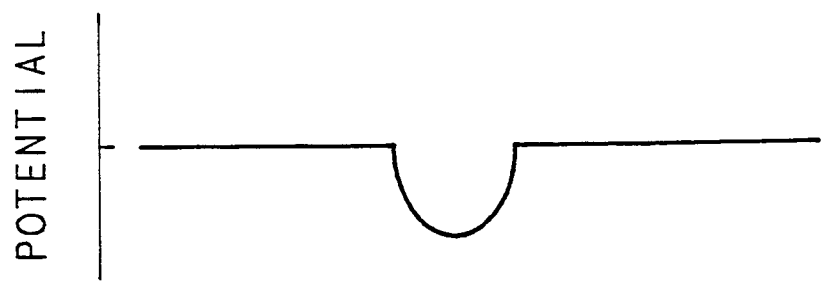
Figure 59B:
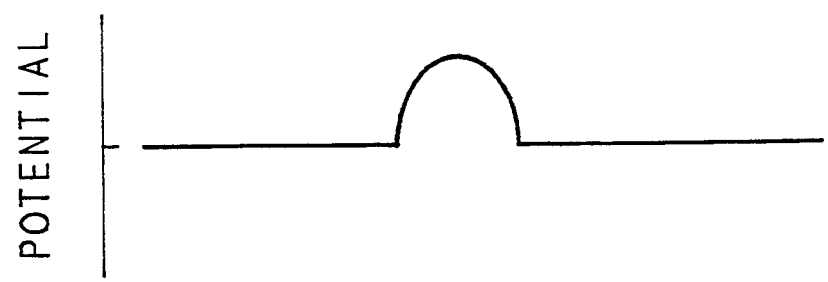
Figure 59C:
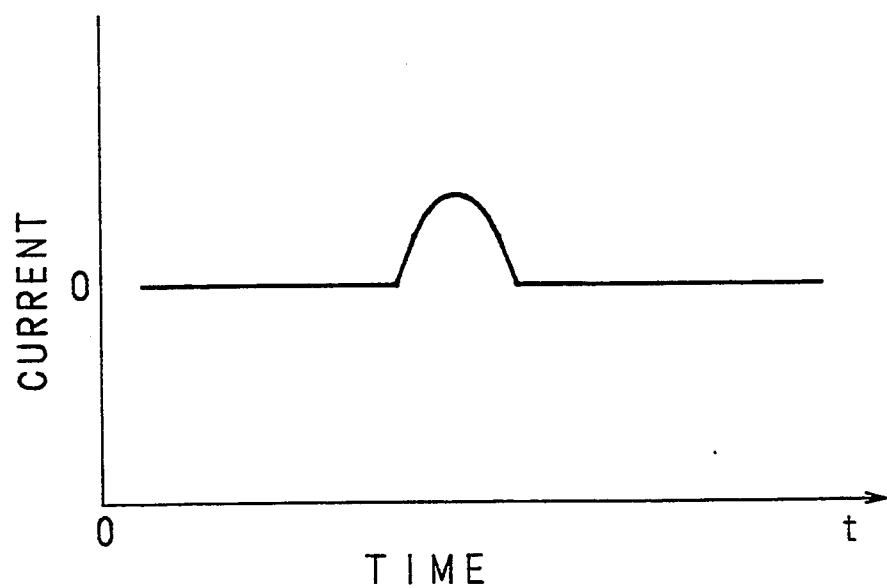

At this time, the potential at point X in FIG. 51 represents the waveform as shown in FIG. 59A which has a downward peak when the recorded magnetization is as in FIG. 55A. On the other hand, when the recorded magnetization is as indicated in FIG. 55B, the potential indicates the waveform with a upward peak as shown in FIG. 59B. An alternating current gained by these signals is amplified by an amplifier 121 thereby to obtain a predetermined reproduced output.

Figure 60:
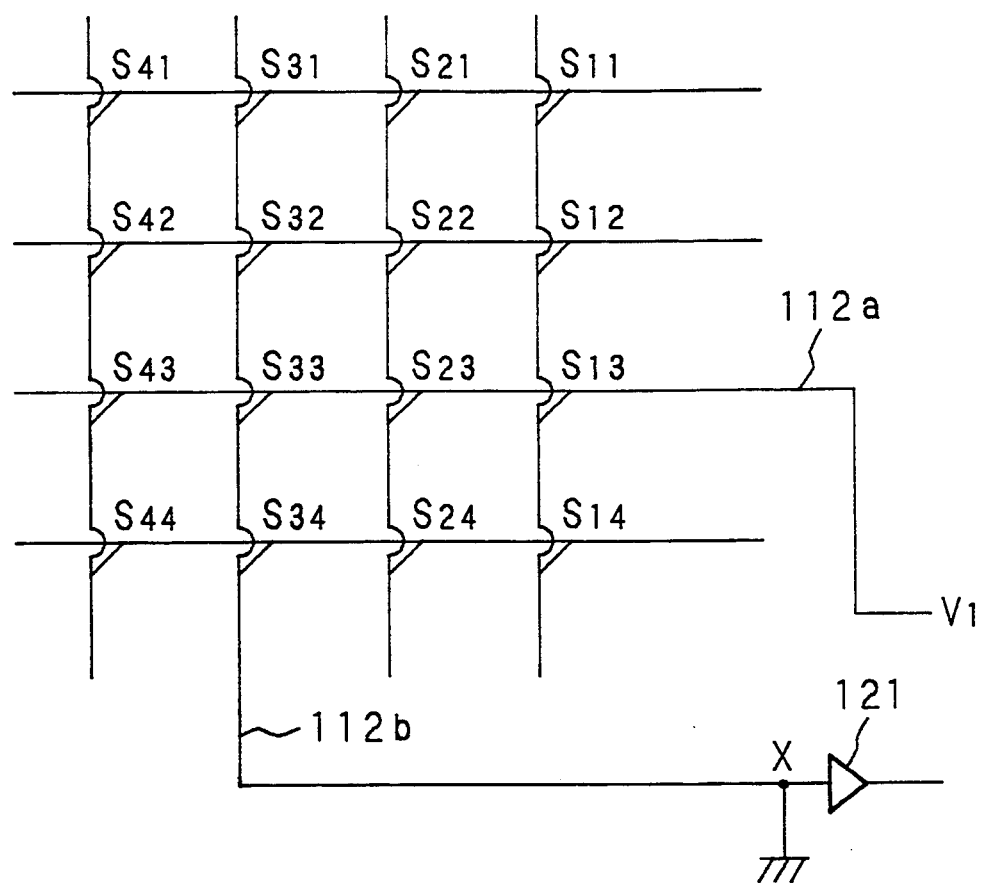
FIG. 60 is a simplified circuit diagram of a magnetic thin film memory device without using diodes.

Referring to FIG. 51, the reason why the diode 120 is provided for each magnetic thin film memory element 111A will be described below. FIG. 60 is a simplified circuit diagram when the diodes 120 are omitted, where Sij (i=1, 2, . . . : J=1, 2, . . . ) corresponds to each magnetic thin film memory element 111A. In this case, there exist many circuits when the current runs through the magnetic thin film memory elements connected to the sense lines 112a, 112b, e.g., S13, S14, S34, besides S33. Since the circuits are connected in parallel to the accessed memory element Sij, the total impedance is decreased as the scale of the memory device becomes larger, consuming more electricity and increasing noises.

On the contrary, when the diode 120 is connected in series to the magnetic film memory element 111A as in the instant Embodiment, no circuits are connected in parallel to the memory element 111A. Therefore, even if the scale of the memory device becomes larger, the consuming power or noises are fundamentally not changed.

Embodiment 20

Figure 61:
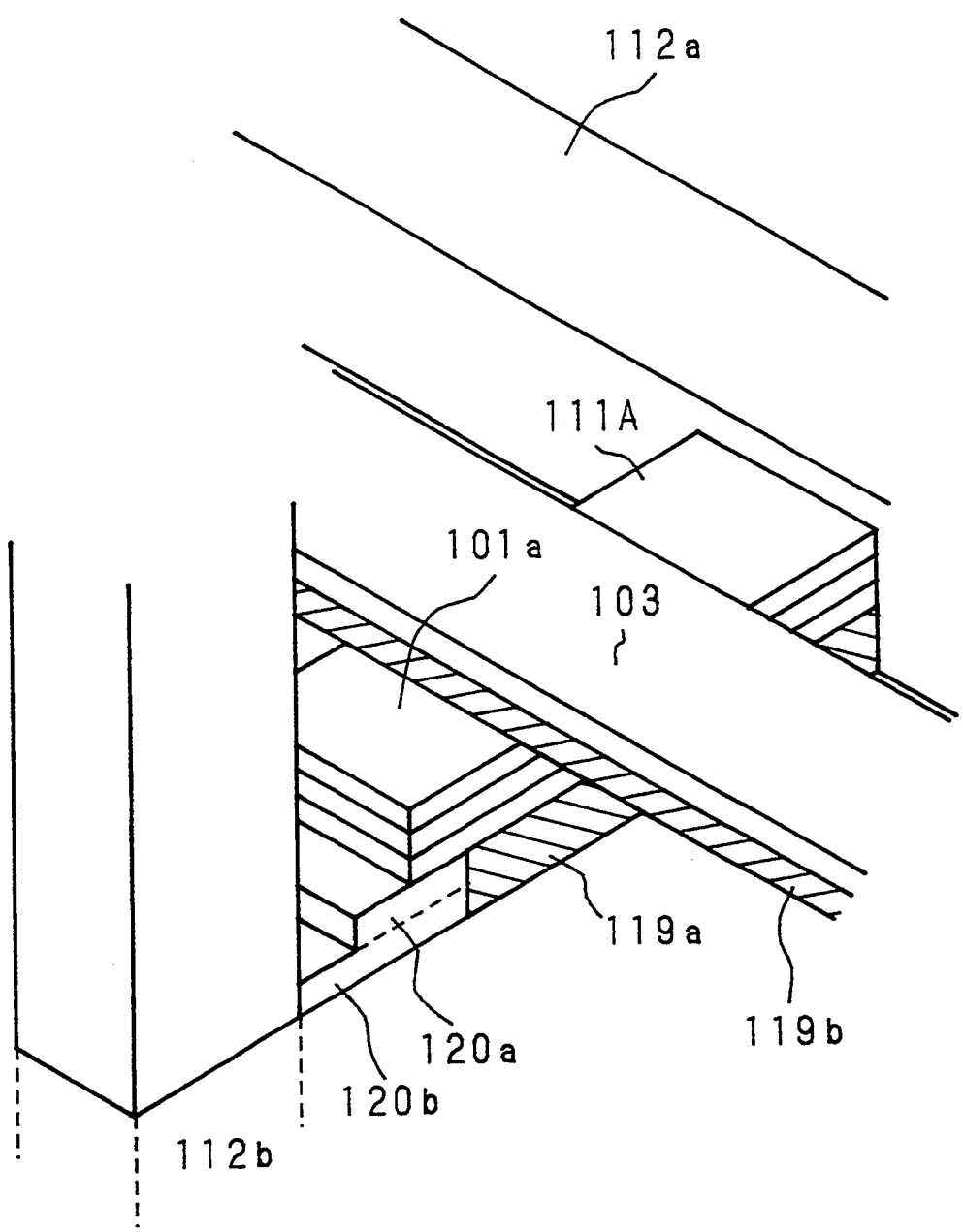
FIG. 61 is a perspective view of a 20th embodiment of this invention.

The magnetic thin film memory device of the foregoing Embodiment 19 is formed flat. If the structure of Embodiment 19 is employed in layers, it is possible to form a memory device of larger scale. Or, the wiring of the magnetic thin film memory elements may be arranged in three dimensions, which will now be depicted with reference to FIG. 61. After the magnetic thin film memory element 111A, diode 120, word line 103, sense line 112a are formed, a through hole is opened toward the n-type PN-junction diode 120b, and the sense line 112b is embedded. The space in FIG. 61 is filled with insulators 119a, 119b. A large-scale memory device is obtained by laminating the layers as manufactured in the above-described manner. In such case, it is preferable to obtain a peripheral circuit with good characteristic by forming the switching elements and amplifiers on the first layer of the semiconductor substrate, and forming the memory layers above the second layer. However, the memory layer may be formed in the room of the first layer. Although the sense line 112b is embedded in the through hole in Embodiment 20, the other kind of wiring may be embedded.

Embodiment 21

Figure 62A:
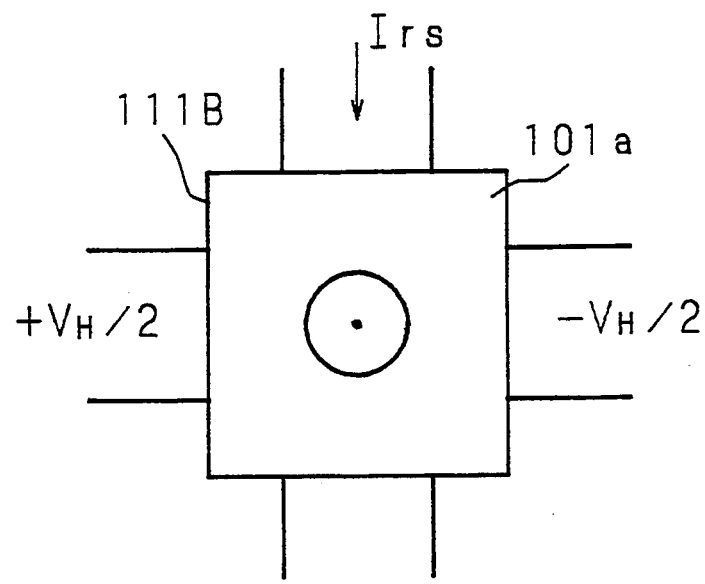
FIGS. 62A and 62B are diagrams explanatory of the extraordinary Hall effect.
Figure 62B:
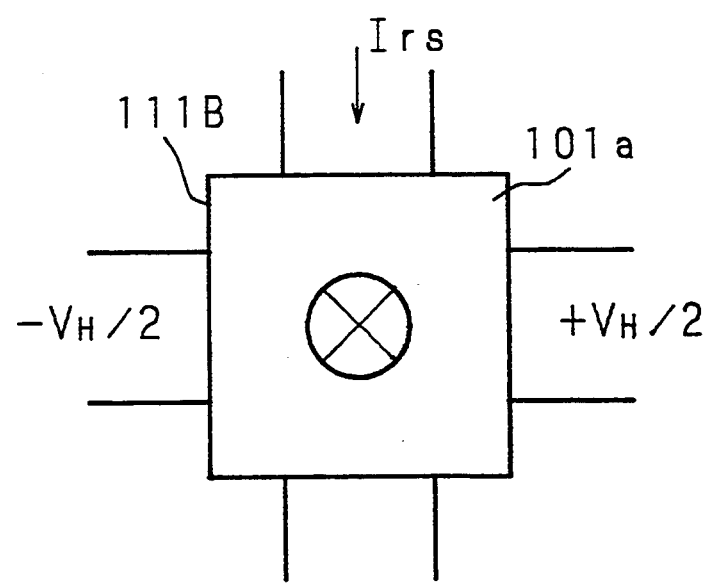

Although the magnetoresistance effect is utilized to read information according to the aforementioned Embodiments, the extraordinary Hall effect may be used for reading. The extraordinary Hall effect will be described more in detail with reference to FIG. 62. FIG. 62 shows the state where the current Irs is supplied to a magnetic thin film memory element 111B which is formed of TbHoCo or the like perpendicularly magnetized film. FIG. 62A shows the case of the upward magnetization, and FIG. 62B indicates the case of the downward magnetization. At this time, a voltage VH is generated at right angles to the current Irs and the direction of magnetization. This voltage becomes plus or minus depending on the direction of magnetization.

Figure 63:
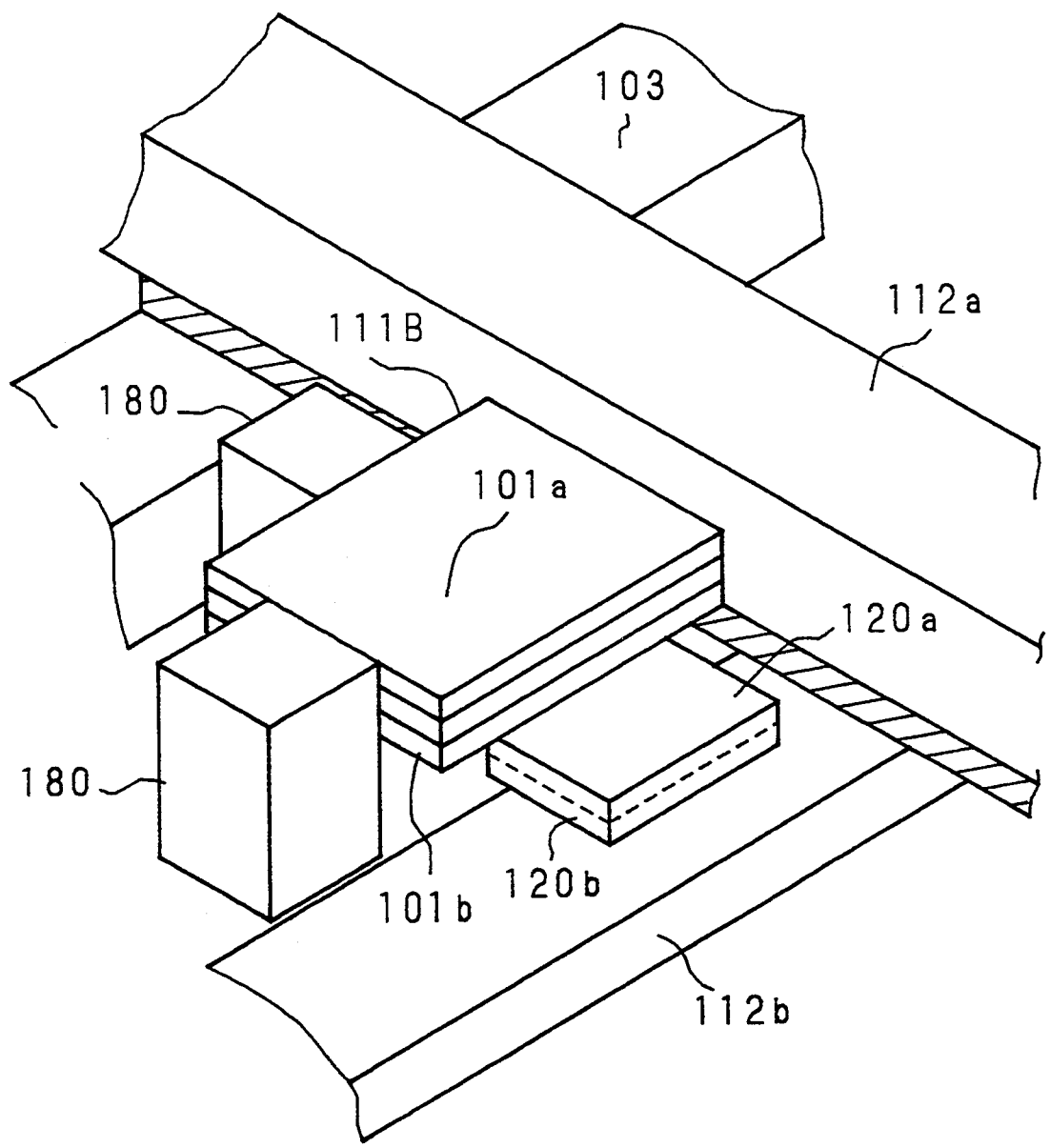
FIGS. 63 and 64 are a perspective view and a circuit diagram of a 21st embodiment of this invention, respectively.
Figure 64:
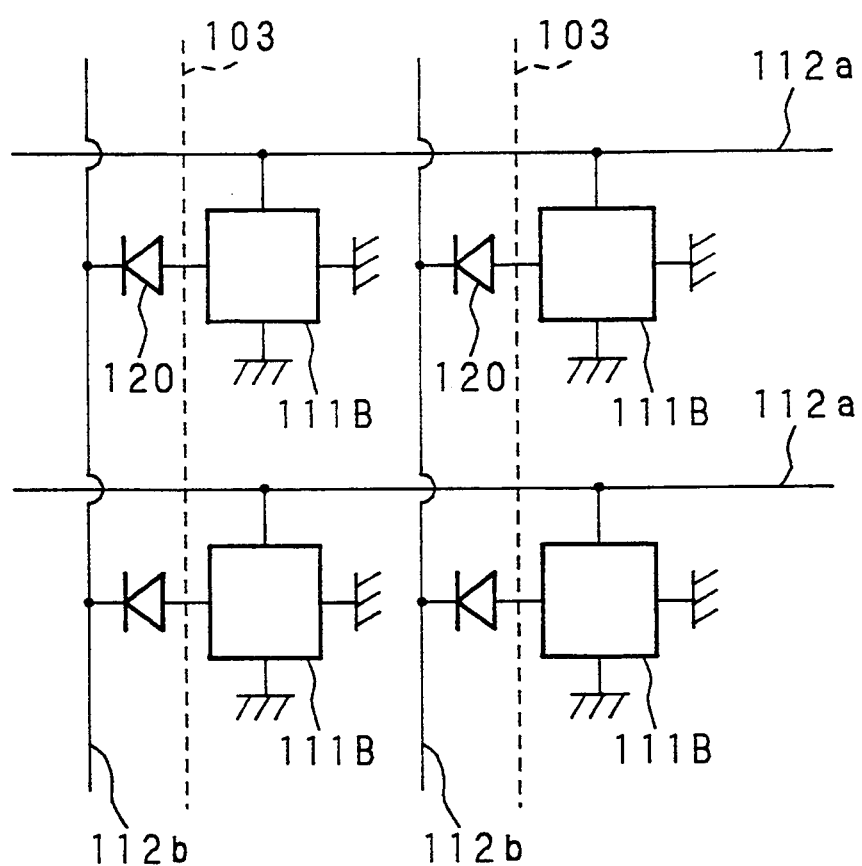

The magnetic thin film memory element 111B applying the extraordinary Hall effect is shown in FIG. 63, with a part of the circuit being disclosed in FIG. 64. FIGS. 63, 64 are respectively corresponding to FIGS. 50, 51. However, since the perpendicularly magnetized film is used for the magnetic thin film memory element 111B in this embodiment, only the perpendicular component of the magnetic field generated from the word line 103 to the memory element 111B is effective. Therefore, the word line 103 is provided adjacent to the lateral side of the memory element 111B. The operating principle of the memory device is the same as in the Embodiments using the magnetoresistance effect. A reference numeral 180 in FIG. 63 is the grounding line of the memory element 111B.

Embodiment 22

Figure 65:
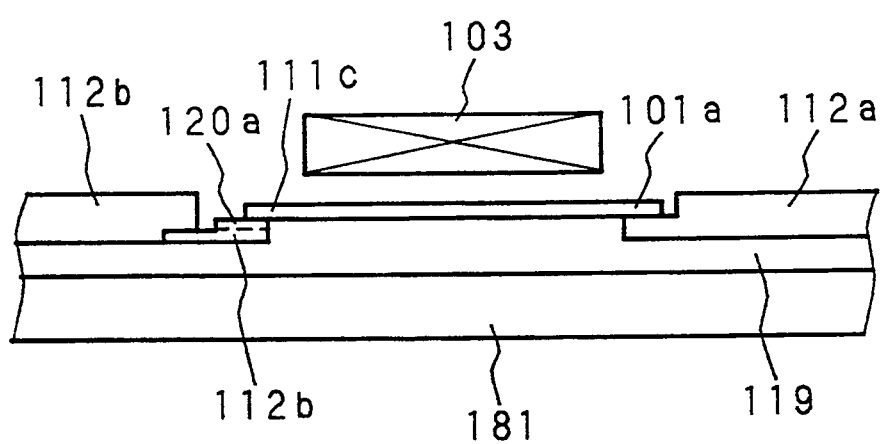
FIG. 65 is a diagrammatic cross sectional view of a 22nd embodiment of this invention.

Each of the magnetic thin film memory elements 111A, 111B consists of three layers of the magnetic thin film 101a, metallic thin film 102 and magnetic thin film 101b in Embodiments 19 through 21. According to these Embodiments, the magnetic field is applied by the current running in the own sense line 112 during recording and reproducing, that is, self-bias system. However, a different bias line may be provided separately while the magnetic thin film memory element connected to the sense line 112 is made of a single magnetic thin film 101a. A cross sectional view of a magnetic thin film memory element 111C in such structure as above is indicated in FIG. 65. A bias line 181 is provided via the insulator 119 under the sense lines 112a, 112b and magnetic thin film 101a. The magnetic field Hsf as the aforementioned embodiments is obtained by the current running in the bias line 181.

Embodiment 23

Figure 66:
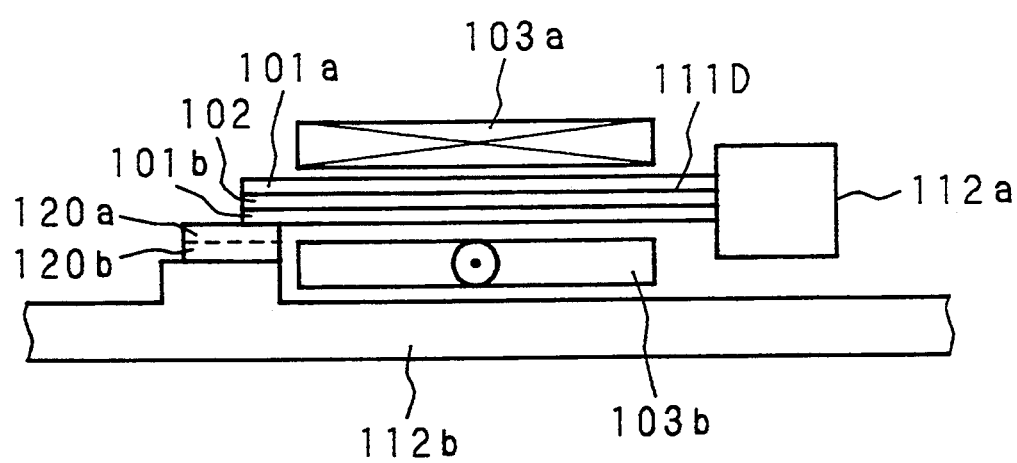
FIG. 66 is a diagrammatic cross sectional view of a 23rd embodiment of this invention.

Although the word line 103 and bias line 181 are provided respectively to each magnetic thin film in the aforementioned embodiments, it becomes easy to apply the necessary magnetic field to the whole of the magnetic thin film when another word line and the original word line 103 are provided approximately symmetrically with respect to the magnetic thin film memory element. In this case, the current is supplied in opposite directions in the pair of the word lines 103. FIG. 66 is a cross sectional view with a pair of word lines 103a, 103b arranged for the magnetic thin film memory element 111D which corresponds to the element 111A of FIG. 50.

Embodiment 24

The diode 120 is connected in series to the magnetic thin film memory element in the above embodiments. Any different arrangement can be employed so long as it forbids the cu rent to run from the one sense line 112b towards the other sense line 112a. For instance, a transistor may be provide in place of the diode, with the same effects achieved.

Moreover, the extraordinary magnetoresistance effect may be used except the magnetoresistance effect or extraordinary Hall effect to read the recorded information.

Although the magnetic thin film memory element is formed immediately below the recording line, i.e., word line 103, it is possible to form the memory element immediately above the word line. Further, the current line constituting the memory device, namely, word line 103, sense line 112 may be formed of superconductive wire.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A magnetic thin film memory device comprising:
   a magnetic thin film memory element having magnetic anisotropy to which information is recorded by the direction of magnetization thereof;
   a current line for supplying a current to said magnetic thin film memory element in a direction perpendicular to said direction of magnetization; and
   a voltage line for reading out an anomalous Hall voltage generated by the magnetic thin film memory element, said voltage line being in a direction perpendicular to both directions of said current and magnetization of said magnetic thin film memory element,
   wherein information is reproduced from said magnetic thin film memory element based on said anomalous Hall voltage of said magnetic thin film memory element.

2. A magnetic thin film memory device according to claim 1, wherein said magnetic thin film memory element has perpendicular magnetic anisotropy.

3. A magnetic thin film memory device according to claim 2, wherein said magnetic thin film memory element is made of ferromagnetic substance.

4. A magnetic thin film memory device according to claim 3, wherein said ferromagnetic substance is rare earth-transition metal alloy.

5. A magnetic thin film memory device according to claim 4, wherein said rare earth metal is a member of the group consisting of Gd and Ho.

6. A magnetic thin film memory device according to claim 4, wherein the composition of said rare earth-transition metal alloy is such that the sub-lattice magnetization of the rare earth metal is superior and is in the vicinity of the composition having the minimum saturation field.

7. A magnetic thin film memory device according to claim 1, further comprising:
   recording current lines respectively provided in parallel to said current line and voltage line, and the inequalities Hx<Hc, Hy<Hc and Hx+Hy>Hc are all satisfied wherein
   Hx is a magnetic field impressed by one of said recording current lines,
   Hy is a magnetic field impressed by the other of said recording current lines, and
   Hc is the coercive force of said magnetic thin film memory element.

8. A magnetic thin film memory device according to claim 7, wherein at least one of said current line and voltage line is used as the recording current line.

9. A magnetic thin film memory device according to claim 1, wherein both ends of the voltage line read out the anomalous Hall voltage.

10. A magnetic thin film memory device according to claim 9, wherein memory layers each provided with said magnetic thin film memory elements, current lines and voltage lines are laminated and the voltage lines are connected in common to lead out the anomalous Hall voltage of the magnetic thin film memory elements at corresponding positions of the respective layers.

11. A magnetic thin film memory device according to claim 9, further comprising a resistance arranged between said voltage line and magnetic thin film memory element.

12. A magnetic thin film memory device according to claim 9, further comprising a capacitor for storing said anomalous Hall voltage.

13. A magnetic thin film memory device according to claim 1, wherein information is reproduced based on the anomalous Hall voltage excited in said voltage line by applying a pulse current to said current line.

14. A magnetic thin film memory device according to claim 1, wherein the information recorded in said magnetic thin film memory element is reproduced by applying a magnetic field in a perpendicular direction to the surface of said magnetic thin film memory element and detecting the change or unchange in the direction of said magnetic thin film memory element from the anomalous Hall voltage.

15. A magnetic thin film memory device according to claim 1, wherein information is reproduced based on the increase or decrease of the anomalous Hall voltage corresponding to the inclination of the magnetization direction of said magnetic thin film memory element to the horizontal direction when a magnetic field is applied in parallel to the surface of said magnetic thin film memory element.

16. A magnetic thin film memory device according to claim 7, further comprising:
   means for providing two sets of recording current lines symmetrically with respect to said magnetic thin film memory element, wherein the directions of the currents in the recording current lines in a symmetrical relation are rendered in a same direction; and
   means for supplying current to either set of said recording current lines in accordance with the direction in which said magnetic thin film memory element is to be magnetized in recording.

17. A magnetic thin film memory device according to claim 7, further comprising:
   means for providing two sets of recording current lines symmetrically with respect to said magnetic thin film memory element, wherein the directions of the currents in the recording current lines in a symmetrical relation are rendered opposite; and
   means for switching the directions of the currents in said two sets of the recording current lines in accordance with the direction in which said magnetic thin film memory element is to be magnetized in recording.

18. A magnetic thin film memory device according to claim 7, wherein at least one of said voltage line and current line is used to apply an additional magnetic field for recording.

19. A magnetic thin film memory device according to claim 7, wherein magnetic fields in both directions perpendicular and parallel to the surface of said magnetic thin film memory element are applied and the magnetic field in the perpendicular direction determines the direction of magnetization of said magnetic thin film memory element thereby to record information.

20. A magnetic thin film memory device which comprises:
   a magnetic thin film memory element having perpendicular magnetic anisotropy and to which information is recorded by the direction of magnetization thereof;

a current line for supplying a constant current in a horizontal direction of said magnetic thin film memory element;

a current line for applying a magnetic field in a perpendicular direction to the surface of said magnetic thin film memory element; and means for reproducing information recorded in said magnetic thin film memory element on the basis of the change of resistance of said magnetic thin film memory element consequent to the application of said magnetic field.

21. A magnetic thin film memory device according to claim 20, wherein information recorded in said magnetic thin film memory element is reproduced on the basis of the change or unchange in resistance of said magnetic thin film memory element consequent to the application of said magnetic field to said magnetic thin film memory element.

22. A magnetic thin film memory device according to claim 20, further comprising:

a current line for applying a bias magnetic field to said magnetic thin film memory element in a direction parallel to said constant current, thereby to change the angle of magnetization of said magnetic thin film memory element, and the information recorded in said magnetic thin film memory element is reproduced on the basis of the change of resistance of said magnetic thin film memory element detected by applying said bias magnetization to the magnetic field in a perpendicular direction to the surface thereof.

23. A magnetic thin film memory device according to claim 20, wherein said magnetic thin film memory element is made of ferromagnetic substance.

24. A magnetic thin film memory device which comprises:

a recording magnetic thin film memory element having horizontal magnetic anisotropy and to which information is recorded by the direction of magnetization thereof;

a second magnetic thin film having perpendicular magnetic anisotropy arranged adjacent to said recording magnetic thin film memory element;

a current line for supplying a constant current in both a horizontal direction of said second magnetic thin film and a parallel direction to the magnetization direction of said second magnetic thin film; and a current line for applying a bias magnetic field in a direction parallel to the surface of said second magnetic thin film, wherein the information recorded in said recording magnetic thin film memory element is reproduced on the basis of the change of resistance of said second magnetic thin film consequent to the application of said bias magnetic field.

25. A magnetic thin film memory device which comprises:

a recording magnetic thin film memory element having perpendicular magnetic anisotropy and to which information is recorded by the direction of magnetization thereof;

a second magnetic thin film having perpendicular magnetic anisotropy arranged adjacent to said recording magnetic thin film memory element;

a current line for supplying a constant current in a horizontal direction of said second magnetic thin film; and a current line for applying a bias magnetic field in a direction parallel to the surface of said second magnetic thin film, wherein the direction of magnetization of said second magnetic thin film is changed in correspondence to the direction of magnetization of said recording magnetic thin film memory element through supply of said constant current, wherein the information recorded in said recording magnetic thin film memory element is reproduced based on the change of resistance of said second magnetic thin film as a result of the application of said bias magnetic field to the magnetized direction of said second magnetic thin film.

26. A magnetic thin film memory device according to claim 25, wherein said magnetic thin film having perpendicular magnetic anisotropy is made of ferromagnetic substance.

27. A magnetic thin film memory device in which information is recorded by the direction of magnetization of a magnetic thin film memory element having magnetic anisotropy, comprising:

a plurality of current lines to which a plurality of said magnetic thin film memory elements are connected; and a semiconductor element having a nonlinear current-voltage characteristic connected between corresponding first current line and magnetic thin film memory element.

28. A magnetic thin film memory device according to claim 27, wherein said plurality of first current lines are arranged in rows, and another current line is provided which connects each of said magnetic thin film memory elements to the one in a different row in series.

29. A magnetic thin film memory device according to claim 28, wherein said rows of magnetic thin film memory elements, semiconductor elements and first current lines are laminated in three dimensions and connected by a wiring.

30. A magnetic thin film memory device according to claim 29, wherein an active element consisting of a semi-conductor and said magnetic thin film memory element are laminated in different layers through an insulator and connected by a wiring.

31. A magnetic thin film memory device according to claim 27, wherein the information is reproduced on the basis of the change of resistance of said magnetic thin film memory element consequent to the application of a magnetic field to said magnetic thin film memory element by said corresponding first current line.

32. A magnetic thin film memory device according to claim 27, wherein the information is reproduced on the basis of the anomalous Hall voltage generated consequent to the application of a magnetic field to said magnetic thin film memory element by said corresponding first current line.

33. A magnetic thin film memory device according to claim 27, further comprising:

a second current line for applying a bias magnetic field to said magnetic thin film memory element.

34. A magnetic thin film memory device according to claim 33, wherein the information is reproduced on the basis of the change of resistance of said magnetic thin film memory element consequent to the application of a bias magnetic field to said magnetic thin film memory element by said second current line.

35. A magnetic thin film memory device according to claim 33, wherein the information is reproduced on the basis of the anomalous Hall voltage generated consequent to the application of a bias magnetic field to said magnetic thin film memory element by said second current line.

* * * * *